US011979569B2

(12) United States Patent
Park et al.

(10) Patent No.: US 11,979,569 B2
(45) Date of Patent: *May 7, 2024

(54) METHOD AND DEVICE FOR ENCODING VIDEO HAVING BLOCK SIZE SET FOR EACH BLOCK SHAPE, AND METHOD AND DEVICE FOR DECODING VIDEO

(71) Applicant: SAMSUNG ELECTRONICS CO., LTD., Suwon-si (KR)

(72) Inventors: Minsoo Park, Suwon-si (KR); Minwoo Park, Suwon-si (KR); Kiho Choi, Suwon-si (KR); Yinji Piao, Suwon-si (KR); Seungsoo Jeong, Suwon-si (KR); Narae Choi, Suwon-si (KR); Woongil Choi, Suwon-si (KR); Anish Tamse, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/897,533

(22) Filed: Aug. 29, 2022

(65) Prior Publication Data
US 2022/0417513 A1    Dec. 29, 2022

Related U.S. Application Data

(63) Continuation of application No. 17/480,816, filed on Sep. 21, 2021, now Pat. No. 11,431,975, which is a
(Continued)

(51) Int. Cl.
*H04N 19/119* (2014.01)
*H04N 19/176* (2014.01)

(52) U.S. Cl.
CPC ......... *H04N 19/119* (2014.11); *H04N 19/176* (2014.11)

(58) Field of Classification Search
CPC ...... H04N 19/70; H04N 19/176; H04N 19/61; H04N 19/105; H04N 19/46; H04N 19/119; H04N 19/122
See application file for complete search history.

(56) References Cited

U.S. PATENT DOCUMENTS 9,743,091 B2    8/2017   Kim et al.
9,924,162 B2 *  3/2018   Sasai ..................... H04N 19/129
(Continued)

FOREIGN PATENT DOCUMENTS

AU    2013270596 A1    12/2013
AU    2015203116 A1     6/2015
(Continued)

OTHER PUBLICATIONS

Choi (Samsung) K et al.; "Description of video coding technology proposal by Samsung, Huawei, and Qualcomm for New Video Coding Standard", 125. MPEG Meeting; Jan. 14, 2019-Jan. 18, 2019; MARRAKECH: (Motion Picture Expert Group or ISO/IEC JTC1/SC29/WG11), No. m46354, Jan. 13, 2019, XP030214980.
(Continued)

*Primary Examiner* — Daniel Chang
(74) *Attorney, Agent, or Firm* — Sughrue Mion, PLLC

(57) ABSTRACT

A video decoding method includes obtaining information indicating a first difference between a maximum size of a coding unit having a 1:4 ratio and a size of a largest coding unit, determining the maximum size of the coding unit of having the 1:4 ratio by using the size of the largest coding unit and the first difference, determining a minimum size of the coding unit having the 1:4 ratio based on a minimum size of a coding unit, determining whether a coding having the 1:4 ratio may be generated by splitting a first coding unit based on the maximum size and the minimum size of the coding unit having the 1:4 ratio, and determining a second coding unit including the coding unit having the 1:4 ratio,
(Continued)

from the first coding unit, and decoding the second coding unit.

4 Claims, 42 Drawing Sheets

Related U.S. Application Data continuation of application No. PCT/KR2020/003973, filed on Mar. 23, 2020.

(60) Provisional application No. 62/952,625, filed on Dec. 23, 2019, provisional application No. 62/950,308, filed on Dec. 19, 2019, provisional application No. 62/945,992, filed on Dec. 10, 2019, provisional application No. 62/821,492, filed on Mar. 21, 2019.

(56) References Cited

U.S. PATENT DOCUMENTS

| | | | |
|---|---|---|---|
| 10,412,411 B2 | 9/2019 | Min et al. | |
| 10,432,965 B2 | 10/2019 | Min et al. | |
| 10,567,773 B2 | 2/2020 | Park et al. | |
| 2012/0177116 A1 | 7/2012 | Panusopone et al. | |
| 2013/0003834 A1 | 1/2013 | Rojals et al. | |
| 2013/0003835 A1 | 1/2013 | Sole Rojals et al. | |
| 2013/0108182 A1* | 5/2013 | Yie | H04N 19/94 382/233 |
| 2013/0129237 A1* | 5/2013 | Yie | H04N 19/44 382/233 |
| 2013/0215970 A1* | 8/2013 | Fang | H04N 19/91 375/240.18 |
| 2013/0272378 A1* | 10/2013 | Sole Rojals | H03M 7/40 375/240.02 |
| 2013/0272381 A1* | 10/2013 | Guo | H04N 19/119 375/240.12 |
| 2014/0003529 A1* | 1/2014 | Joshi | H04N 19/60 375/240.18 |
| 2014/0086311 A1* | 3/2014 | Lou | H04N 19/30 375/240.03 |
| 2014/0092984 A1* | 4/2014 | Fang | H04N 19/46 375/240.24 |
| 2014/0177713 A1* | 6/2014 | Yuan | H04N 19/122 375/240.18 |
| 2014/0269899 A1* | 9/2014 | Park | H04N 19/44 375/240.02 |
| 2014/0341283 A1 | 11/2014 | Choi et al. | |
| 2014/0362926 A1* | 12/2014 | Rosewarne | H04N 19/176 375/240.18 |
| 2015/0071359 A1* | 3/2015 | Guo | H04N 19/91 375/240.18 |
| 2015/0092861 A1* | 4/2015 | Sjoberg | H04N 19/174 375/240.18 |
| 2015/0178361 A1 | 6/2015 | Ueno et al. | |
| 2015/0208068 A1* | 7/2015 | Kim | H04N 19/60 375/240.02 |
| 2015/0208077 A1* | 7/2015 | Kim | H04N 19/132 375/240.16 |
| 2015/0264353 A1* | 9/2015 | Yie | H04N 19/91 375/240.03 |
| 2015/0341637 A1* | 11/2015 | Kim | H04N 19/119 375/240.12 |
| 2017/0094314 A1* | 3/2017 | Zhao | H04N 19/61 |
| 2017/0150186 A1* | 5/2017 | Zhang | H04N 19/61 |
| 2018/0091810 A1 | 3/2018 | Son et al. | |
| 2018/0131962 A1* | 5/2018 | Chen | H04N 19/176 |
| 2018/0184122 A1 | 6/2018 | Park et al. | |
| 2018/0205972 A1* | 7/2018 | Piao | H04N 19/13 |
| 2018/0234701 A1* | 8/2018 | Zhang | H04N 19/96 |
| 2018/0302616 A1 | 10/2018 | Son et al. | |
| 2018/0310001 A1* | 10/2018 | Choi | H04N 19/176 |
| 2018/0310015 A1 | 10/2018 | Han et al. | |
| 2018/0324434 A1* | 11/2018 | Piao | H04N 19/11 |
| 2019/0166367 A1 | 5/2019 | Zhao et al. | |
| 2019/0313102 A1 | 10/2019 | Cho et al. | |
| 2020/0296366 A1 | 9/2020 | Chono | |
| 2020/0322602 A1* | 10/2020 | Huang | H04N 19/174 |
| 2021/0014533 A1* | 1/2021 | Tsukuba | H04N 19/426 |
| 2021/0136369 A1* | 5/2021 | Lim | H04N 19/70 |
| 2021/0144371 A1 | 5/2021 | Park et al. | |
| 2021/0152823 A1 | 5/2021 | Park et al. | |
| 2021/0227221 A1* | 7/2021 | Lim | H04N 19/70 |
| 2021/0274175 A1* | 9/2021 | Lim | H04N 19/167 |
| 2021/0274184 A1 | 9/2021 | Park et al. | |
| 2021/0321099 A1 | 10/2021 | Park et al. | |
| 2021/0368172 A1* | 11/2021 | Lim | H04N 19/159 |

FOREIGN PATENT DOCUMENTS

| | | |
|---|---|---|
| CN | 102934436 A | 2/2013 |
| CN | 104885463 A | 9/2015 |
| CN | 106063271 A | 10/2016 |
| CN | 106803957 A | 6/2017 |
| CN | 108702507 A | 10/2018 |
| KR | 1020130085391 A | 7/2013 |
| KR | 101888651 B1 | 8/2018 |
| KR | 1020190028525 A | 3/2019 |
| WO | 2017043760 A1 | 3/2017 |
| WO | 2018182310 A1 | 10/2018 |
| WO | 2019009502 A1 | 1/2019 |
| WO | 2019009503 A1 | 1/2019 |
| WO | 2019/050299 A1 | 3/2019 |
| WO | 2020040619 A1 | 2/2020 |

OTHER PUBLICATIONS

Choi et al., "Working Draft 1 of Essential Video Coding; C1," ITU-T Draft; Study Period 2017-2020; Study Group 15; Series C1, International Telecommunication Union, ISO/IEC JTC1/SC29/WG11 N18283, Jan. 2019, Total 209 pages.
Communication dated Mar. 16, 2022, issued by the INDIA Intellectual Property Office in Indian Patent Application No. 202127037584.
Communication dated Dec. 3, 2021 by the State Intellectual Property Office in P.R. China in counterpart Chinese Patent Application No. 202080015462.4.
Communication dated Feb. 18, 2022 by the European Patent Office in counterpart European Patent Application No. 20774724.7.
Communication dated Nov. 2, 2020 issued by the Korean Intellectual Property Office in application No. 10-2020-0035269.
International Search Report (PCT/ISA/210) and Written Opinion (PCT/ISA/237) dated Jul. 2, 2020 issued by the International Searching Authority in International Application No. PCT/KR2020/003973.
Tsai, C.-M., et al., "CE1-related: Picture boundary CU split satisfying the VPDU", Joint Video Experts Team (JVET) of ITU-SG 16 WP 3 and ISO/IEC JTC 1/SC 29/WG 11, JVET-M0888-v4, Jan. 9-18, 2019, pp. 1-6 (7 pages).
Park (Samsung) M W et al.; "CE1: Partitioning Structure in JVET-J0024 (Tets 1.0.12, 1.0.13, 1.0.14, and 1.0.15)", 123. MPEG Meeting; Jul. 16, 2018-Jul. 20, 2018; Ljubljana: (Motion Picture Expert Group or ISO/IEC JTC1/SC29/WG11), No. m43032, Jul. 10, 2018, Document: JVET-K0109-vl XP030196351.
Park (Samsung) M et al.; "[EVC] Suggested improvements for EVC specification and Test Model", 129. MPEG Meeting; Jan. 13, 2020-Jan. 17, 2010; Brussels: (Motion Picture Expert Group or ISO/IEC JTC1/SC29/WG11), No. m52166, Jan. 10, 2020, XP030224786.
Communication dated Mar. 30, 2023 by China National Intellectual Property Administration for Chinese Patent Application No. 202210145749.X.
Communication dated Mar. 30, 2023 by China National Intellectual Property Administration for Chinese Patent Application No. 202210145936.8.
Communication dated Jan. 12, 2023 by European Patent Office for European Patent Application No. 20774724.7.
Communication issued Mar. 20, 2024 by the European Patent Office in European Patent Application No. 20774724.7.

(56) References Cited

OTHER PUBLICATIONS

Communication dated Mar. 6, 2024, issued by the European Patent Office in counterpart European Application No. 20774724.7.
Notice of Allowance dated Sep. 28, 2023, issued by Chinese Patent Office in Chinese Patent Application No. 202210145749.X.
Notice of Allowance dated Sep. 28, 2023, issued by Chinese Patent Office in Chinese Patent Application No. 202210145936.8.
Communication dated Sep. 29, 2023, issued by European Patent Office in European Patent Application No. 20774724.7.

* cited by examiner

FIG. 13

| BLOCK SHAPE / DEPTH | 0: SQUARE | 1: NS_VER | 2: NS_HOR |
|---|---|---|---|
| DEPTH D | 1300 | 1310 | 1320 |
| DEPTH D+1 | 1302 | 1312 | 1322 |
| DEPTH D+2 | 1304 | 1314 | 1324 |
| ... | ... | ... | ... |

FIG. 21

| BLOCK SHAPE | 128 | 64 | 32 | 16 | 8 | 4 |
|---|---|---|---|---|---|---|
| CTU | 128x128 | 64x64 | 32x32 | 16x16 | 8x8 | 4x4 |
| 1:1 | 128x128 | 64x64 | 32x32 | 16x16 | 8x8 | 4x4 |
| 2:1 (1:2) | 128x64 (64x128) | 64x32 (32x64) | 32x16 (16x32) | 16x8 (8x16) | 8x4 (4x8) | |
| 4:1 (1:4) | ~~128x32 (32x128)~~ | 64x16 (16x64) | 32x8 (8x32) | 16x4 (4x16) | | |

FIG. 22

| PARAMETER NAME | VALUE | BINARY LOG SCALE |
|---|---|---|
| CUT SIZE | 128 | 7 |
| MAXIMUM SIZE OF BLOCK HAVING BLOCK RATIO OF 1:1 | 128 | 7 |
| MINIMUM SIZE OF BLOCK HAVING BLOCK RATIO OF 1:1 | 4 | 2 |
| MAXIMUM SIZE OF BLOCK HAVING BLOCK RATIO OF 1:2 (2:1) | 128 | 7 |
| MINIMUM SIZE OF BLOCK HAVING BLOCK RATIO OF 1:2 (2:1) | 8 | 3 |
| MAXIMUM SIZE OF BLOCK HAVING BLOCK RATIO OF 1:4 (4:1) | 64 | 6 |
| MINIMUM SIZE OF BLOCK HAVING BLOCK RATIO OF 1:4 (4:1) | 16 | 4 |

FIG. 23

| BLOCK SHAPE | 128 | 64 | 32 | 16 | 8 | 4 |
|---|---|---|---|---|---|---|
| CTU | 128x128 | 64x64 | 32x32 | 16x16 | 8x8 | 4x4 |
| 1:1 | 128x128 | 64x64 | 32x32 | 16x16 | 8x8 | 4x4 |
| 2:1 (1:2) | 128x64 (64x128) | 64x32 (32x64) | 32x16 (16x32) | 16x8 (8x16) | ~~8x4 (4x8)~~ | |
| 4:1 (1:4) | ~~128x32 (32x128)~~ | 64x16 (16x64) | 32x8 (8x32) | 16x4 (4x16) | | |

FIG. 24

| BLOCK SHAPE | 128 | 64 | 32 | 16 | 8 | 4 |
|---|---|---|---|---|---|---|
| CTU | 128x128 | 64x64 | 32x32 | 16x16 | 8x8 | 4x4 |
| 1:1 | ~~128x128~~ | 64x64 | 32x32 | 16x16 | 8x8 | 4x4 |
| 2:1 (1:2) | ~~128x64 (64x128)~~ | 64x32 (32x64) | 32x16 (16x32) | 16x8 (8x16) | 8x4 (4x8) | |
| 4:1 (1:4) | ~~128x32 (32x128)~~ | 64x16 (16x64) | 32x8 (8x32) | 16x4 (4x16) | | |

FIG. 25

| BLOCK SHAPE | 128 | 64 | 32 | 16 | 8 | 4 |
|---|---|---|---|---|---|---|
| CTU | 128x128 | 64x64 | 32x32 | 16x16 | 8x8 | 4x4 |
| 1:1 | 128x128 | 64x64 | 32x32 | 16x16 | 8x8 | 4x4 |
| 2:1 (1:2) | ~~128x64 (64x128)~~ | 64x32 (32x64) | 32x16 (16x32) | 16x8 (8x16) | 8x4 (4x8) | |
| 4:1 (1:4) | ~~128x32 (32x128)~~ | 64x16 (16x64) | 32x8 (8x32) | 16x4 (4x16) | | |

FIG. 26

| |
|---|
| seq_parameter_set_rbsp( ) { |
| ... |
|   sps_btt_flag |
|   if( sps_btt_flag ) |
|     log2_ctu_size_minus5 |
|     log2_min_cb_size_minus2 |
|     log2_diff_ctu_max_14_cb_size |
|     log2_diff_ctu_max_tt_cb_size |
|     log2_diff_min_cb_min_tt_cb_size_minus2 |
| ... |
|   } |

FIG. 27

CtbLog2SizeY = log2_ctu_size_minus5 + 5

CtbSizeY = 1 << CtbLog2SizeY

MinCbLog2SizeY = 2 + log2_min_cb_size_minus2

MinCbSizeY = 1 << MinCbLog2SizeY

MaxCbLog2Size11Ratio = CtbLog2SizeY

MinCbLog2Size11Ratio = MinCbLog2SizeY

MaxCbLog2Size12Ratio = MaxCbLog2Size11Ratio

MinCbLog2Size12Ratio = MinCbLog2Size11Ratio + 1

MaxTbLog2SizeY = 6

MaxCbLog2Size14Ratio = Min( CtbLog2SizeY - log2_diff_ctu_max_14_cb_size, MaxTbLog2SizeY)

MinCbLog2Size14Ratio = MinCbLog2Size12Ratio + 1

MaxTtLog2Size = Min( CtbLog2SizeY - log2_diff_ctu_max_tt_cb_size, MaxTbLog2SizeY)

MinTtLog2Size = MinCbLog2SizeY + log2_diff_min_cb_min_tt_cb_size_minus2 + 2

FIG. 28

| |
|---|
| split_unit( x0, y0, log2CbWidth, log2CbHeight, ctDepth, splitUnitOrder, cuQpDeltaCode ) { |
| ... |
|     if( sps_suco_flag && allowSplitUnitCodingOrder ) |
|         split_unit_coding_order_flag [ x0 ][ y0 ] |
|     if( split_cu_flag[ x0 ][ y0 ] ) { |
|         x1 = x0 + ( 1 << ( log2CbWidth − 1 ) ) |
|         y1 = y0 + ( 1 << ( log2CbHeight − 1 ) ) |
|         if( split_unit_coding_order_flag[ x0 ][ y0 ] = = 0 ) { |
|             split_unit( x0, y0, log2CbWidth − 1, log2CbHeight − 1, ctDepth + 1, 0, cuQpDeltaCode ) |
|             if( x1 < pic_width_in_luma_samples ) |
|                 split_unit( x1, y0, log2CbWidth − 1, log2CbHeight − 1, ctDepth + 1, 0, cuQpDeltaCode ) |
|             if( y1 < pic_height_in_luma_samples ) |
|                 split_unit( x0, y1, log2CbWidth − 1, log2CbHeight − 1, ctDepth + 1, 0, cuQpDeltaCode ) |
|             if( x1 < pic_width_in_luma_samples && y1 < pic_height_in_luma_samples ) |
|                 split_unit( x1, y1, log2CbWidth − 1, log2CbHeight − 1, ctDepth + 1, 0, cuQpDeltaCode ) |
|         } else { |
|             split_unit( x1, y0, log2CbWidth − 1, log2CbHeight − 1, ctDepth + 1, 1, cuQpDeltaCode ) |
|             split_unit( x0, y0, log2CbWidth − 1, log2CbHeight − 1, ctDepth + 1, 1, cuQpDeltaCode ) |
|             split_unit( x1, y1, log2CbWidth − 1, log2CbHeight − 1, ctDepth + 1, 1, cuQpDeltaCode ) |
|             split_unit( x0, y1, log2CbWidth − 1, log2CbHeight − 1, ctDepth + 1, 1, cuQpDeltaCode ) |
|         } |
|     } |
| ... |

FIG. 29

MaxSucoLog2Size = Min (CtbLog2SizeY − log2_diff_ctu_size_max_suco_cb_size, 6)
MinSucoLog2Size = Max(MaxSucoLog2Size − log2_diff_max_suco_min_suco_cb_size, Max( MinCbLog2SizeY, 4 ) )

FIG. 30

If one or more of the following conditions are true, allowSplitTtVer is set equal to FALSE.
- log2CbWidth is less than log2CbHeight.
- log2CbWidth is greater than MaxTtLog2Size or log2CbWidth is less than MinTtLog2Size.
- log2CbWidth is equal to log2CbHeight and log2CbWidth is larger than MaxCbLog2Size14Ratio.
- log2CbWidth is equal to log2CbHeight and log2CbWidth is smaller than MinCbLog2Size14Ratio.
⎬ 3000

- If one or more of the following conditions are true, allowSplitTtHor is set equal to FALSE.
- log2CbHeight is less than log2CbWidth.
- log2CbHeight is greater than MaxTtLog2Size or log2CbHeight is less than MinTtLog2Size.
- log2CbWidth is equal to log2CbHeight, and log2CbHeight is larger than MaxCbLog2Size14Ratio.
- log2CbWidth is equal to log2CbHeight, and log2CbHeight is smaller than MinCbLog2Size14Ratio.
⎬ 3050

FIG. 34

- If x0 + ( 1 << log2CbWidth ) is greater than pic_width_in_luma_samples and y0 + ( 1 << log2CbHeight ) is smaller than or equal to pic_height_in_luma_samples, the following applies:
  - If allowSplitBtVer is equal to TRUE, SplitMode[ x ][ y ] is set equal to SPLIT_BT_VER.
  - Otherwise, SplitMode[ x ][ y ] is set to equal to SPLIT_BT_HOR.  } 3400
- Otherwise, if y0 + ( 1 << log2CbHeight ) is greater than pic_height_in_luma_samples, the following applies:
  - If allowSplitBtHor is equal to TRUE, SplitMode[ x ][ y ] is set equal to SPLIT_BT_HOR.
  - Otherwise, Split[ x ][ y ] is set to equal to SPLIT_BT_VER.  } 3450

FIG. 40

– if x0 + ( 1 << log2CbWidth ) is greater than pic_width_in_luma_samples and y0 + ( 1 << log2CbHeight ) is smaller than or equal to pic_height_in_luma_samples, – A variable K is set equal to (log2CbHeight = = 7 ? 1 : 2).
 – If log2CbHeight is greater than or equal to K + log2CbWidth, SplitMode[ x ][ y ] is set equal to SPLIT_BT_HOR.
 – Otherwise (log2CbHeight is smaller than K + log2CbWidth), SplitMode[ x ][ y ] is set equal to SPLIT_BT_VER.

⎫ 4000

– Otherwise, if y0 + ( 1 << log2CbHeight ) is greater than pic_height_in_luma_samples and x0 + ( 1 << log2CbWidth ) is smaller than or equal to pic_width_in_luma_samples, – A variable K is set equal to (log2CbWidth = = 7 ? 1 : 2).
 – If log2CbWidth is greater than or equal to K + log2CbHeight, SplitMode[ x ][ y ] is set equal to SPLIT_BT_VER.
 – Otherwise (log2CbWidth is smaller than K + log2CbHeight), SplitMode[ x ][ y ] is set equal to SPLIT_BT_HOR.

- Otherwise, if x0 + ( 1 << log2CbWidth ) is greater than pic_width_in_luma_samples and y0 + ( 1 << log2CbHeight ) is smaller than or equal to pic_height_in_luma_samples,
  - A variable K is set equal to (log2CbHeight = = 7 ? 1 : 2).
  - If log2CbHeight is greater than or equal to K + log2CbWidth, SplitMode[ x ][ y ] is set equal to SPLIT_BT_HOR.
  - Otherwise (log2CbHeight is smaller than K + log2CbWidth), SplitMode[ x ][ y ] is set equal to SPLIT_BT_VER.
} 4200

- Otherwise, if y0 + ( 1 << log2CbHeight ) is greater than pic_height_in_luma_samples
  - A variable K is set equal to (log2CbWidth = = 7 ? 1 : 2).
  - If log2CbWidth is greater than or equal to K + log2CbHeight, SplitMode[ x ][ y ] is set equal to SPLIT_BT_VER.
  - Otherwise (log2CbWidth is smaller than K + log2CbHeight), SplitMode[ x ][ y ] is set equal to SPLIT_BT_HOR.
} 4250

METHOD AND DEVICE FOR ENCODING VIDEO HAVING BLOCK SIZE SET FOR EACH BLOCK SHAPE, AND METHOD AND DEVICE FOR DECODING VIDEO

CROSS-REFERENCE TO RELATED APPLICATIONS

This is a Continuation of U.S. application Ser. No. 17/480,816 filed Sep. 21, 2021, which is a Continuation Application of International Application PCT/KR2020/003973 filed on Mar. 23, 2020, which claims benefit of the U.S. Provisional Patent Application No. 62/821,492 filed on Mar. 21, 2019, U.S. Provisional Patent Application No. 62/945,992 filed on Dec. 10, 2019, U.S. Provisional Patent Application No. 62/950,308 filed on Dec. 19, 2019, U.S. Provisional Patent Application No. 62/952,625 filed on Dec. 23, 2019, the disclosures of which are incorporated herein in their entireties by reference.

BACKGROUND

1. Field

The disclosure relates to the fields of image encoding and decoding. More particularly, the present disclosure relates to methods and apparatuses for encoding and decoding videos by splitting various shapes of blocks.

2. Description of Related Art

In compression methods according to related art, square coding units are determined through a recursive splitting process in which a coding unit is uniformly split into four coding units of the same size after it is determined whether to perform splitting in a process of determining a size of a coding unit. However, in recent years, quality deterioration in a reconstructed image caused by the use of coding units having a uniform shape, such as a square, for a high-resolution image has emerged as a problem. Accordingly, methods and apparatuses for splitting a high-resolution image into various shapes of coding units are proposed.

SUMMARY

Provided are an encoding method and apparatus and a decoding method and apparatus for effectively signaling syntax elements for sizes of various shapes of coding units.

Provided are methods to efficiently signal information about a splitting method for blocks between a video encoding apparatus and a video decoding apparatus, in order to decode an encoded video by using blocks split into various shapes.

Additional aspects will be set forth in part in the description which follows and, in part, will be apparent from the description, or may be learned by practice of the presented embodiments.

In accordance with an aspect of the disclosure, a video decoding method may include: by using information about a size of a largest coding unit obtained from a bitstream, determining the size of the largest coding unit; by using information about a minimum size of a coding unit obtained from the bitstream, determining the minimum size of the coding unit; obtaining, from the bitstream, information indicating a second difference between a maximum size of a coding unit of which a width and a height have a ratio of 1:4 and the size of the largest coding unit, and by using the size of the largest coding unit and the second difference, determining the maximum size of the coding unit of which the width and the height have a ratio of 1:4; based on the minimum size of the coding unit, determining a minimum size of the coding unit of which the width and the height have a ratio of 1:4; based on the maximum size of the coding unit of which the width and the height have a ratio of 1:4 and the minimum size of the coding unit of which the width and the height have a ratio of 1:4, determining whether it is possible to generate a coding unit of which a width and a height have a ratio of 1:4 by splitting a first coding unit; and when it is possible to generate the coding unit of which the width and the height have a ratio of 1:4 by splitting the first coding unit, determining a second coding unit including the coding unit of which the width and the height have a ratio of 1:4, from the first coding unit, and decoding the second coding unit.

According to various embodiments of the present disclosure, because the number of bits for encoding and decoding information about a maximum size and information about a minimum size of a block according to a block ratio, and information about a maximum size and a minimum size of a block according to a split shape may be reduced, video encoding apparatuses and video decoding apparatuses may set information about maximum sizes or minimum sizes of various blocks and encode and decode the same.

However, effects achievable by encoding and decoding methods using tiles and pictures and encoding and decoding apparatuses using tiles and pictures are not limited to those mentioned above, and other effects that not mentioned could be clearly understood by one of ordinary skill in the art from the following description.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 13 illustrates a process of determining a depth of a coding unit when a shape and size of the coding unit change, when the coding unit is recursively split such that a plurality of coding units are determined, according to an embodiment.

FIG. 21 illustrates allowable block sizes for block ratios in a block split tree structure, according to an embodiment.

FIG. 22 illustrates parameters for a maximum size and a minimum size determined for a block ratio in a block split tree structure of FIG. 21, according to an embodiment.

FIG. 23 illustrates allowable block sizes according to a block ratio, according to another embodiment.

FIG. 24 illustrates allowable block sizes according to a block ratio, according to another embodiment.

FIG. 25 illustrates allowable block sizes according to a block ratio, according to another embodiment.

FIG. 26 illustrates syntax elements for signaling information about a maximum size and information about a minimum size for a block, according to an embodiment.

FIG. 27 illustrates a relational expression for determining a size of a maximum block and a size of a minimum block, determined according to syntax elements of FIG. 26, according to an embodiment.

FIG. 28 illustrates syntax elements for determining a block on which a split unit coding order (SUCO) is performed, according to an embodiment.

FIG. 29 illustrates a relational expression for determining a maximum size and a minimum size of a block, on which a SUCO is performed, determined according to syntax elements of FIG. 28, according to an embodiment.

FIG. 30 illustrates a conditional expression for ternary splitting a coding unit according to a size of a maximum block and a size of a minimum block, determined according to a relational expression of FIG. 27, according to an embodiment.

FIG. 34 illustrates a conditional expression for determining a split mode of a current coding unit including a right boundary or a lower boundary of a picture, according to a first embodiment.

FIG. 40 illustrates a conditional expression for determining a split mode of a current coding unit including a right boundary or a lower boundary, according to a fourth embodiment.

FIG. 42 illustrates a conditional expression for determining a split mode of a current coding unit including a right boundary or a lower boundary, according to a fifth embodiment.

DETAILED DESCRIPTION

Figure 1:
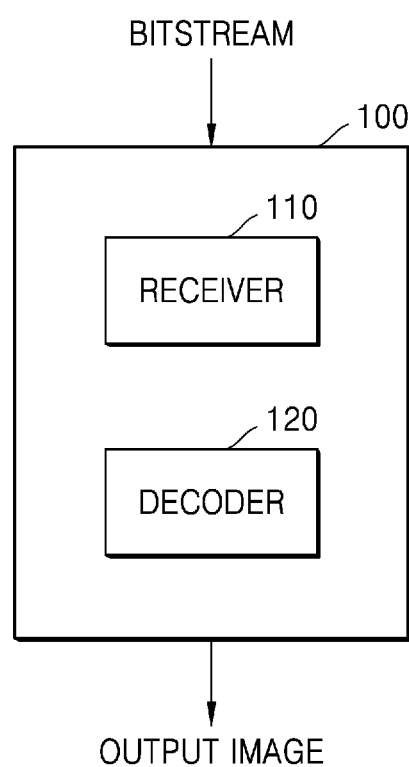
FIG. 1 is a schematic block diagram of an image decoding apparatus according to an embodiment.

According to an embodiment of the present disclosure, a video decoding method includes: by using information about a size of a largest coding unit obtained from a bitstream, determining the size of the largest coding unit; by using information about a minimum size of a coding unit obtained from the bitstream, determining the minimum size of the coding unit; determining, from the bitstream, information indicating a first difference between a maximum size of a coding unit of which a width and a height have a ratio of 1:4 and the size of the largest coding unit, and by using the size of the largest coding unit and the first difference determining the maximum size of the coding unit of which the width and the height have a ratio of 1:4; based on the minimum size of the coding unit, determining a minimum size of the coding unit of which the width and the height have a ratio of 1:4; based on the maximum size of the coding unit of which the width and the height have a ratio of 1:4 and the minimum size of the coding unit of which the width and the height have a ratio of 1:4, determining whether it is possible to generate a coding unit of which a width and a height have a ratio of 1:4 by splitting a first coding unit; and when it is possible to generate the coding unit of which the width and the height have a ratio of 1:4 by splitting the first coding unit, determining a second coding unit including the coding unit of which the width and the height have a ratio of 1:4, from the first coding unit, and decoding the second coding unit.

The determining of the minimum size of the coding unit may include determining the minimum size of the coding unit by using a value obtained by adding 2 to the information about the minimum size of the coding unit.

The determining of the maximum size of the coding unit of which the width and the height have a ratio of 1:4 by using the size of the largest coding unit and the first difference may include determining the maximum size of the coding unit of which the width and the height have a ratio of 1:4, to be identical to a smaller value between a block size according to a value obtained by subtracting the first difference from the size of the largest coding unit, and a maximum size of a transform unit.

According to an embodiment, the determining of the minimum size of the coding unit of which the width and the height have a ratio of 1:4, based on the minimum size of the coding unit may include: determining a minimum size of a coding unit of which a width and a height have a ratio of 1:1, to be a same size as the minimum size of the coding unit; determining a minimum size of a coding unit of which a width and a height have a ratio of 1:2, to be a size twice than the minimum size of the coding unit of which the width and the height have a ratio of 1:1; and determining the minimum size of the coding unit of which the width and the height have a ratio of 1:4, to be a size twice than the minimum size of the coding unit of which the width and the height have a ratio of 1:2.

According to an embodiment, the maximum size of the coding unit may indicate a maximum size of a longer side between the width and the height of the coding unit, the minimum size of the coding unit indicates a minimum size of a longer side between the width and the height of the coding unit. According to an embodiment, the maximum size of the coding unit of which the width and the height have a ratio of 1:1 may indicate a maximum size of a longer side between the width and the height of the coding unit of which the width and the height have a ratio of 1:1. According to an embodiment, the minimum size of the coding unit of which the width and the height have a ratio of 1:1 may indicate a minimum size of a longer side between the width and the height of the coding unit of which the width and the height have a ratio of 1:1. According to an embodiment, the maximum size of the coding unit of which the width and the height have a ratio of 1:2 may indicate a maximum size of a longer side between the width and the height of the coding unit of which the width and the height have a ratio of 1:2. According to an embodiment, the minimum size of the coding unit of which the width and the height have a ratio of 1:2 may indicate a minimum size of a longer side between the width and the height of the coding unit of which the width and the height have a ratio of 1:2. According to an embodiment, the maximum size of the coding unit of which the width and the height have a ratio of 1:4 may indicate a maximum size of a longer side between the width and the height of the coding unit of which the width and the height have a ratio of 1:4. According to an embodiment, the minimum size of the coding unit of which the width and the height have a ratio of 1:4 may indicate a minimum size of a longer side between the width and the height of the coding unit of which the width and the height have a ratio of 1:4.

According to an embodiment, the video decoding method may further include: determining, from the bitstream, information indicating a second difference between the size of the largest coding unit and a maximum size of a ternary splittable block, and determining the maximum size of the ternary splittable block by using the size of the largest coding unit and the second difference; obtaining, from the bitstream, information indicating a third difference between the minimum size of the coding unit and a minimum size of the ternary splittable block, and determining the minimum size of the ternary splittable block by using the minimum size of the coding unit and the third difference; based on the maximum size of the ternary splittable block and the minimum size of the ternary splittable block, determining whether to ternary split a current block; and decoding blocks generated by ternary splitting from the current block.

The determining of the maximum size of the ternary splittable block by using the size of the largest coding unit and the second difference may include determining the maximum size of the ternary splittable block, to be identical to a smaller value between a block size according to a value obtained by subtracting the second difference from the size of the largest coding unit, and a maximum size of a transform unit. According to an embodiment, the determining of the minimum size of the ternary splittable block by using the minimum size of the coding unit and the third difference may include, by using a value obtained by adding the third difference to the minimum size of the coding unit, determining the minimum size of the ternary splittable block.

According to an embodiment, the size of the largest coding unit may be 32, and the information about the size of the largest coding unit may indicate a quotient obtained by splitting the size of the largest coding unit by 32.

According to an embodiment of the present disclosure, a video decoding apparatus includes: an obtainer configured to obtain, from a bitstream, information about a size of a largest coding unit, information about a minimum size of a coding unit, and information indicating a first difference between a maximum size of a coding unit of which a width and a height have a ratio of 1:4 and the size of the largest coding unit; and a decoder configured to determine the size of the largest coding unit by using the information about the size of the largest coding unit, determine the minimum size of the coding unit by using the information about the minimum size of the coding unit, determine the maximum size of the coding unit of which the width and the height have a ratio of 1:4 by using the size of the largest coding unit and the first difference, determine the minimum size of the coding unit of which the width and the height have a ratio of 1:4, based on the minimum size of the coding unit, determine whether it is possible to generate a coding unit of which a width and a height of the block have a ratio of 1:4 by splitting a first coding unit, based on the maximum size of the coding unit of which the width and the height have a ratio of 1:4 and the minimum size of the coding unit of which the width and the height have a ratio of 1:4, and when it is possible to generate the coding unit of which the width and the height have a ratio of 1:4 by splitting the first coding unit, determine the second coding unit including the coding unit of which the width and the height have a ratio of 1:4, from the first coding unit, and decode the second coding unit.

According to an embodiment, the decoder may be configured to determine the minimum size of the coding unit by using a value obtained by adding 2 to the information about the minimum size of the coding unit, and determine the maximum size of the coding unit of which the width and the height have a ratio of 1:4, to be identical to a smaller value between a block size according to a value obtained by subtracting the first difference from the size of the largest coding unit, and a maximum size of a transform unit.

According to an embodiment, the decoder may be configured to determine a minimum size of a coding unit of which a width and a height have a ratio of 1:1, to be a same size as the minimum size of the coding unit, determine a minimum size of a coding unit of which a width and a height have a ratio of 1:2, to be a size twice than the minimum size of the coding unit of the width and the height have a ratio of 1:1, and determine a minimum size of a coding unit of which a width and a height have a ratio of 1:4, to be a size twice than the minimum size of the coding unit of which the width and the height have a ratio of 1:2.

According to an embodiment, the obtainer may be configured to obtain, from the bitstream, information indicating a second difference between the size of the largest coding unit and a maximum size of a ternary splittable block, and information indicating a third difference between the minimum size of the coding unit and a minimum size of the ternary splittable block. According to an embodiment, the decoder may be configured to determine the maximum size of the ternary splittable block by using the size of the largest coding unit and the second difference, determine the minimum size of the ternary splittable block by using the minimum size of the coding unit and the third difference, determine whether to ternary split a current block, based on the maximum size of the ternary splittable block and the minimum size of the ternary splittable block, and decode blocks generated by ternary splitting from the current block.

According to an embodiment, the decoder may be configured to determine the maximum size of the ternary splittable block, to be identical to a smaller value between a block size according to a value obtained by subtracting the second difference from the size of the largest coding unit, and a maximum size of a transform unit, and determine the minimum size of the ternary splittable block by using a value obtained by adding the third difference to the minimum size of the coding unit.

According to an embodiment of the present disclosure, a video encoding method includes: determining a size of a largest coding unit, a minimum size of a coding unit, a maximum size of a coding unit of which a width and a height have a ratio of 1:4, and a minimum size of the coding unit of which the width and the height have a ratio of 1:4; based on the maximum size of the coding unit of which the width and the height have a ratio of 1:4 and the minimum size of the coding unit of which the width and the height have a ratio of 1:4, determining a second coding unit of which a width and a height have a ratio of 1:4, from a first coding unit, and encoding the second coding unit; encoding information about the maximum size of the coding unit based on the size of the largest coding unit; encoding the information about the minimum size of the coding unit by using the minimum size of the coding unit; and by using the size of the largest coding unit and the maximum size of the coding unit of which the width and the height have a ratio of 1:4, encoding information indicating a first difference between the maximum size of the coding unit of which the width and the height have a ratio of 1:4 and the size of the largest coding unit.

According to an embodiment, the determining of the size of the largest coding unit, the minimum size of the coding unit, the maximum size of the coding unit of which the width and the height have a ratio of 1:4, and the minimum size of the coding unit of which the width and the height have a ratio of 1:4 may include: determining a minimum size of a coding unit of which a width and a height have a ratio of 1:1, to be a same size as the minimum size of the coding unit; determining a minimum size of a coding unit of which a width and a height have a ratio of 1:2, to be a size twice than the minimum size of the coding unit of which the width and the height have a ratio of 1:1; and determining the minimum size of the coding unit of which the width and the height have a ratio of 1:4, to be a size twice than the minimum size of the coding unit of which the width and the height have a ratio of 1:2.

According to an embodiment of the present disclosure, a computer-readable recording medium has recorded thereon a computer program for implementing the video decoding method on a computer.

According to an embodiment of the present disclosure, a computer-readable recording medium has recorded thereon a computer program for implementing the video encoding method on a computer.

As the present disclosure allows for various changes and numerous examples, particular embodiments will be illustrated in the drawings and described in detail in the written description. However, this is not intended to limit the present disclosure to particular modes of practice, and it will be understood that all changes, equivalents, and substitutes that do not depart from the spirit and technical scope of various embodiments are encompassed in the present disclosure.

In the description of embodiments, certain detailed explanations of related art are omitted when it is deemed that they may unnecessarily obscure the essence of the present disclosure. Also, numbers (for example, a first, a second, and the like) used in the description of the specification are merely identifiers or identifier codes for distinguishing one element from another.

Also, in the present specification, it will be understood that when elements are "connected" or "coupled" to each other, the elements may be directly connected or coupled to each other, or may be connected or coupled to each other with an intervening element therebetween, unless specified otherwise.

In the present specification, regarding an element represented as a "unit" or a "module", two or more elements may be combined into one element or one element may be divided into two or more elements according to subdivided functions. In addition, each element described hereinafter may additionally perform some or all of functions performed by another element, in addition to main functions of itself, and some of the main functions of each element may be performed entirely by another element.

Also, in the present specification, an 'image' or a 'picture' may denote a still image of a video or a moving image, i.e., the video itself.

Also, in the present specification, a 'sample' denotes data assigned to a sampling location of an image, i.e., data to be processed. For example, pixel values of an image in a spatial domain and transform coefficients on a transform domain may be samples. A unit including at least one such sample may be defined as a block.

Also, in the present specification, a 'current block' may denote a block of a largest coding unit, coding unit, prediction unit, or transform unit of a current image to be encoded or decoded.

In the present specification, a motion vector in a list 0 direction may denote a motion vector used to indicate a block in a reference picture included in a list 0, and a motion vector in a list 1 direction may denote a motion vector used to indicate a block in a reference picture included in a list 1. Also, a motion vector in a unidirection may denote a motion vector used to indicate a block in a reference picture included in a list 0 or list 1, and a motion vector in a bidirection may denote that the motion vector includes a motion vector in a list 0 direction and a motion vector in a list 1 direction.

Hereinafter, an image encoding apparatus and an image decoding apparatus, and an image encoding method and an image decoding method according to embodiments will be described with reference to FIGS. 1 through 16. A method of determining a data unit of an image, according to an embodiment, will be described with reference to FIGS. 3 through 16, and a video encoding/decoding method according to an embodiment will be described with reference to FIGS. 17 through 42.

Hereinafter, a method and device for adaptive selection based on various shapes of coding units, according to an embodiment of the present disclosure, will be described with reference to FIGS. 1 and 2.

FIG. 1 is a schematic block diagram of an image decoding apparatus according to an embodiment.

An image decoding apparatus 100 may include a receiver 110 and a decoder 120. The receiver 110 and the decoder 120 may include at least one processor. Also, the receiver 110 and the decoder 120 may include a memory storing instructions to be performed by the at least one processor.

The receiver 110 may receive a bitstream. The bitstream includes information of an image encoded by an image encoding apparatus 2200 described below. Also, the bitstream may be transmitted from the image encoding apparatus 2200. The image encoding apparatus 2200 and the image decoding apparatus 100 may be connected by wire or wirelessly, and the receiver 110 may receive the bitstream by wire or wirelessly. The receiver 110 may receive the bitstream from a storage medium, such as an optical medium or a hard disk. The decoder 120 may reconstruct an image based on information obtained from the received bitstream. The decoder 120 may obtain, from the bitstream, a syntax element for reconstructing the image. The decoder 120 may reconstruct the image based on the syntax element.

Example operations of the image decoding apparatus 100 will be described in detail with reference to FIG. 2.

Figure 2:
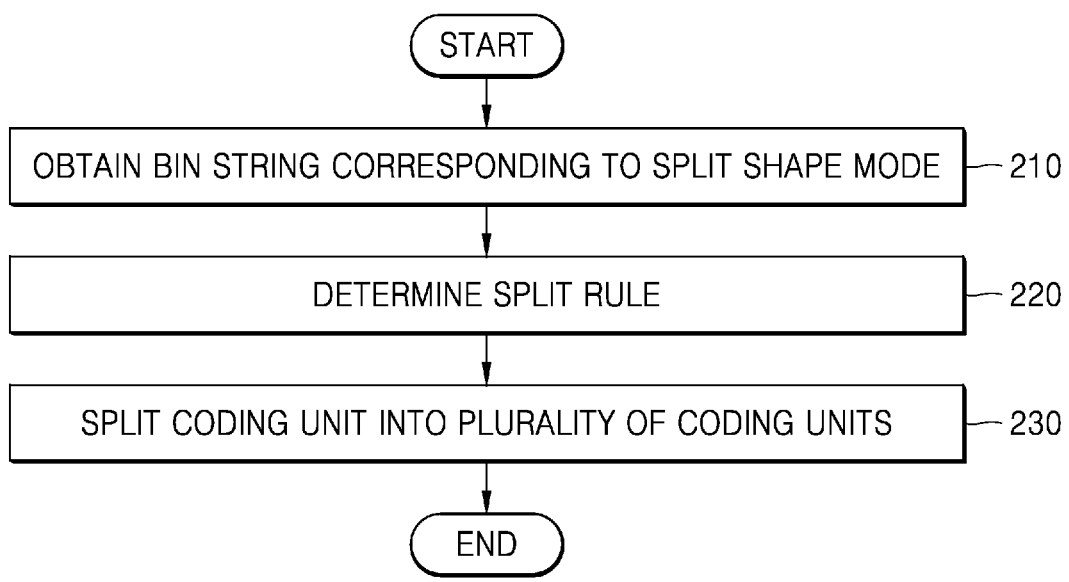
FIG. 2 is a flowchart of an image decoding method according to an embodiment.

FIG. 2 is a flowchart of an image decoding method according to an embodiment.

According to an embodiment of the present disclosure, the receiver 110 receives a bitstream.

The image decoding apparatus 100 obtains, from a bitstream, a bin string corresponding to a split shape mode of a coding unit in operation 210. The image decoding apparatus 100 determines a split rule of the coding unit in operation 220. Also, the image decoding apparatus 100 splits the coding unit into a plurality of coding units, based on at least one of the bin strings corresponding to the split shape mode and the split rule in operation 230. The image decoding apparatus 100 may determine an allowable first range of a size of the coding unit, according to a ratio of the width and the height of the coding unit, in order to determine the split rule. The image decoding apparatus 100 may determine an allowable second range of the size of the coding unit, according to the split shape mode of the coding unit, in order to determine the split rule.

Hereinafter, an example splitting of a coding unit will be described in detail according to an embodiment of the present disclosure.

First, one picture may be split into one or more slices or one or more tiles. One slice or one tile may be a sequence of one or more largest coding units (for example coding tree units (CTUs)). A largest coding block (for example coding tree block (CTB)) may be conceptually compared to a largest coding unit (CTU).

The largest coding unit (CTU) denotes an N×N block including N×N samples (where N is an integer). Each color component may be split into one or more largest coding blocks.

When a picture has three sample arrays (for example sample arrays for Y, Cr, and Cb components), a largest coding unit (CTU) includes a largest coding block of a luma sample, two corresponding largest coding blocks of chroma samples, and syntax structures used to encode the luma sample and the chroma samples. When a picture is a monochrome picture, a largest coding unit includes a largest coding block of a monochrome sample and syntax structures used to encode the monochrome samples. When a picture is a picture encoded in color planes separated according to color components, a largest coding unit includes syntax structures used to encode the picture and samples of the picture.

One largest coding tree block (CTB) may be split into M×N coding blocks including M×N samples (M and N are integers).

When a picture has sample arrays for Y, Cr, and Cb components, a coding unit (CU) includes a coding block of a luma sample, two corresponding coding blocks of chroma samples, and syntax structures used to encode the luma sample and the chroma samples. When a picture is a monochrome picture, a coding unit includes a coding block of a monochrome sample and syntax structures used to encode the monochrome samples. When a picture is a picture encoded in color planes separated according to color components, a coding unit includes syntax structures used to encode the picture and samples of the picture.

As described above, a largest coding block and a largest coding unit are conceptually distinguished from each other, and a coding block and a coding unit are conceptually distinguished from each other. That is, a coding unit, or a largest coding unit, refers to a data structure including a coding block, or a largest coding block, including a corresponding sample and a syntax structure corresponding to the coding block, or the largest coding block. However, because it is understood by one of ordinary skill in the art that a coding unit, a largest coding unit, a coding block, or a largest coding block, refers to a block of a certain size including a certain number of samples, a largest coding block and a largest coding unit, or a coding block and a coding unit are mentioned in the following specification without being distinguished unless otherwise described.

An image may be split into largest coding units (for example CTUs). A size of each largest coding unit may be determined based on information obtained from a bitstream. A shape of each largest coding unit may be a square shape of the same size. However, embodiments are not limited thereto.

For example, information about a maximum size of a luma coding block may be obtained from a bitstream. For example, the maximum size of the luma coding block indicated by the information about the maximum size of the luma coding block may be one of 4×4, 8×8, 16×16, 32×32, 64×64, 128×128, and 256×256.

For example, information about a luma block size difference and a maximum size of a luma coding block that may be split into two may be obtained from a bitstream. The information about the luma block size difference may refer to a size difference between a luma largest coding unit and a largest luma coding block that may be split into two.

Accordingly, when the information about the maximum size of the luma coding block that may be split into two and the information about the luma block size difference obtained from the bitstream are combined with each other, a size of the luma largest coding unit may be determined. A size of a chroma largest coding unit may be determined by using the size of the luma largest coding unit. For example, when a Y:Cb:Cr ratio is 4:2:0 according to a color format, a size of a chroma block may be half a size of a luma block, and a size of a chroma largest coding unit may be half a size of a luma largest coding unit.

According to an embodiment, because information about a maximum size of a luma coding block that is binary splittable is obtained from a bitstream, the maximum size of the luma coding block that is binary splittable may be variably determined. In contrast, a maximum size of a luma coding block that is ternary splittable may be fixed. For example, the maximum size of the luma coding block that is ternary splittable in an I-picture may be 32×32, and the maximum size of the luma coding block that is ternary splittable in a P-picture or a B-picture may be 64×64.

Also, a largest coding unit may be hierarchically split into coding units based on split shape mode information obtained from a bitstream. At least one of information indicating whether quad splitting is performed, information indicating whether multi-splitting is performed, split direction information, and split type information may be obtained as the split shape mode information from the bitstream.

For example, the information indicating whether quad splitting is performed may indicate whether a current coding unit is quad split (QUAD_SPLIT) or not.

When the current coding unit is not quad split, the information indicating whether multi-splitting is performed may indicate whether the current coding unit is no longer split (NO_SPLIT) or binary/ternary split.

When the current coding unit is binary split or ternary split, the split direction information indicates that the current coding unit is split in one of a horizontal direction and a vertical direction.

When the current coding unit is split in the horizontal direction or the vertical direction, the split type information indicates that the current coding unit is binary split or ternary split.

A split mode of the current coding unit may be determined according to the split direction information and the split type information. A split mode when the current coding unit is binary split in the horizontal direction may be determined to be a binary horizontal split mode (SPLIT_BT_HOR), a split mode when the current coding unit is ternary split in the horizontal direction may be determined to be a ternary horizontal split mode (SPLIT_TT_HOR), a split mode when the current coding unit is binary split in the vertical direction may be determined to be a binary vertical split mode (SPLIT_BT_VER), and a split mode when the current coding unit is ternary split in the vertical direction may be determined to be a ternary vertical split mode (SPLIT_TT_VER).

The image decoding apparatus 100 may obtain, from the bitstream, the split shape mode information from one bin string. A form of the bitstream received by the image decoding apparatus 100 may include fixed length binary code, unary code, truncated unary code, pre-determined binary code, or the like. The bin string is information in a binary number. The bin string may include at least one bit. The image decoding apparatus 100 may obtain the split shape mode information corresponding to the bin string, based on the split rule. The image decoding apparatus 100 may determine whether to quad-split a coding unit, whether not to split a coding unit, a split direction, and a split type, based on one bin string.

The coding unit may be smaller than or same as the largest coding unit. For example, because a largest coding unit is a coding unit having a maximum size, the largest coding unit is one of the coding units. When split shape mode information about a largest coding unit indicates that splitting is not performed, a coding unit determined in the largest coding unit has the same size as that of the largest coding unit. When split shape code information about a largest coding unit indicates that splitting is performed, the largest coding unit may be split into coding units. Also, when split shape mode information about a coding unit indicates that splitting is performed, the coding unit may be split into smaller coding units. However, the splitting of the image is not limited thereto, and the largest coding unit and the coding unit may not be distinguished. Examples of the splitting of the coding unit will be described in detail with reference to FIGS. 3 through 16.

Also, one or more prediction blocks for prediction may be determined from a coding unit. The prediction block may be the same as or smaller than the coding unit. Also, one or more transform blocks for transform may be determined from a coding unit. The transform block may be the same as or smaller than the coding unit.

The shapes and sizes of the transform block and prediction block may be unrelated to each other.

In another embodiment, prediction may be performed by using a coding unit as a prediction unit. Also, transform may be performed by using a coding unit as a transform block.

Examples of the splitting of the coding unit will be described in detail with reference to FIGS. 3 through 16. A current block and a neighboring block of the present disclosure may indicate one of the largest coding unit, the coding unit, the prediction block, and the transform block. Also, the current block of the current coding unit is a block that is currently being decoded or encoded or a block that is currently being split. The neighboring block may be a block reconstructed before the current block. The neighboring block may be adjacent to the current block spatially or temporally. The neighboring block may be located at one of the lower left, left, upper left, top, upper right, right, lower right of the current block.

Figure 3:
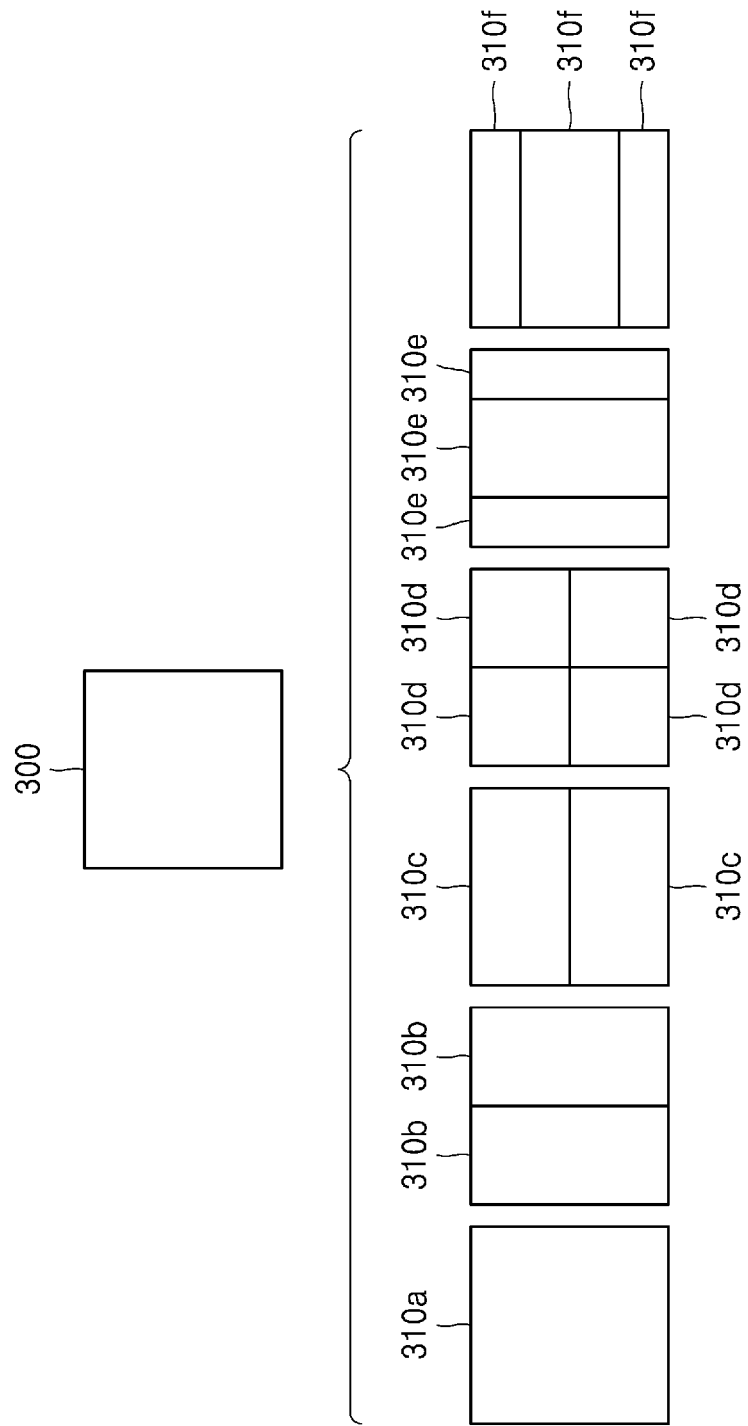
FIG. 3 illustrates a process, performed by an image decoding apparatus, of determining at least one coding unit by splitting a current coding unit, according to an embodiment.

FIG. 3 illustrates a process, performed by an image decoding apparatus, of determining at least one coding unit by splitting a current coding unit, according to an embodiment.

A block shape may include 4N×4N, 4N×2N, 2N×4N, 4N×N, N×4N, 32N×N, N×32N, 16N×N, N×16N, 8N×N, or N×8N. Here, N may be a positive integer. Block shape information is information indicating at least one of a shape, direction, a ratio of width and height, or size of a coding unit.

The shape of the coding unit may include a square and a non-square. When the lengths of the width and the height of the coding unit are the same (for example, when the block shape of the coding unit is 4N×4N), the image decoding apparatus 100 may determine the block shape information of the coding unit as a square. The image decoding apparatus 100 may determine the shape of the coding unit to be a square.

When the width and the height of the coding unit are different from each other (for example, when the block shape of the coding unit is 4N×2N, 2N×4N, 4N×N, N×4N, 32N×N, N×32N, 16N×N, N×16N, 8N×N, or N×8N), the image decoding apparatus 100 may determine the block shape information of the coding unit as a non-square shape.

When the shape of the coding unit is non-square, the image decoding apparatus 100 may determine the ratio of the width and the height among the block shape information of the coding unit to be at least one of 1:2, 2:1, 1:4, 4:1, 1:8, 8:1, 1:16, 16:1, 1:32, and 32:1. Also, the image decoding apparatus 100 may determine whether the coding unit is in a horizontal direction or a vertical direction, based on the length of the width and the length of the height of the coding unit. Also, the image decoding apparatus 100 may determine the size of the coding unit, based on at least one of the length of the width, the length of the height, or the area of the coding unit.

According to an embodiment, the image decoding apparatus 100 may determine the shape of the coding unit by using the block shape information and may determine a splitting method of the coding unit by using the split shape mode information. That is, a coding unit splitting method indicated by the split shape mode information may be determined based on a block shape indicated by the block shape information used by the image decoding apparatus 100.

The image decoding apparatus 100 may obtain the split shape mode information from a bitstream. However, embodiments are not limited thereto, and the image decoding apparatus 100 and the image encoding apparatus 2200 may determine pre-agreed split shape mode information, based on the block shape information. The image decoding apparatus 100 may determine the pre-agreed split shape mode information with respect to a largest coding unit or a smallest coding unit. For example, the image decoding apparatus 100 may determine split shape mode information with respect to the largest coding unit to be a quad split. Also, the image decoding apparatus 100 may determine split shape mode information regarding the smallest coding unit to be "not to perform splitting", or no split. In particular, the image decoding apparatus 100 may determine the size of the largest coding unit to be 256×256. The image decoding apparatus 100 may determine the pre-agreed split shape mode information to be a quad split. The quad split is a split shape mode in which the width and the height of the coding unit are both bisected. The image decoding apparatus 100 may obtain a coding unit of a 128×128 size from the largest coding unit of a 256×256 size, based on the split shape mode information. Also, the image decoding apparatus 100 may determine the size of the smallest coding unit to be 4×4. The image decoding apparatus 100 may obtain split shape mode information indicating "not to perform splitting" with respect to the smallest coding unit.

According to an embodiment, the image decoding apparatus 100 may use the block shape information indicating that the current coding unit has a square shape. For example, the image decoding apparatus 100 may determine whether not to split a square coding unit, whether to vertically split the square coding unit, whether to horizontally split the square coding unit, or whether to split the square coding unit into four coding units, based on the split shape mode information. Referring to FIG. 3, when the block shape information of a current coding unit 300 indicates a square shape, the decoder 120 may not split a coding unit 310a having the same size as the current coding unit 300, based on the split shape mode information indicating not to perform splitting, or may determine coding units 310b, 310c, 310d, 310e, or 310f, which are split based on the split shape mode information indicating a certain splitting method. In embodiments, coding units 310b, 310c, 310d, 310e, or 310f may be determined or obtained by splitting current coding unit 300 based on the indicated splitting method.

Referring to FIG. 3, according to an embodiment, the image decoding apparatus 100 may determine two coding units 310b obtained by splitting the current coding unit 300 in a vertical direction, based on the split shape mode information indicating to perform splitting in a vertical direction. The image decoding apparatus 100 may determine two coding units 310c obtained by splitting the current coding unit 300 in a horizontal direction, based on the split shape mode information indicating to perform splitting in a horizontal direction. The image decoding apparatus 100 may determine four coding units 310d obtained by splitting the current coding unit 300 in vertical and horizontal directions, based on the split shape mode information indicating to perform splitting in vertical and horizontal directions. According to an embodiment, the image decoding apparatus 100 may determine three coding units 310e obtained by splitting the current coding unit 300 in a vertical direction, based on the split shape mode information indicating to perform ternary splitting in a vertical direction. The image decoding apparatus 100 may determine three coding units 310f obtained by splitting the current coding unit 300 in a horizontal direction, based on the split shape mode information indicating to perform ternary splitting in a horizontal direction. However, splitting methods of the square coding unit are not limited to the above-described methods, and the split shape mode information may indicate various methods. Examples of certain splitting methods of splitting the square coding unit will be described in detail below in relation to various embodiments.

Figure 4:
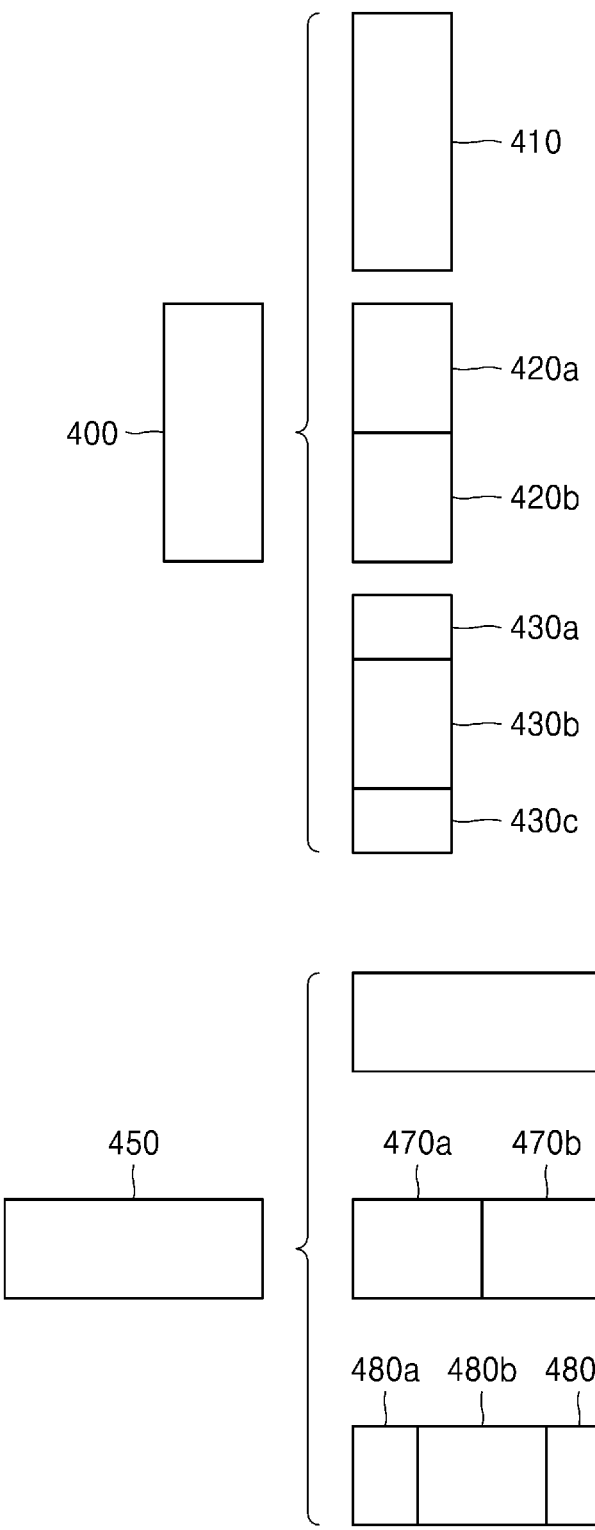
FIG. 4 illustrates a process, performed by an image decoding apparatus, of determining at least one coding unit by splitting a non-square coding unit, according to an embodiment.

FIG. 4 illustrates a process, performed by an image decoding apparatus, of determining at least one coding unit by splitting a non-square coding unit, according to an embodiment.

According to an embodiment, the image decoding apparatus 100 may use block shape information indicating that a current coding unit has a non-square shape. The image decoding apparatus 100 may determine whether not to split the non-square current coding unit or whether to split the non-square current coding unit by using a certain splitting method, based on split shape mode information. Referring to FIG. 4, when the block shape information of a current coding unit 400 or 450 indicates a non-square shape, the image decoding apparatus 100 may determine a coding unit 410 having the same size as the current coding unit 400 or coding unit 460 having the same size as the current coding unit 450, based on the split shape mode information indicating not to perform splitting, or determine coding units 420a and 420b, 430a to 430c, 470a and 470b, or 480a to 480c split based on the split shape mode information indicating a certain splitting method. In embodiments, coding units 420a and 420b or 430a to 430c may be determined or obtained by splitting current coding unit 400 based on the indicated splitting method, and coding unit 470a and 470b, or 480a to 480c may be determined or obtained by splitting current coding unit 450 based on the indicated splitting method. Examples of certain splitting methods of splitting a non-square coding unit will be described in detail below in relation to various embodiments.

According to an embodiment, the image decoding apparatus 100 may determine a splitting method of a coding unit by using the split shape mode information and, in this case, the split shape mode information may indicate the number of one or more coding units generated by splitting a coding unit. Referring to FIG. 4, when the split shape mode information indicates to split the current coding unit 400 or 450 into two coding units, the image decoding apparatus 100 may determine two coding units 420a and 420b included in the current coding unit 400, or 470a and 470b included in the current coding unit 450, by splitting the current coding unit 400 or 450 based on the split shape mode information.

According to an embodiment, when the image decoding apparatus 100 splits the non-square current coding unit 400 or 450 based on the split shape mode information, the image decoding apparatus 100 may consider the location of a long side of the non-square current coding unit 400 or 450 to split a current coding unit. For example, the image decoding apparatus 100 may determine a plurality of coding units by splitting a long side of the current coding unit 400 or 450, in consideration of the shape of the current coding unit 400 or 450.

According to an embodiment, when the split shape mode information indicates to split a coding unit into an odd number of blocks, for example in a ternary split, the image decoding apparatus 100 may determine an odd number of coding units included in the current coding unit 400 or 450. For example, when the split shape mode information indicates to split the current coding unit 400 or 450 into three coding units, the image decoding apparatus 100 may split the current coding unit 400 into three coding units 430a, 430b, and 430c, or split the current coding unit 450 into three coding units 480a, 480b, and 480c.

According to an embodiment, a ratio of the width and the height of the current coding unit 400 or 450 may be 4:1 or 1:4. When the ratio of the width and the height is 4:1, the block shape information may be a horizontal direction because the length of the width is longer than the length of the height. When the ratio of the width and the height is 1:4, the block shape information may be a vertical direction because the length of the width is shorter than the length of the height. The image decoding apparatus 100 may determine to split a current coding unit into the odd number of blocks, based on the split shape mode information. Also, the image decoding apparatus 100 may determine a split direction of the current coding unit 400 or 450, based on the block shape information of the current coding unit 400 or 450. For example, when the current coding unit 400 is in the vertical direction, the image decoding apparatus 100 may determine the coding units 430a to 430c by splitting the current coding unit 400 in the horizontal direction. Also, when the current coding unit 450 is in the horizontal direction, the image decoding apparatus 100 may determine the coding units 480a to 480c by splitting the current coding unit 450 in the vertical direction.

According to an embodiment, the image decoding apparatus 100 may determine the odd number of coding units included in the current coding unit 400 or 450, and not all the determined coding units may have the same size. For example, a certain coding unit 430b from among the determined odd number of coding units 430a, 430b, and 430c may have a size different from the size of the other coding units 430a and 430c, or a certain coding unit 480b from among the determined odd number of coding units 480a, 480b, and 480c, may have a size different from the size of the other coding units 480a and 480c. That is, coding units which may be determined by splitting the current coding unit 400 or 450 may have multiple sizes and, in some cases, all of the odd number of coding units 430a, 430b, and 430c, or 480a, 480b, and 480c may have different sizes.

According to an embodiment, when the split shape mode information indicates to split a coding unit into the odd number of blocks, the image decoding apparatus 100 may determine the odd number of coding units included in the current coding unit 400 or 450, and in addition, may put a certain restriction on at least one coding unit from among the odd number of coding units generated by splitting the current coding unit 400 or 450. Referring to FIG. 4, the image decoding apparatus 100 may set a decoding process regarding the coding unit 430b located at the center among the three coding units 430a, 430b, and 430c generated as the current coding unit 400 is split, to be different from that of the other coding units 430a and 430c, or may set a decoding process regarding the coding unit 480b located at the center among the three coding units 480a, 480b, and 480c generated as the current coding unit 450 is split to be different from that of the other coding units or 480a or 480c. For example, the image decoding apparatus 100 may restrict the coding unit 430b or 480b at the center location to be no longer split or to be split only a certain number of times, unlike the other coding units 430a and 430c, or 480a and 480c.

Figure 5:
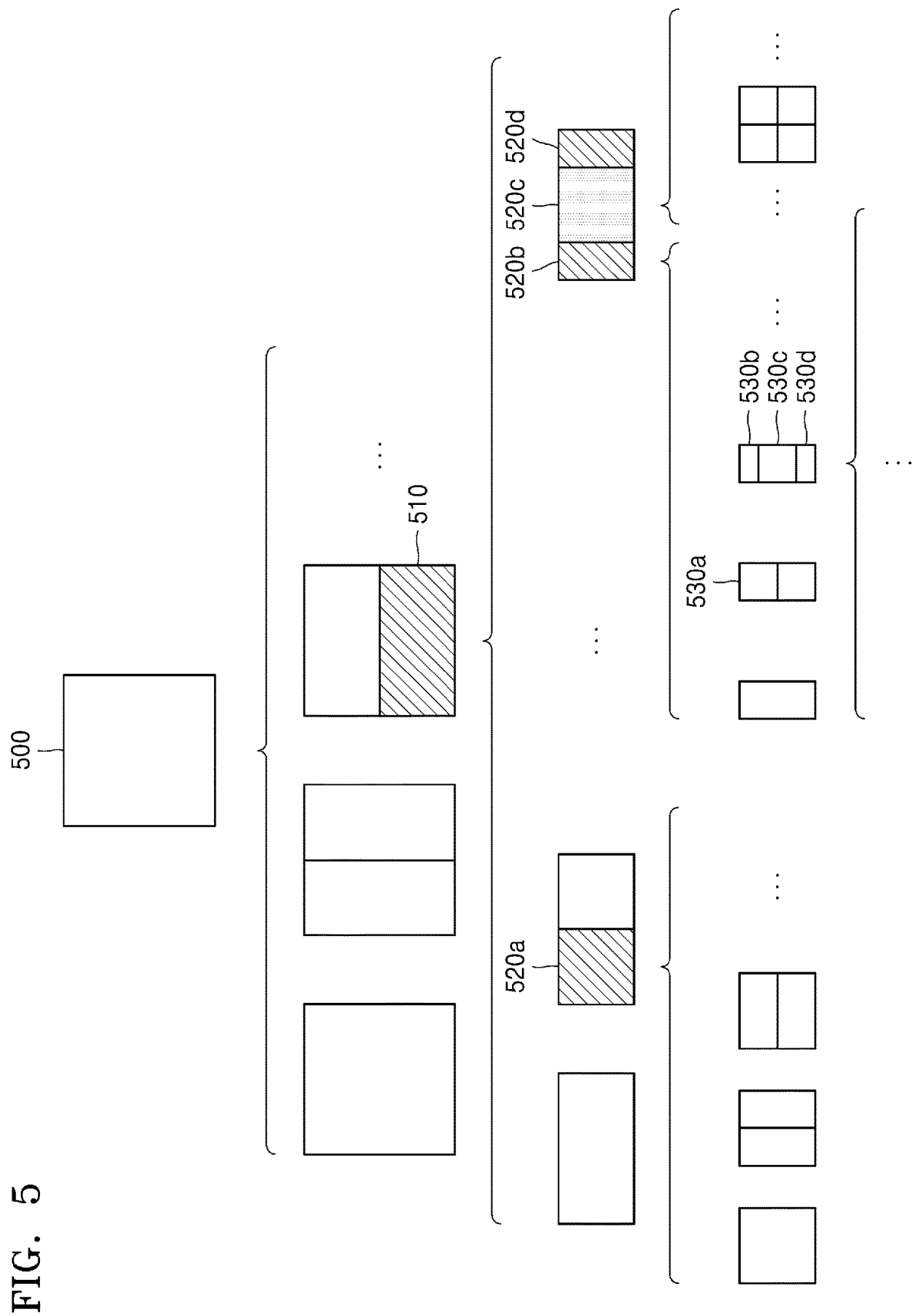
FIG. 5 illustrates a process, performed by an image decoding apparatus, of splitting a coding unit based on at least one of block shape information and split shape mode information, according to an embodiment.

FIG. 5 illustrates a process, performed by an image decoding apparatus, of splitting a coding unit based on at least one of block shape information and split shape mode information, according to an embodiment.

According to an embodiment, the image decoding apparatus 100 may determine to split or not to split a square first coding unit 500 into coding units, based on at least one of the block shape information and the split shape mode information. According to an embodiment, when the split shape mode information indicates to split the first coding unit 500 in a horizontal direction, the image decoding apparatus 100 may determine a second coding unit 510 by splitting the first coding unit 500 in a horizontal direction. A first coding unit, a second coding unit, and a third coding unit used according to an embodiment are terms used to understand a relation before and after splitting a coding unit. For example, a second coding unit may be determined by splitting a first coding unit, and a third coding unit may be determined by splitting the second coding unit. It will be understood that the structure of the first coding unit, the second coding unit, and the third coding unit follows the above descriptions.

According to an embodiment, the image decoding apparatus 100 may determine to split or not to split the determined second coding unit 510 into coding units, based on the split shape mode information. Referring to FIG. 5, the image decoding apparatus 100 may or may not split the non-square second coding unit 510, which is determined by splitting the first coding unit 500, into one or more third coding units 520a, or 520b, 520c, and 520d based on the split shape mode information. The image decoding apparatus 100 may obtain the split shape mode information and may obtain a plurality of various-shaped second coding units (for example second coding unit 510) by splitting the first coding unit 500, based on the obtained split shape mode information, and the second coding unit 510 may be split by using a splitting method of the first coding unit 500 based on the split shape mode information. According to an embodiment, when the first coding unit 500 is split into the second coding units 510 based on the split shape mode information of the first coding unit 500, the second coding unit 510 may also be split into the third coding units 520a, or 520b, 520c, and 520d based on the split shape mode information of the second coding unit 510. That is, a coding unit may be recursively split based on the split shape mode information of each coding unit. Therefore, a square coding unit may be determined by splitting a non-square coding unit, and a non-square coding unit may be determined by recursively splitting the square coding unit.

Referring to FIG. 5, a certain coding unit from among the odd number of third coding units 520b, 520c, and 520d determined by splitting the non-square second coding unit 510 (for example a coding unit at a center location or a square coding unit) may be recursively split. According to an embodiment, the square third coding unit 520c from among the odd number of third coding units 520b, 520c, and 520d may be split in a horizontal direction into a plurality of fourth coding units. A non-square fourth coding unit 530b or 530d from among a plurality of fourth coding units 530a, 530b, 530c, and 530d may be split into a plurality of coding units again. For example, the non-square fourth coding unit 530b or 530d may be split into the odd number of coding units again. A method that may be used to recursively split a coding unit will be described below in relation to various embodiments.

According to an embodiment, the image decoding apparatus 100 may split each of the third coding units 520a, or 520b, 520c, and 520d into coding units, based on the split shape mode information. Also, the image decoding apparatus 100 may determine not to split the second coding unit 510 based on the split shape mode information. According to an embodiment, the image decoding apparatus 100 may split the non-square second coding unit 510 into the odd number of third coding units 520b, 520c, and 520d. The image decoding apparatus 100 may put a certain restriction on a certain third coding unit from among the odd number of third coding units 520b, 520c, and 520d. For example, the image decoding apparatus 100 may restrict the third coding unit 520c at a center location from among the odd number of third coding units 520b, 520c, and 520d to be no longer split or to be split a settable number of times.

Referring to FIG. 5, the image decoding apparatus 100 may restrict the third coding unit 520c, which is at the center location from among the odd number of third coding units 520b, 520c, and 520d included in the non-square second coding unit 510, to be no longer split, to be split by using a certain splitting method (for example split into only four coding units or split by using a splitting method of the second coding unit 510), or to be split only a certain number of times (for example split only n times (where n>0)). However, the restrictions on the third coding unit 520c at the center location are not limited to the above-described examples and may include various restrictions for decoding the third coding unit 520c at the center location differently from the other third coding units 520b and 520d.

According to an embodiment, the image decoding apparatus 100 may obtain the split shape mode information, which is used to split a current coding unit, from a certain location in the current coding unit.

Figure 6:
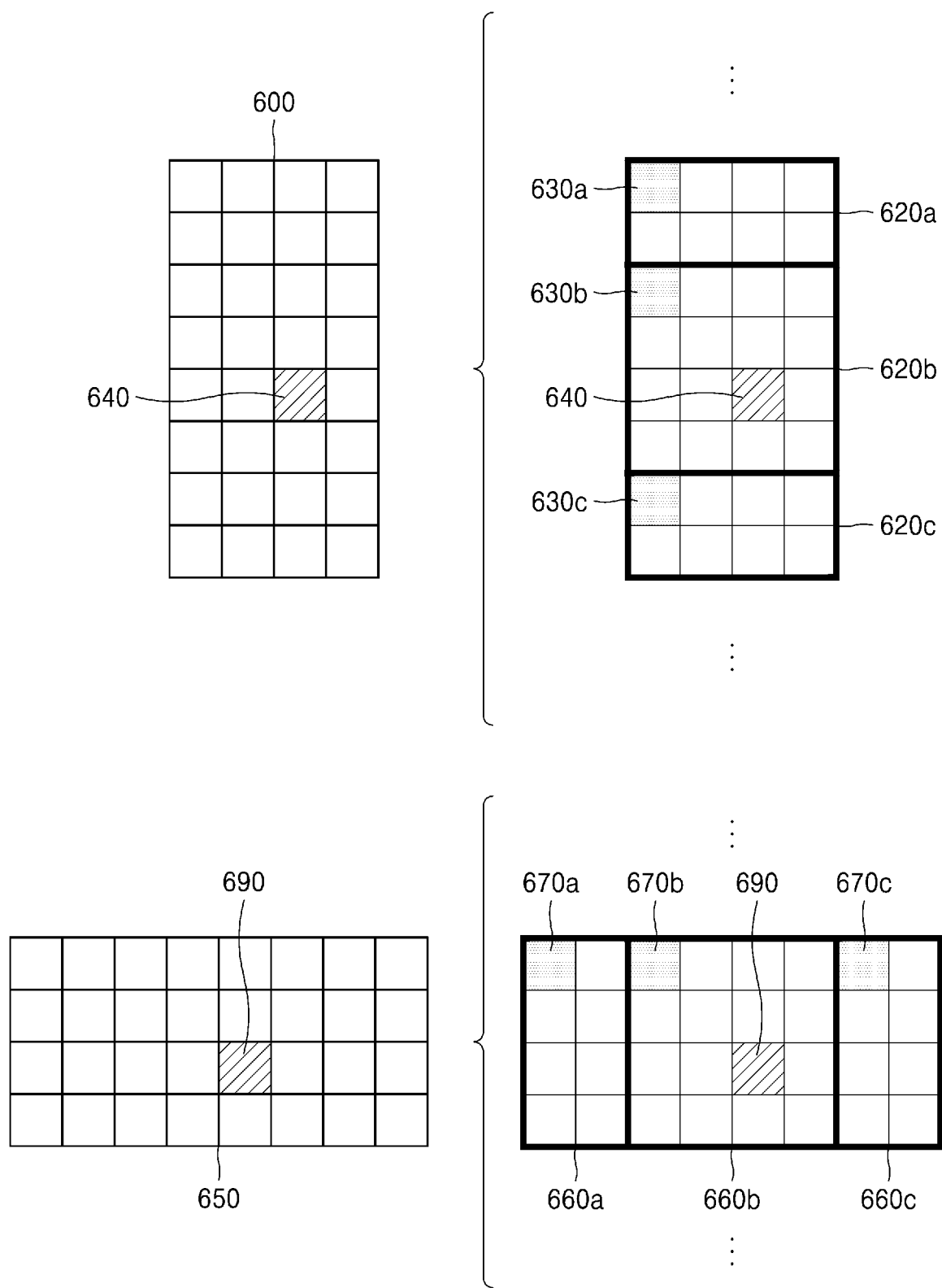
FIG. 6 illustrates a method, performed by an image decoding apparatus, of determining a certain coding unit from among an odd number of coding units, according to an embodiment.

FIG. 6 illustrates a method, performed by an image decoding apparatus, of determining a certain coding unit from among an odd number of coding units, according to an embodiment.

Referring to FIG. 6, split shape mode information of a current coding unit 600 or 650 may be obtained from a sample of a certain location (for example a sample 640 or 690 of a center location) from among a plurality of samples included in the current coding unit 600 or 650. However, the certain location in the current coding unit 600, from which at least one piece of the split shape mode information may be obtained, is not limited to the center location in FIG. 6 and may include various locations included in the current coding unit 600 (for example top, bottom, left, right, upper left, lower left, upper right, and lower right locations). The image decoding apparatus 100 may obtain the split shape mode information from the certain location and may determine to split or not to split the current coding unit into various-shaped and various-sized coding units.

According to an embodiment, when the current coding unit is split into a certain number of coding units, the image decoding apparatus 100 may select one of the coding units. Various methods may be used to select one of a plurality of coding units, examples of which will be described below in relation to various embodiments.

According to an embodiment, the image decoding apparatus 100 may split the current coding unit into a plurality of coding units and may determine a coding unit at a certain location.

According to an embodiment, image decoding apparatus 100 may use information indicating locations of the odd number of coding units, to determine a coding unit at a center location from among the odd number of coding units. Referring to FIG. 6, the image decoding apparatus 100 may determine the odd number of coding units 620a, 620b, and 620c or the odd number of coding units 660a, 660b, and 660c by splitting the current coding unit 600 or the current coding unit 650. The image decoding apparatus 100 may determine the middle coding unit 620b or the middle coding unit 660b by using information about the locations of the odd number of coding units 620a, 620b, and 620c or the odd number of coding units 660a, 660b, and 660c. For example, the image decoding apparatus 100 may determine the coding unit 620b of the center location by determining the locations of the coding units 620a, 620b, and 620c based on information indicating locations of certain samples included in the coding units 620a, 620b, and 620c. In detail, the image decoding apparatus 100 may determine the coding unit 620b at the center location by determining the locations of the coding units 620a, 620b, and 620c based on information indicating locations of upper left samples 630a, 630b, and 630c of the coding units 620a, 620b, and 620c.

According to an embodiment, the information indicating the locations of the upper left samples 630a, 630b, and 630c, which are included in the coding units 620a, 620b, and 620c, respectively, may include information about locations or coordinates of the coding units 620a, 620b, and 620c in a picture. According to an embodiment, the information indicating the locations of the upper left samples 630a, 630b, and 630c, which are included in the coding units 620a, 620b, and 620c, respectively, may include information indicating widths or heights of the coding units 620a, 620b, and 620c included in the current coding unit 600, and the widths or heights may correspond to information indicating differences between the coordinates of the coding units 620a, 620b, and 620c in the picture. That is, the image decoding apparatus 100 may determine the coding unit 620b at the center location by directly using the information about the locations or coordinates of the coding units 620a, 620b, and 620c in the picture, or by using the information about the widths or heights of the coding units, which correspond to the difference values between the coordinates.

According to an embodiment, information indicating the location of the upper left sample 630a of the upper coding unit 620a may include coordinates (xa, ya), information indicating the location of the upper left sample 630b of the middle coding unit 620b may include coordinates (xb, yb), and information indicating the location of the upper left sample 630c of the lower coding unit 620c may include coordinates (xc, yc). The image decoding apparatus 100 may determine the middle coding unit 620b by using the coordinates of the upper left samples 630a, 630b, and 630c which are included in the coding units 620a, 620b, and 620c, respectively. For example, when the coordinates of the upper left samples 630a, 630b, and 630c are sorted in an ascending or descending order, the coding unit 620b including the coordinates (xb, yb) of the sample 630b at a center location may be determined as a coding unit at a center location from among the coding units 620a, 620b, and 620c determined by splitting the current coding unit 600. However, the coordinates indicating the locations of the upper left samples 630a, 630b, and 630c may include coordinates indicating absolute locations in the picture, or may use coordinates (dxb, dyb) indicating a relative location of the upper left sample 630b of the middle coding unit 620b and coordinates (dxc, dyc) indicating a relative location of the upper left sample 630c of the lower coding unit 620c with reference to the location of the upper left sample 630a of the upper coding unit 620a. A method of determining a coding unit at a certain location by using coordinates of a sample included in the coding unit, as information indicating a location of the sample, is not limited to the above-described method, and may include various arithmetic methods capable of using the coordinates of the sample.

According to an embodiment, the image decoding apparatus 100 may split the current coding unit 600 into a plurality of coding units 620a, 620b, and 620c, and may select one of the coding units 620a, 620b, and 620c based on a certain criterion. For example, the image decoding apparatus 100 may select the coding unit 620b, which has a size different from that of the others, from among the coding units 620a, 620b, and 620c.

According to an embodiment, the image decoding apparatus 100 may determine the width or height of each of the coding units 620a, 620b, and 620c by using the coordinates (xa, ya) that is the information indicating the location of the upper left sample 630a of the upper coding unit 620a, the coordinates (xb, yb) that is the information indicating the location of the upper left sample 630b of the middle coding unit 620b, and the coordinates (xc, yc) that is the information indicating the location of the upper left sample 630c of the lower coding unit 620c. The image decoding apparatus 100 may determine the respective sizes of the coding units 620a, 620b, and 620c by using the coordinates (xa, ya), (xb, yb), and (xc, yc) indicating the locations of the coding units 620a, 620b, and 620c. According to an embodiment, the image decoding apparatus 100 may determine the width of the upper coding unit 620a to be the width of the current coding unit 600. The image decoding apparatus 100 may determine the height of the upper coding unit 620a to be yb-ya. According to an embodiment, the image decoding apparatus 100 may determine the width of the middle coding unit 620b to be the width of the current coding unit 600. The image decoding apparatus 100 may determine the height of the middle coding unit 620b to be yc-yb. According to an embodiment, the image decoding apparatus 100 may determine the width or height of the lower coding unit 620c by using the width or height of the current coding unit 600 or the widths or heights of the upper coding unit 620a and middle coding unit 620b. The image decoding apparatus 100 may determine a coding unit, which has a size different from that of the other coding units, based on the determined widths and heights of the coding units 620a to 620c. Referring to FIG. 6, the image decoding apparatus 100 may determine the middle coding unit 620b, which has a size different from the size of the upper coding unit 620a and lower coding unit 620c, as the coding unit of the certain location. However, the above-described method, performed by the image decoding apparatus 100, of determining a coding unit having a size different from the size of the other coding units merely corresponds to an example of determining a coding unit at a certain location by using the sizes of coding units, which are determined based on coordinates of samples, and thus various methods of determining a coding unit at a certain location by comparing the sizes of coding units, which are determined based on coordinates of certain samples, may be used.

The image decoding apparatus 100 may determine the width or height of each of the coding units 660a, 660b, and 660c by using the coordinates (xd, yd) that is information indicating the location of a upper left sample 670a of the left coding unit 660a, the coordinates (xe, ye) that is information indicating the location of a upper left sample 670b of the middle coding unit 660b, and the coordinates (xf, yf) that is information indicating a location of the upper left sample 670c of the right coding unit 660c. The image decoding apparatus 100 may determine the respective sizes of the coding units 660a, 660b, and 660c by using the coordinates (xd, yd), (xe, ye), and (xf, yf) indicating the locations of the coding units 660a, 660b, and 660c.

According to an embodiment, the image decoding apparatus 100 may determine the width of the left coding unit 660a to be xe-xd. The image decoding apparatus 100 may determine the height of the left coding unit 660a to be the height of the current coding unit 650. According to an embodiment, the image decoding apparatus 100 may determine the width of the middle coding unit 660b to be xf-xe. The image decoding apparatus 100 may determine the height of the middle coding unit 660b to be the height of the current coding unit 650. According to an embodiment, the image decoding apparatus 100 may determine the width or height of the right coding unit 660c by using the width or height of the current coding unit 650 or the widths or heights of the left coding unit 660a and middle coding unit 660b. The image decoding apparatus 100 may determine a coding unit, which has a size different from that of the other coding units, based on the determined widths and heights of the coding units 660a to 660c. Referring to FIG. 6, the image decoding apparatus 100 may determine the middle coding unit 660b, which has a size different from the sizes of the left coding unit 660a and right coding unit 660c, as the coding unit of the certain location. However, the above-described method, performed by the image decoding apparatus 100, of determining a coding unit having a size different from the size of the other coding units merely corresponds to an example of determining a coding unit at a certain location by using the sizes of coding units, which are determined based on coordinates of samples, and thus various methods of determining a coding unit at a certain location by comparing the sizes of coding units, which are determined based on coordinates of certain samples, may be used.

However, locations of samples considered to determine locations of coding units are not limited to the above-described upper left locations, and information about arbitrary locations of samples included in the coding units may be used.

According to an embodiment, the image decoding apparatus 100 may select a coding unit at a certain location from among an odd number of coding units determined by splitting the current coding unit, by considering the shape of the current coding unit. For example, when the current coding unit has a non-square shape, a width of which is longer than a height, the image decoding apparatus 100 may determine the coding unit at the certain location in a horizontal direction. That is, the image decoding apparatus 100 may determine one of coding units at different locations in a horizontal direction and put a restriction on the coding unit. When the current coding unit has a non-square shape, a height of which is longer than a width, the image decoding apparatus 100 may determine the coding unit at the certain location in a vertical direction. That is, the image decoding apparatus 100 may determine one of coding units at different locations in a vertical direction and may put a restriction on the coding unit.

According to an embodiment, the image decoding apparatus 100 may use information indicating respective locations of an even number of coding units, to determine the coding unit at the certain location from among the even number of coding units. The image decoding apparatus 100 may determine an even number of coding units by splitting (for example binary splitting) the current coding unit and may determine the coding unit at the certain location by using the information about the locations of the even number of coding units. An operation related thereto may correspond to the operation of determining a coding unit at a certain location (for example a center location) from among an odd number of coding units, which has been described in detail above in relation to FIG. 6, and thus detailed descriptions thereof are not provided here.

According to an embodiment, when a non-square current coding unit is split into a plurality of coding units, certain information about a coding unit at a certain location may be used in a splitting operation to determine the coding unit at the certain location from among the plurality of coding units. For example, the image decoding apparatus 100 may use at least one of block shape information and split shape mode information, which is stored in a sample included in a middle coding unit, in a splitting operation to determine a coding unit at a center location from among the plurality of coding units determined by splitting the current coding unit.

Referring to FIG. 6, the image decoding apparatus 100 may split the current coding unit 600 into the plurality of coding units 620a, 620b, and 620c based on the split shape mode information, and may determine the coding unit 620b at a center location from among the plurality of the coding units 620a, 620b, and 620c. Furthermore, the image decoding apparatus 100 may determine the coding unit 620b at the center location, in consideration of a location from which the split shape mode information is obtained. That is, the split shape mode information of the current coding unit 600 may be obtained from the sample 640 at a center location of the current coding unit 600 and, when the current coding unit 600 is split into the plurality of coding units 620a, 620b, and 620c based on the split shape mode information, the coding unit 620b including the sample 640 may be determined as the coding unit at the center location. However, information used to determine the coding unit at the center location is not limited to the split shape mode information, and various types of information may be used to determine the coding unit at the center location.

According to an embodiment, certain information for identifying the coding unit at the certain location may be obtained from a certain sample included in a coding unit to be determined. Referring to FIG. 6, the image decoding apparatus 100 may use the split shape mode information, which is obtained from a sample at a certain location in the current coding unit 600 (for example a sample at a center location of the current coding unit 600) to determine a coding unit at a certain location from among the plurality of the coding units 620a, 620b, and 620c determined by splitting the current coding unit 600 (for example a coding unit at a center location from among a plurality of split coding units). That is, the image decoding apparatus 100 may determine the sample at the certain location by considering a block shape of the current coding unit 600, determine the coding unit 620b including a sample, from which certain information (for example the split shape mode information) may be obtained from among the plurality of coding units 620a, 620b, and 620c determined by splitting the current coding unit 600, and may put a certain restriction on the coding unit 620b. Referring to FIG. 6, according to an embodiment, the image decoding apparatus 100 may determine the sample 640 at the center location of the current coding unit 600 as the sample from which the certain information may be obtained and may put a certain restriction on the coding unit 620b including the sample 640, in a decoding operation. However, the location of the sample from which the certain information may be obtained is not limited to the above-described location and may include arbitrary locations of samples included in the coding unit 620b to be determined for a restriction.

According to an embodiment, the location of the sample from which the certain information may be obtained may be determined based on the shape of the current coding unit 600. According to an embodiment, the block shape information may indicate whether the current coding unit has a square or non-square shape, and the location of the sample from which the certain information may be obtained may be determined based on the shape. For example, the image decoding apparatus 100 may determine a sample located on a boundary for splitting at least one of a width and a height of the current coding unit in half, as the sample from which the certain information may be obtained, by using at least one of information about the width of the current coding unit and information about the height of the current coding unit. As another example, when the block shape information of the current coding unit indicates a non-square shape, the image decoding apparatus 100 may determine one of samples including a boundary for splitting a long side of the current coding unit in half, as the sample from which the predetermined information may be obtained.

According to an embodiment, when the current coding unit is split into a plurality of coding units, the image decoding apparatus 100 may use the split shape mode information to determine a coding unit at a certain location from among the plurality of coding units. According to an embodiment, the image decoding apparatus 100 may obtain the split shape mode information from a sample at a certain location in a coding unit, and split the plurality of coding units, which are generated by splitting the current coding unit, by using the split shape mode information, which is obtained from the sample of the certain location in each of the plurality of coding units. That is, a coding unit may be recursively split based on the split shape mode information, which is obtained from the sample at the certain location in each coding unit. An operation of recursively splitting a coding unit has been described above in relation to FIG. 5, and thus detailed descriptions thereof will not be provided here.

According to an embodiment, the image decoding apparatus 100 may determine one or more coding units by splitting the current coding unit and may determine an order of decoding the one or more coding units, based on a certain block (for example the current coding unit).

Figure 7:
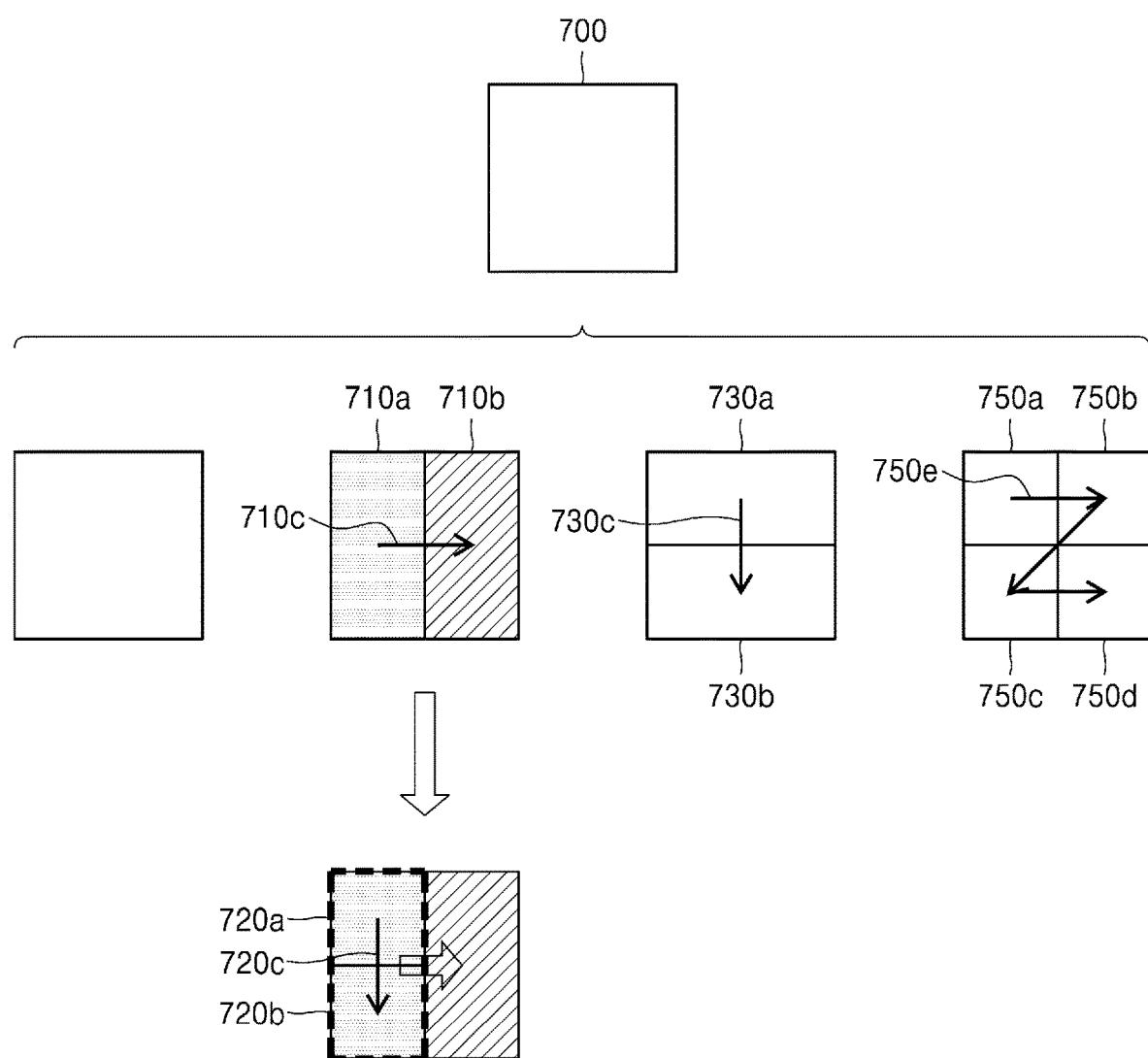
FIG. 7 illustrates an order of processing a plurality of coding units when an image decoding apparatus determines the plurality of coding units by splitting a current coding unit, according to an embodiment.

FIG. 7 illustrates an order of processing a plurality of coding units when an image decoding apparatus determines the plurality of coding units by splitting a current coding unit, according to an embodiment.

According to an embodiment, the image decoding apparatus 100 may determine second coding units 710a and 710b by splitting a first coding unit 700 in a vertical direction, determine second coding units 730*a* and 730*b* by splitting the first coding unit 700 in a horizontal direction, or determine second coding units 750*a* to 750*d* by splitting the first coding unit 700 in vertical and horizontal directions, based on split shape mode information.

Referring to FIG. 7, the image decoding apparatus 100 may determine to process the second coding units 710*a* and 710*b*, which are determined by splitting the first coding unit 700 in a vertical direction, in a horizontal direction order 710*c*. The image decoding apparatus 100 may determine to process the second coding units 730*a* and 730*b*, which are determined by splitting the first coding unit 700 in a horizontal direction, in a vertical direction order 730*c*. The image decoding apparatus 100 may determine to process the second coding units 750*a* to 750*d*, which are determined by splitting the first coding unit 700 in vertical and horizontal directions, in a certain order for processing coding units in a row and then processing coding units in a next row (for example in a raster scan order or Z-scan order 750*e*).

According to an embodiment, the image decoding apparatus 100 may recursively split coding units. Referring to FIG. 7, the image decoding apparatus 100 may determine the plurality of coding units 710*a* and 710*b*, 730*a* and 730*b*, or 750*a* to 750*d* by splitting the first coding unit 700, and recursively split each of the determined plurality of coding units 710*a* and 710*b*, 730*a* and 730*b*, or 750*a* to 750*d*. A splitting method of the plurality of coding units 710*a* and 710*b*, 730*a* and 730*b*, or 750*a* to 750*d* may correspond to a splitting method of the first coding unit 700. As such, each of the plurality of coding units 710*a* and 710*b*, 730*a* and 730*b*, or 750*a* to 750*d* may be independently split into a plurality of coding units. Referring to FIG. 7, the image decoding apparatus 100 may determine the second coding units 710*a* and 710*b* by splitting the first coding unit 700 in a vertical direction and may determine to independently split or not to split each of the second coding units 710*a* and 710*b*.

According to an embodiment, the image decoding apparatus 100 may determine third coding units 720*a* and 720*b* by splitting the left second coding unit 710*a* in a horizontal direction and may not split the right second coding unit 710*b*.

According to an embodiment, a processing order of coding units may be determined based on an operation of splitting a coding unit. In other words, a processing order of split coding units may be determined based on a processing order of coding units immediately before being split. The image decoding apparatus 100 may determine a processing order of the third coding units 720*a* and 720*b* determined by splitting the left second coding unit 710*a*, independently of the right second coding unit 710*b*. Because the third coding units 720*a* and 720*b* are determined by splitting the left second coding unit 710*a* in a horizontal direction, the third coding units 720*a* and 720*b* may be processed in a vertical direction order 720*c*. Because the left and right second coding units 710*a* and 710*b* are processed in the horizontal direction order 710*c*, the right second coding unit 710*b* may be processed after the third coding units 720*a* and 720*b* included in the left second coding unit 710*a* are processed in the vertical direction order 720*c*. An operation of determining a processing order of coding units based on a coding unit before being split is not limited to the above-described example, and various methods may be used to independently process coding units, which are split and determined to various shapes, in a certain order.

Figure 8:
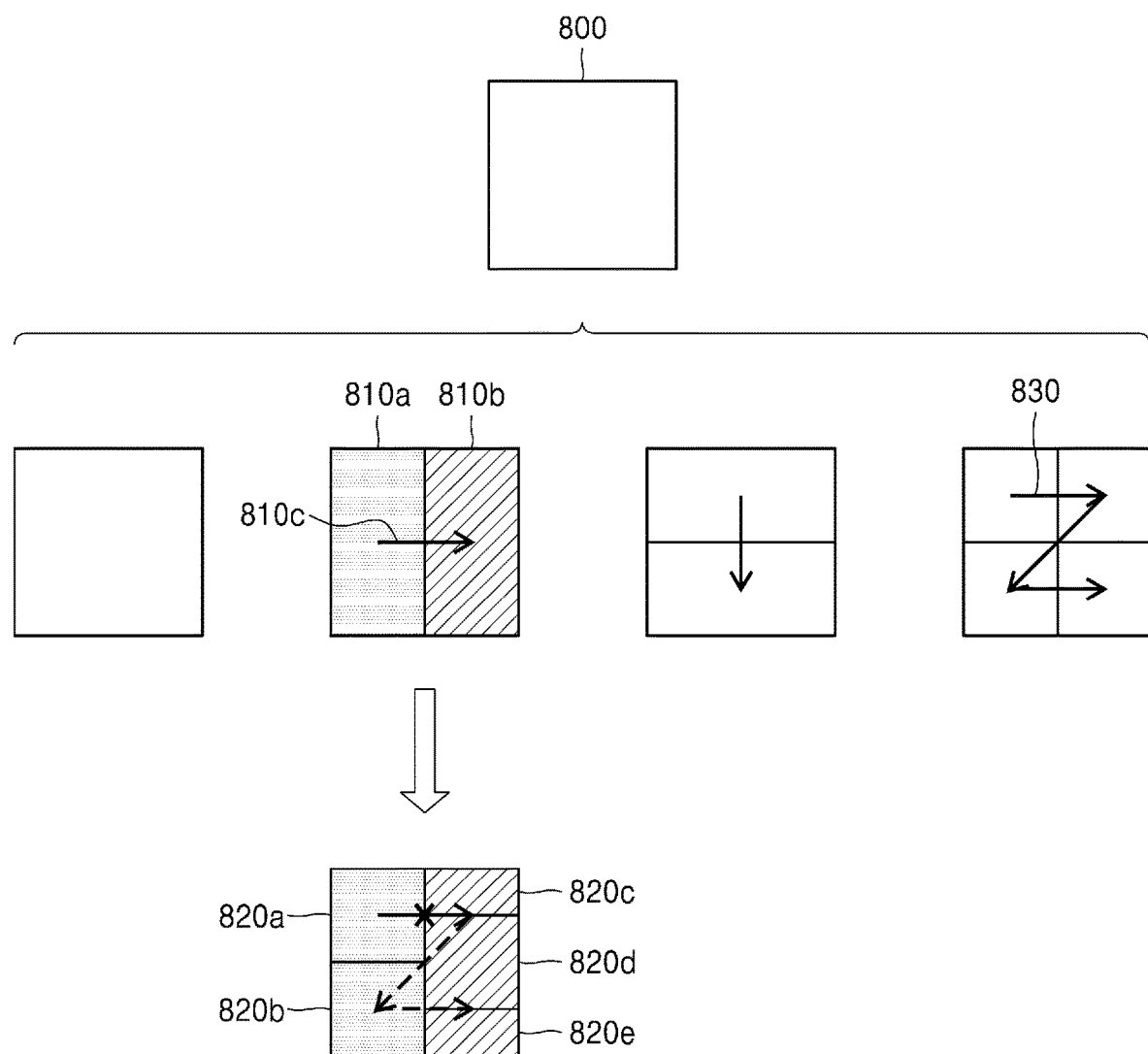
FIG. 8 illustrates a process, performed by an image decoding apparatus, of determining that a current coding unit is to be split into an odd number of coding units, when the coding units are not processable in a certain order, according to an embodiment.

FIG. 8 illustrates a process, performed by an image decoding apparatus, of determining that a current coding unit is to be split into an odd number of coding units, when the coding units are not processable in a certain order, according to an embodiment.

According to an embodiment, the image decoding apparatus 100 may determine that the current coding unit is split into an odd number of coding units, based on obtained split shape mode information. Referring to FIG. 8, a square first coding unit 800 may be split into non-square second coding units 810*a* and 810*b*, and the second coding units 810*a* and 810*b* may be independently split into third coding units 820*a* and 820*b*, and 820*c* to 820*e*. According to an embodiment, the image decoding apparatus 100 may determine the plurality of third coding units 820*a* and 820*b* by splitting the left second coding unit 810*a* in a horizontal direction and may split the right second coding unit 810*b* into the odd number of third coding units 820*c* to 820*e*.

According to an embodiment, the image decoding apparatus 100 may determine whether any coding unit is split into an odd number of coding units, by determining whether the third coding units 820*a* and 820*b*, and 820*c* to 820*e* are processable in a certain order. Referring to FIG. 8, the image decoding apparatus 100 may determine the third coding units 820*a* and 820*b*, and 820*c* to 820*e* by recursively splitting the first coding unit 800. The image decoding apparatus 100 may determine whether any of the first coding unit 800, the second coding units 810*a* and 810*b*, and the third coding units 820*a* and 820*b*, and 820*c* to 820*e* are split into an odd number of coding units, based on at least one of the block shape information and the split shape mode information. For example, the right second coding unit 810*b* among the second coding units 810*a* and 810*b* may be split into an odd number of third coding units 820*c*, 820*d*, and 820*e*. A processing order of a plurality of coding units included in the first coding unit 800 may be a certain order (for example a Z-scan order 830), and the image decoding apparatus 100 may determine whether the third coding units 820*c*, 820*d*, and 820*e*, which are determined by splitting the right second coding unit 810*b* into an odd number of coding units, satisfy a condition for processing in the certain order.

According to an embodiment, the image decoding apparatus 100 may determine whether the third coding units 820*a* and 820*b*, and 820*c* to 820*e* included in the first coding unit 800 satisfy the condition for processing in the certain order, and the condition may relate to whether at least one of a width and a height of the second coding units 810*a* and 810*b* is split in half along a boundary of the third coding units 820*a* and 820*b*, and 820*c* to 820*e*. For example, the third coding units 820*a* and 820*b* determined when the height of the left second coding unit 810*a* of the non-square shape is split in half may satisfy the condition. It may be determined that the third coding units 820*c* to 820*e* do not satisfy the condition because the boundaries of the third coding units 820*c* to 820*e* determined when the right second coding unit 810*b* is split into three coding units are unable to split the width or height of the right second coding unit 810*b* in half. When the condition is not satisfied as described above, the image decoding apparatus 100 may determine disconnection of a scan order and may determine that the right second coding unit 810*b* is split into an odd number of coding units, based on a result of the determination. According to an embodiment, when a coding unit is split into an odd number of coding units, the image decoding apparatus 100 may put a certain restriction on a coding unit at a certain location from among the split coding units. The restriction or the certain location has been described above in relation to various embodiments, and thus detailed descriptions thereof will not be provided herein.

Figure 9:
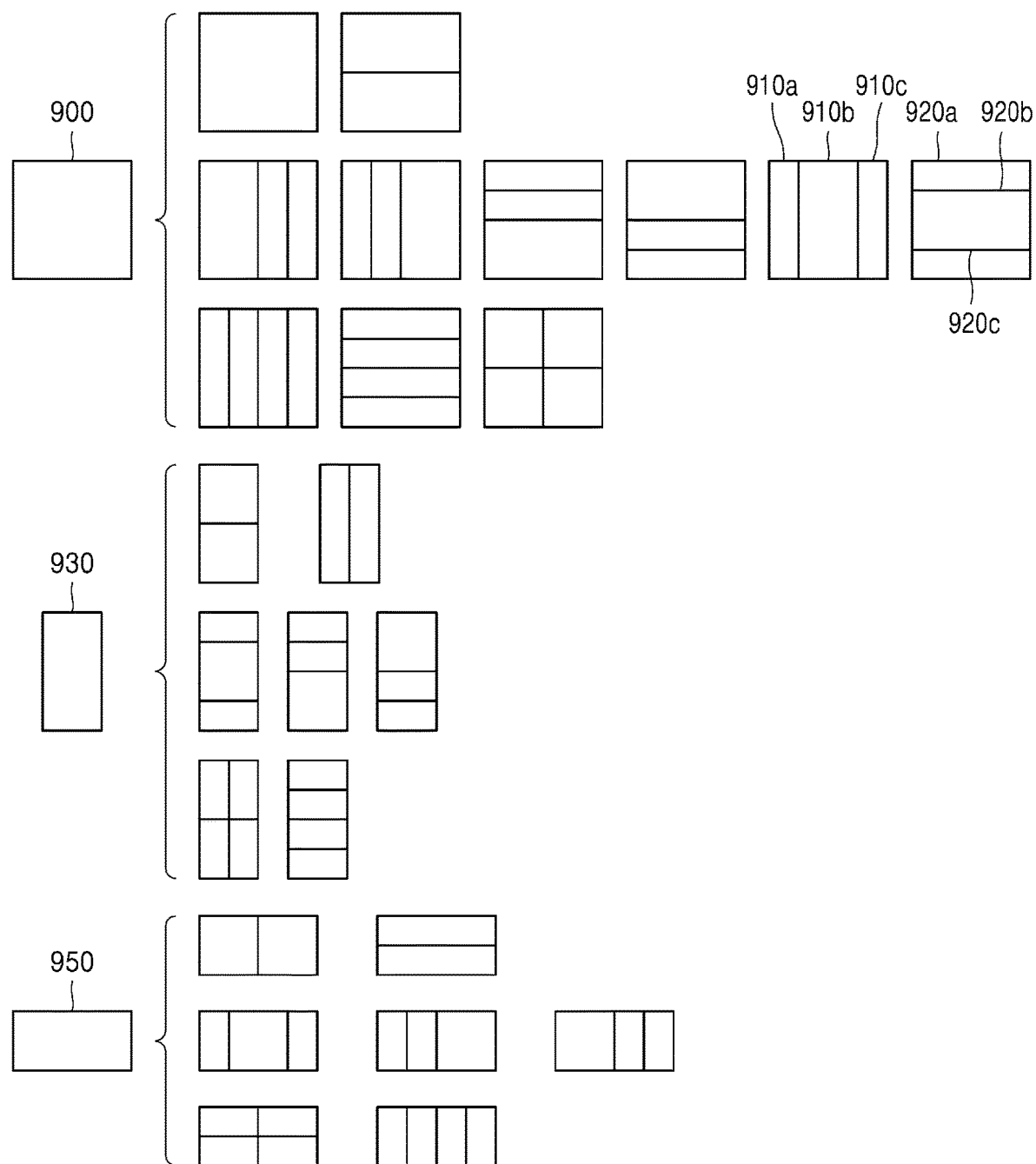
FIG. 9 illustrates a process, performed by an image decoding apparatus, of determining at least one coding unit by splitting a first coding unit, according to an embodiment.

FIG. 9 illustrates a process, performed by an image decoding apparatus, of determining at least one coding unit by splitting a first coding unit, according to an embodiment.

According to an embodiment, the image decoding apparatus 100 may split the first coding unit 900, based on split shape mode information, which is obtained through the receiver 110. The square first coding unit 900 may be split into four square coding units or may be split into a plurality of non-square coding units. For example, referring to FIG. 9, when the split shape mode information indicates to split the first coding unit 900 into non-square coding units, the image decoding apparatus 100 may split the first coding unit 900 into a plurality of non-square coding units. In detail, when the split shape mode information indicates to determine an odd number of coding units by splitting the first coding unit 900 in a horizontal direction or a vertical direction, the image decoding apparatus 100 may split the square first coding unit 900 into an odd number of coding units, for example second coding units 910a, 910b, and 910c determined by splitting the square first coding unit 900 in a vertical direction or second coding units 920a, 920b, and 920c determined by splitting the square first coding unit 900 in a horizontal direction.

According to an embodiment, the image decoding apparatus 100 may determine whether the second coding units 910a, 910b, 910c, 920a, 920b, and 920c included in the first coding unit 900 satisfy a condition for processing in a certain order, and the condition relates to whether at least one of a width and a height of the first coding unit 900 is split in half along a boundary of the second coding units 910a, 910b, 910c, 920a, 920b, and 920c. Referring to FIG. 9, because boundaries of the second coding units 910a, 910b, and 910c determined by splitting the square first coding unit 900 in a vertical direction do not split the width of the first coding unit 900 in half, it may be determined that the first coding unit 900 does not satisfy the condition for processing in the certain order. In addition, because boundaries of the second coding units 920a, 920b, and 920c determined by splitting the square first coding unit 900 in a horizontal direction do not split the height of the first coding unit 900 in half, it may be determined that the first coding unit 900 does not satisfy the condition for processing in the certain order. When the condition is not satisfied as described above, the image decoding apparatus 100 may decide disconnection of a scan order and may determine that the first coding unit 900 is split into an odd number of coding units, based on a result of the decision. According to an embodiment, when a coding unit is split into an odd number of coding units, the image decoding apparatus 100 may put a certain restriction on a coding unit at a certain location from among the split coding units. The restriction or the certain location has been described above in relation to various embodiments, and thus detailed descriptions thereof will not be provided herein.

According to an embodiment, the image decoding apparatus 100 may determine various-shaped coding units by splitting a first coding unit.

Referring to FIG. 9, the image decoding apparatus 100 may split the square first coding unit 900 or a non-square first coding unit 930 or 950 into various-shaped coding units.

Figure 10:
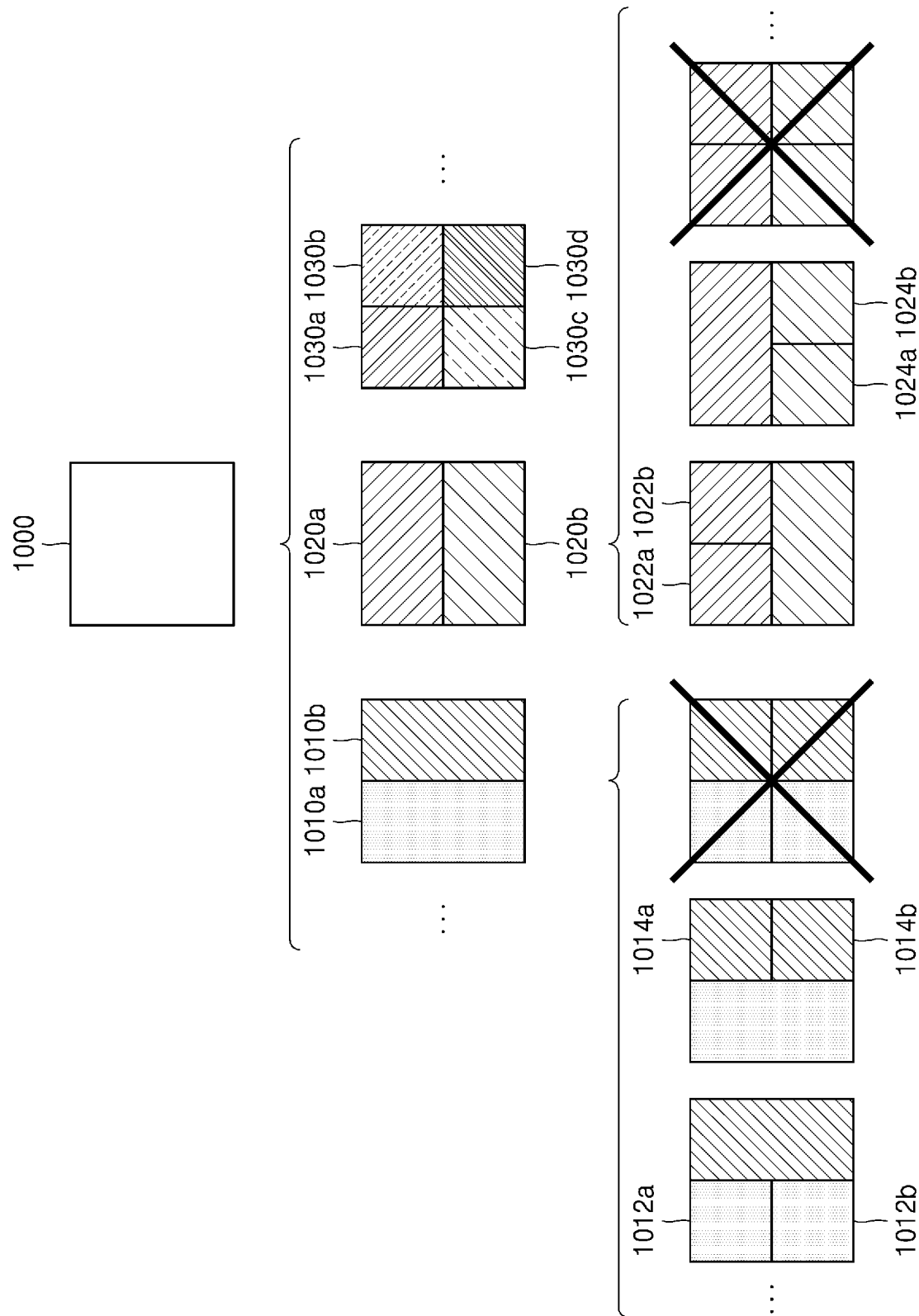
FIG. 10 illustrates that a shape into which a second coding unit is splittable is restricted when the second coding unit having a non-square shape, which is determined when an image decoding apparatus splits a first coding unit, satisfies a certain condition, according to an embodiment.

FIG. 10 illustrates that a shape into which a second coding unit is splittable is restricted when the second coding unit having a non-square shape, which is determined when an image decoding apparatus splits a first coding unit, satisfies a certain condition, according to an embodiment.

According to an embodiment, the image decoding apparatus 100 may determine to split the square first coding unit 1000 into non-square second coding units 1010a, and 1010b or 1020a and 1020b, based on split shape mode information, which is obtained by the receiver 110. The second coding units 1010a and 1010b or 1020a and 1020b may be independently split. As such, the image decoding apparatus 100 may determine to split or not to split each of the second coding units 1010a and 1010b or 1020a and 1020b into a plurality of coding units, based on the split shape mode information of each of the second coding units 1010a and 1010b or 1020a and 1020b. According to an embodiment, the image decoding apparatus 100 may determine third coding units 1012a and 1012b by splitting the non-square left second coding unit 1010a, which is determined by splitting the first coding unit 1000 in a vertical direction, in a horizontal direction. However, when the left second coding unit 1010a is split in a horizontal direction, the image decoding apparatus 100 may restrict the right second coding unit 1010b not to be split in a horizontal direction in which the left second coding unit 1010a is split. When third coding units 1014a and 1014b are determined by splitting the right second coding unit 1010b in a same direction, because the left and right second coding units 1010a and 1010b are independently split in a horizontal direction, the third coding units 1012a and 1012b or 1014a and 1014b may be determined. However, this case serves equally as a case in which the image decoding apparatus 100 splits the first coding unit 1000 into four square second coding units 1030a, 1030b, 1030c, and 1030d, based on the split shape mode information, and may be inefficient in terms of image decoding.

According to an embodiment, the image decoding apparatus 100 may determine third coding units 1022a and 1022b or 1024a and 1024b by splitting the non-square second coding unit 1020a or 1020b, which is determined by splitting the first coding unit 1000 in a horizontal direction, in a vertical direction. However, when a second coding unit (for example the upper second coding unit 1020a) is split in a vertical direction, for the above-described reason, the image decoding apparatus 100 may restrict the other second coding unit (for example the lower second coding unit 1020b) not to be split in a vertical direction in which the upper second coding unit 1020a is split.

Figure 11:
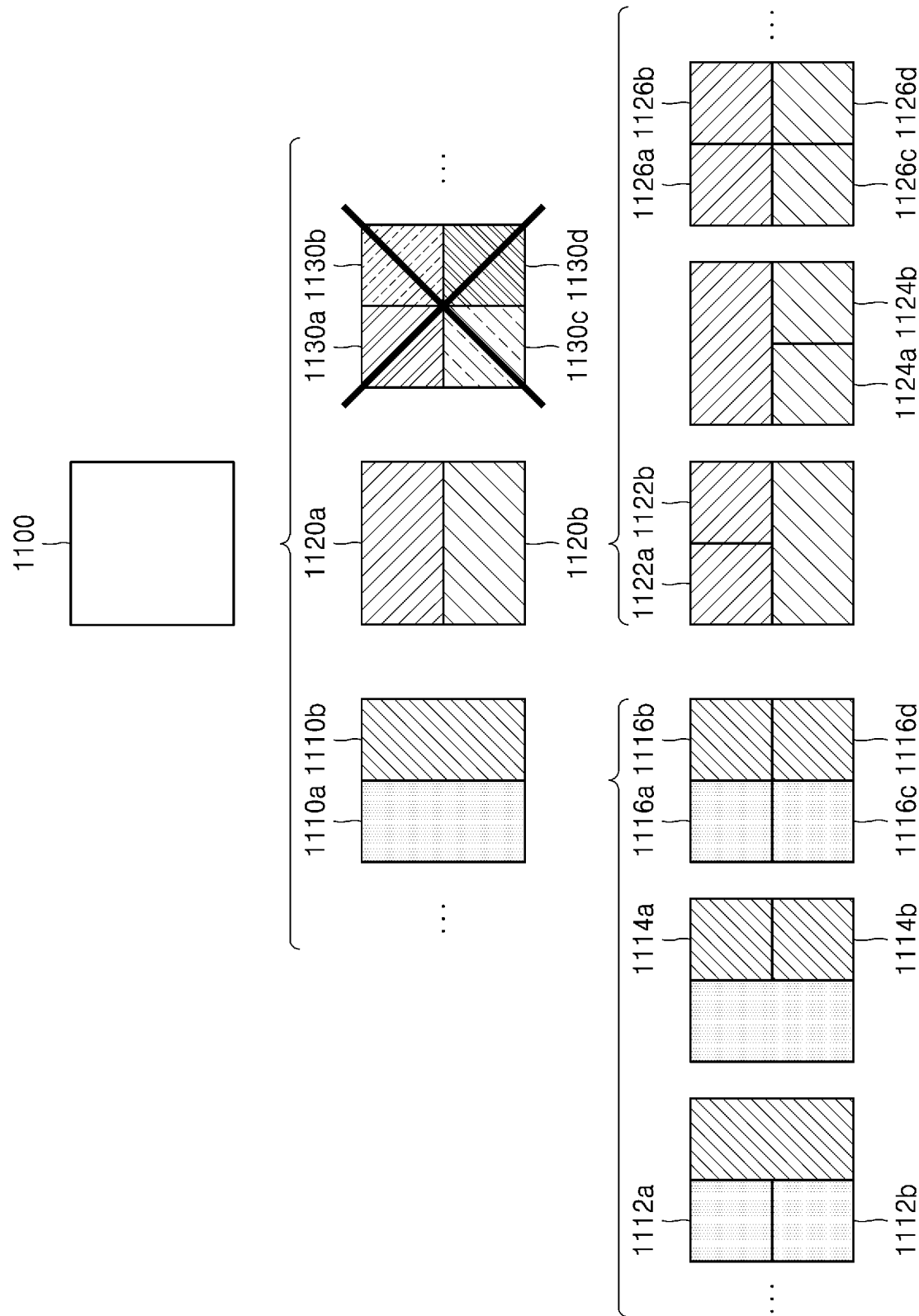
FIG. 11 illustrates a process, performed by an image decoding apparatus, of splitting a square coding unit when split shape mode information is unable to indicate that the square coding unit is split into four square coding units, according to an embodiment.

FIG. 11 illustrates a process, performed by an image decoding apparatus, of splitting a square coding unit when split shape mode information is unable to indicate that the square coding unit is split into four square coding units, according to an embodiment.

According to an embodiment, the image decoding apparatus 100 may determine second coding units 1110a and 1110b or 1120a and 1120b, etc. by splitting a first coding unit 1100, based on split shape mode information. The split shape mode information may include information about various methods of splitting a coding unit, but the information about various splitting methods may not include information for splitting a coding unit into four square coding units. According to such split shape mode information, the image decoding apparatus 100 may not split the square first coding unit 1100 into four square second coding units 1130a, 1130b, 1130c, and 1130d. The image decoding apparatus 100 may determine the non-square second coding units 1110a and 1110b or 1120a and 1120b, etc., based on the split shape mode information.

According to an embodiment, the image decoding apparatus 100 may independently split the non-square second coding units 1110a and 1110b or 1120a and 1120b, etc. Each of the second coding units 1110a and 1110b or 1120a and 1120b, etc. may be recursively split in a certain order, and this splitting method may correspond to a method of splitting the first coding unit 1100, based on the split shape mode information.

For example, the image decoding apparatus 100 may determine square third coding units 1112a and 1112b by splitting the left second coding unit 1110a in a horizontal direction and may determine square third coding units 1114a and 1114b by splitting the right second coding unit 1110b in a horizontal direction. Furthermore, the image decoding apparatus 100 may determine square third coding units 1116a, 1116b, 1116c, and 1116d by splitting both of the left and right second coding units 1110a and 1110b in a horizontal direction. In this case, coding units having the same shape as the four square second coding units 1130a, 1130b, 1130c, and 1130d split from the first coding unit 1100, which the split shape mode information may be unable to directly indicate, may be determined.

As another example, the image decoding apparatus 100 may determine square third coding units 1122a and 1122b by splitting the upper second coding unit 1120a in a vertical direction and may determine square third coding units 1124a and 1124b by splitting the lower second coding unit 1120b in a vertical direction. Furthermore, the image decoding apparatus 100 may determine square third coding units 1126a, 1126b, 1126c, and 1126d by splitting both of the upper and lower second coding units 1120a and 1120b in a vertical direction. In this case, coding units having the same shape as the four square second coding units 1130a, 1130b, 1130c, and 1130d split from the first coding unit 1100, which the split shape mode information may be unable to directly indicate, may be determined.

Figure 12:
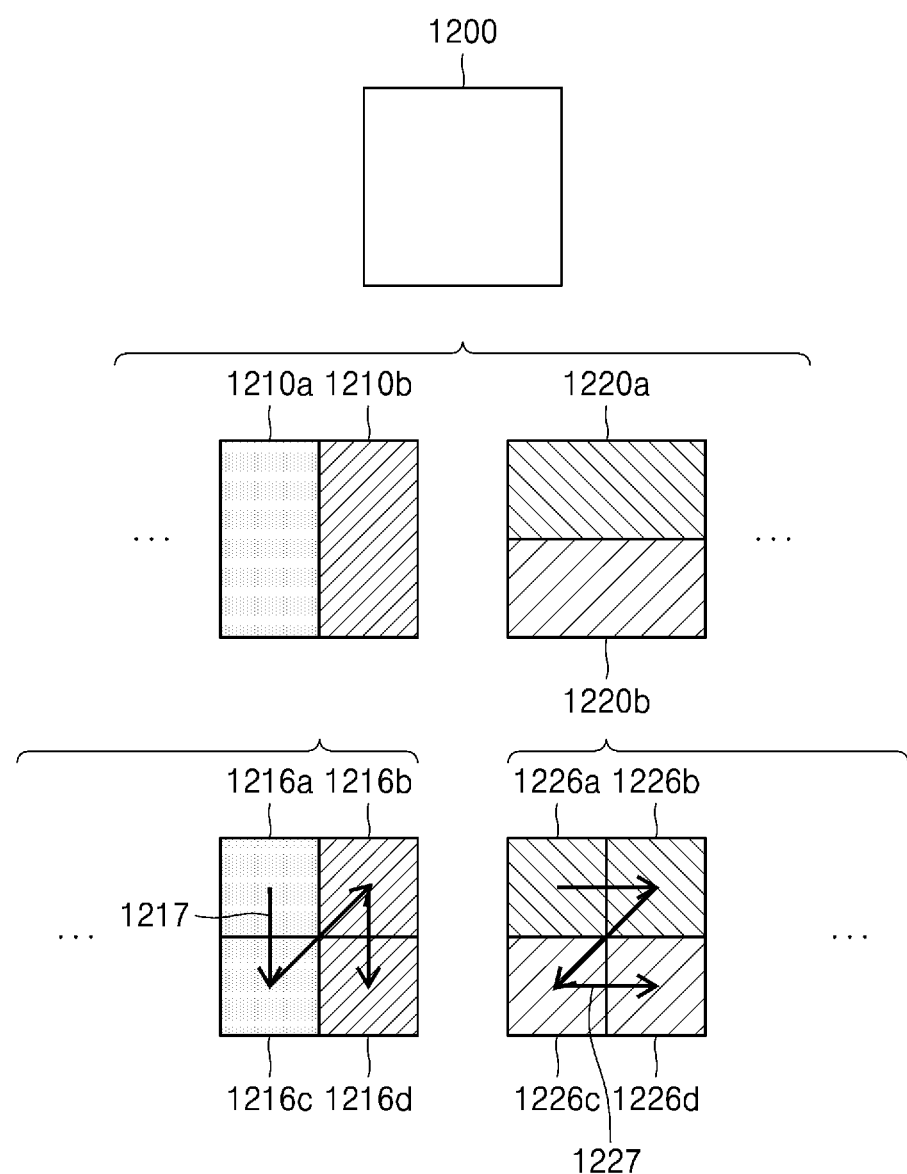
FIG. 12 illustrates that a processing order between a plurality of coding units may be changed depending on a process of splitting a coding unit, according to an embodiment.

FIG. 12 illustrates that a processing order between a plurality of coding units may be changed depending on a process of splitting a coding unit, according to an embodiment.

According to an embodiment, the image decoding apparatus 100 may split a first coding unit 1200, based on split shape mode information. When a block shape indicates a square shape and the split shape mode information indicates to split the first coding unit 1200 in at least one of horizontal and vertical directions, the image decoding apparatus 100 may determine second coding units 1210a and 1210b or 1220a and 1220b, etc. by splitting the first coding unit 1200. Referring to FIG. 12, the non-square second coding units 1210a and 1210b determined by splitting the first coding unit 1200 in vertical direction, or 1220a and 1220b determined by splitting the first coding unit 1200 in a horizontal direction, may be independently split based on the split shape mode information of each coding unit. For example, the image decoding apparatus 100 may determine third coding units 1216a, 1216b, 1216c, and 1216d by splitting the second coding units 1210a and 1210b in a horizontal direction, and may determine third coding units 1226a, 1226b, 1226c, and 1226d by splitting the second coding units 1220a and 1220b in a vertical direction. An operation of splitting the second coding units 1210a and 1210b or 1220a and 1220b has been described above in relation to FIG. 11, and thus detailed descriptions thereof will not be provided herein.

According to an embodiment, the image decoding apparatus 100 may process coding units in a certain order. An operation of processing coding units in a certain order has been described above in relation to FIG. 7, and thus detailed descriptions thereof will not be provided herein. Referring to FIG. 12, the image decoding apparatus 100 may determine four square third coding units 1216a, 1216b, 1216c, and 1216d, or 1226a, 1226b, 1226c, and 1226d by splitting the square first coding unit 1200. According to an embodiment, the image decoding apparatus 100 may determine processing orders of the third coding units 1216a, 1216b, 1216c, and 1216d, and 1226a, 1226b, 1226c, and 1226d based on a splitting method of the first coding unit 1200.

According to an embodiment, the image decoding apparatus 100 may determine the third coding units 1216a, 1216b, 1216c, and 1216d by splitting the second coding units 1210a and 1210b generated by splitting the first coding unit 1200 in a vertical direction, in a horizontal direction, and may process the third coding units 1216a, 1216b, 1216c, and 1216d in a processing order 1217 for initially processing the third coding units 1216a and 1216c, which are included in the left second coding unit 1210a, in a vertical direction and then processing the third coding unit 1216b and 1216d, which are included in the right second coding unit 1210b, in a vertical direction.

According to an embodiment, the image decoding apparatus 100 may determine the third coding units 1226a, 1226b, 1226c, and 1226d by splitting the second coding units 1220a and 1220b generated by splitting the first coding unit 1200 in a horizontal direction, in a vertical direction, and may process the third coding units 1226a, 1226b, 1226c, and 1226d in a processing order 1227 for initially processing the third coding units 1226a and 1226b, which are included in the upper second coding unit 1220a, in a horizontal direction and then processing the third coding unit 1226c and 1226d, which are included in the lower second coding unit 1220b, in a horizontal direction.

Referring to FIG. 12, the square third coding units 1216a, 1216b, 1216c, and 1216d, and 1226a, 1226b, 1226c, and 1226d may be determined by splitting the second coding units 1210a and 1210b, and 1220a and 1220b, respectively. Although the second coding units 1210a and 1210b are determined by splitting the first coding unit 1200 in a vertical direction differently from the second coding units 1220a and 1220b which are determined by splitting the first coding unit 1200 in a horizontal direction, the third coding units 1216a, 1216b, 1216c, and 1216d, and 1226a, 1226b, 1226c, and 1226d split therefrom eventually show same-shaped coding units split from the first coding unit 1200. As such, by recursively splitting a coding unit in different manners based on the split shape mode information, the image decoding apparatus 100 may process a plurality of coding units in different orders even when the coding units are eventually determined to be the same shape.

FIG. 13 illustrates a process of determining a depth of a coding unit when a shape and size of the coding unit change, when the coding unit is recursively split such that a plurality of coding units are determined, according to an embodiment.

According to an embodiment, the image decoding apparatus 100 may determine the depth of the coding unit, based on a certain criterion. For example, the certain criterion may be the length of a long side of the coding unit. When the length of a long side of a coding unit before being split is 2n times (n>0) the length of a long side of a split current coding unit, the image decoding apparatus 100 may determine that a depth of the current coding unit is increased from a depth of the coding unit before being split, by n. In the following description, a coding unit having an increased depth is expressed as a coding unit of a lower depth.

Referring to FIG. 13, according to an embodiment, the image decoding apparatus 100 may determine a second coding unit 1302 and a third coding unit 1304 of lower depths by splitting a square first coding unit 1300 based on block shape information indicating a square shape (for example, the block shape information may be expressed as '0: SQUARE'). Assuming that the size of the square first coding unit 1300 is 2N×2N, the second coding unit 1302 determined by splitting a width and a height of the first coding unit 1300 in ½ may have a size of N×N. Furthermore, the third coding unit 1304 determined by splitting a width and a height of the second coding unit 1302 in ½ may have a size of N/2×N/2. In this case, a width and a height of the third coding unit 1304 are ¼ times those of the first coding unit 1300. When a depth of the first coding unit 1300 is D, a depth of the second coding unit 1302, the width and height of which are ½ times those of the first coding unit 1300, may be D+1, and a depth of the third coding unit 1304, the width and height of which are ¼ times those of the first coding unit 1300, may be D+2.

According to an embodiment, the image decoding apparatus 100 may determine a second coding unit 1312 or 1322 and a third coding unit 1314 or 1324 of lower depths by splitting a non-square first coding unit 1310 or 1320 based on block shape information indicating a non-square shape (for example, the block shape information may be expressed as '1: NS_VER' indicating a non-square shape, a height of which is longer than a width, or as '2: NS_HOR' indicating a non-square shape, a width of which is longer than a height).

The image decoding apparatus 100 may determine a second coding unit 1302, 1312, or 1322 by splitting at least one of a width and a height of the first coding unit 1310 having a size of N×2N. That is, the image decoding apparatus 100 may determine the second coding unit 1302 having a size of N×N or the second coding unit 1322 having a size of N×N/2 by splitting the first coding unit 1310 in a horizontal direction, or may determine the second coding unit 1312 having a size of N/2×N by splitting the first coding unit 1310 in horizontal and vertical directions.

According to an embodiment, the image decoding apparatus 100 may determine the second coding unit 1302, 1312, or 1322 by splitting at least one of a width and a height of the first coding unit 1320 having a size of 2N×N. That is, the image decoding apparatus 100 may determine the second coding unit 1302 having a size of N×N or the second coding unit 1312 having a size of N/2×N by splitting the first coding unit 1320 in a vertical direction, or may determine the second coding unit 1322 having a size of N×N/2 by splitting the first coding unit 1320 in horizontal and vertical directions.

According to an embodiment, the image decoding apparatus 100 may determine a third coding unit 1304, 1314, or 1324 by splitting at least one of a width and a height of the second coding unit 1302 having a size of N×N. That is, the image decoding apparatus 100 may determine the third coding unit 1304 having a size of N/2×N/2, the third coding unit 1314 having a size of N/4×N/2, or the third coding unit 1324 having a size of N/2×N/4 by splitting the second coding unit 1302 in vertical and horizontal directions.

According to an embodiment, the image decoding apparatus 100 may determine the third coding unit 1304, 1314, or 1324 by splitting at least one of a width and a height of the second coding unit 1312 having a size of N/2×N. That is, the image decoding apparatus 100 may determine the third coding unit 1304 having a size of N/2×N/2 or the third coding unit 1324 having a size of N/2×N/4 by splitting the second coding unit 1312 in a horizontal direction, or may determine the third coding unit 1314 having a size of N/4×N/2 by splitting the second coding unit 1312 in vertical and horizontal directions.

According to an embodiment, the image decoding apparatus 100 may determine the third coding unit 1304, 1314, or 1324 by splitting at least one of a width and a height of the second coding unit 1322 having a size of N×N/2. That is, the image decoding apparatus 100 may determine the third coding unit 1304 having a size of N/2×N/2 or the third coding unit 1314 having a size of N/4×N/2 by splitting the second coding unit 1322 in a vertical direction, or may determine the third coding unit 1324 having a size of N/2×N/4 by splitting the second coding unit 1322 in vertical and horizontal directions.

According to an embodiment, the image decoding apparatus 100 may split the square coding unit 1300, 1302, or 1304 in a horizontal or vertical direction. For example, the image decoding apparatus 100 may determine the first coding unit 1310 having a size of N×2N by splitting the first coding unit 1300 having a size of 2N×2N in a vertical direction, or may determine the first coding unit 1320 having a size of 2N×N by splitting the first coding unit 1300 in a horizontal direction. According to an embodiment, when a depth is determined based on the length of the longest side of a coding unit, a depth of a coding unit determined by splitting the first coding unit 1300 having a size of 2N×2N in a horizontal or vertical direction may be the same as the depth of the first coding unit 1300.

According to an embodiment, a width and a height of the third coding unit 1314 or 1324 may be ¼ times those of the first coding unit 1310 or 1320. When a depth of the first coding unit 1310 or 1320 is D, a depth of the second coding unit 1312 or 1322, the width and height of which are ½ times those of the first coding unit 1310 or 1320, may be D+1, and a depth of the third coding unit 1314 or 1324, the width and height of which are ¼ times those of the first coding unit 1310 or 1320, may be D+2.

Figure 14:
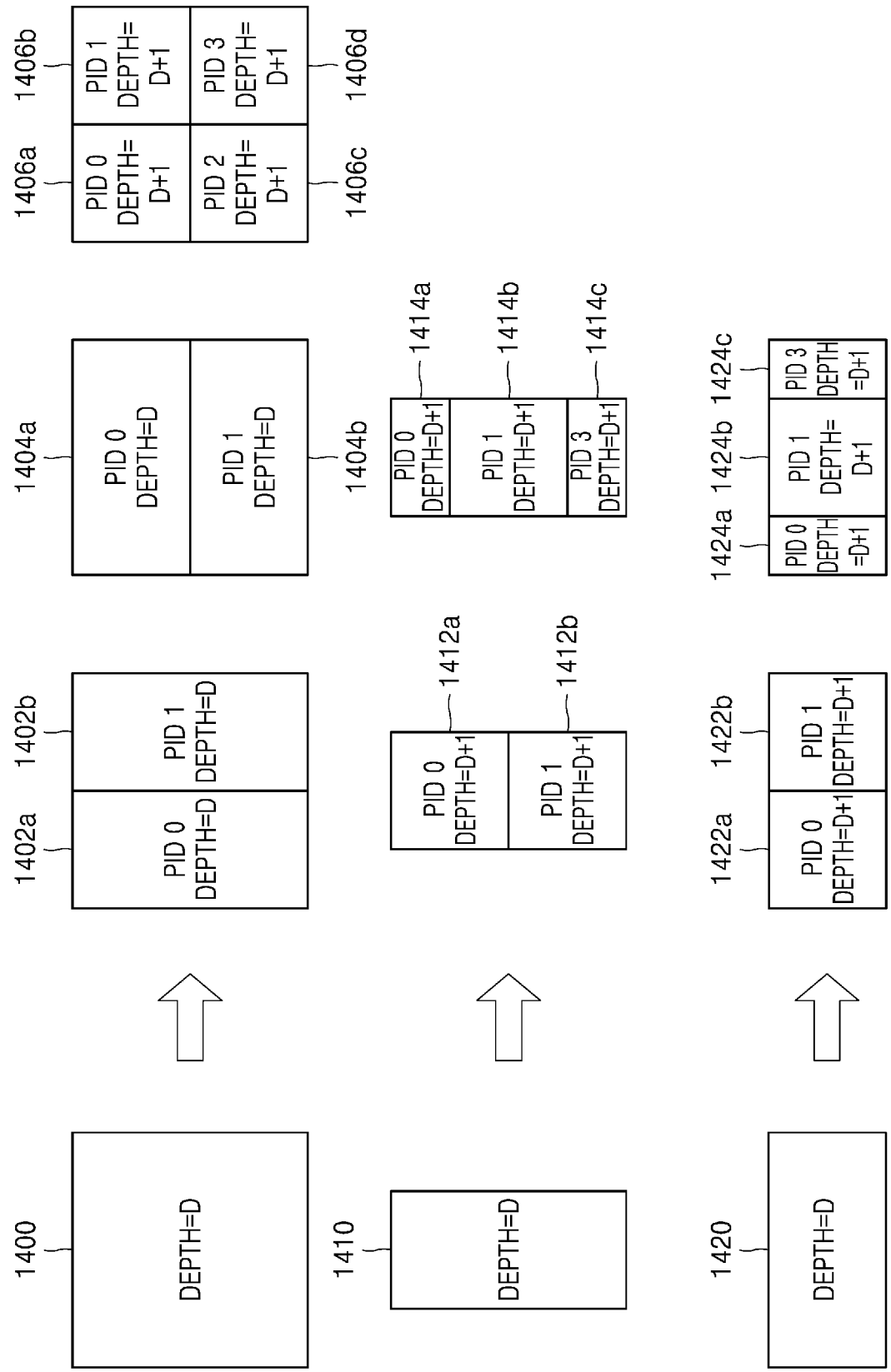
FIG. 14 illustrates depths that are determinable based on shapes and sizes of coding units, and part indexes (PIDs) that are for distinguishing the coding units, according to an embodiment.

FIG. 14 illustrates depths that are determinable based on shapes and sizes of coding units, and part indexes (PIDs) that are for distinguishing the coding units, according to an embodiment.

According to an embodiment, the image decoding apparatus 100 may determine various-shape second coding units by splitting a square first coding unit 1400. Referring to FIG. 14, the image decoding apparatus 100 may determine second coding units 1402a and 1402b, 1404a and 1404b, and 1406a, 1406b, 1406c, and 1406d by splitting the first coding unit 1400 in at least one of vertical and horizontal directions based on split shape mode information. That is, the image decoding apparatus 100 may determine the second coding units 1402a and 1402b, 1404a and 1404b, and 1406a, 1406b, 1406c, and 1406d, based on the split shape mode information of the first coding unit 1400.

According to an embodiment, a depth of the second coding units 1402a and 1402b, 1404a and 1404b, and 1406a, 1406b, 1406c, and 1406d, which are determined based on the split shape mode information of the square first coding unit 1400, may be determined based on the length of a long side thereof. For example, because the length of a side of the square first coding unit 1400 equals the length of a long side of the non-square second coding units 1402a and 1402b, and 1404a and 1404b, the first coding unit 1400 and the non-square second coding units 1402a and 1402b, and 1404a and 1404b may have the same depth, for example D. However, when the image decoding apparatus 100 splits the first coding unit 1400 into the four square second coding units 1406a, 1406b, 1406c, and 1406d based on the split shape mode information, because the length of a side of the square second coding units 1406a, 1406b, 1406c, and 1406d is ½ times the length of a side of the first coding unit 1400, a depth of the second coding units 1406a, 1406b, 1406c, and 1406d may be D+1 which is deeper than the depth D of the first coding unit 1400 by 1.

According to an embodiment, the image decoding apparatus 100 may determine a plurality of second coding units 1412a and 1412b, and 1414a, 1414b, and 1414c by splitting a first coding unit 1410, a height of which is longer than a width, in a horizontal direction based on the split shape mode information. According to an embodiment, the image decoding apparatus 100 may determine a plurality of second coding units 1422a and 1422b, and 1424a, 1424b, and 1424c by splitting a first coding unit 1420, a width of which is longer than a height, in a vertical direction based on the split shape mode information.

According to an embodiment, a depth of the second coding units 1412a and 1412b, and 1414a, 1414b, and 1414c, or 1422a and 1422b, and 1424a, 1424b, and 1424c, which are determined based on the split shape mode information of the non-square first coding unit 1410 or 1420, may be determined based on the length of a long side thereof. For example, because the length of a side of the square second coding units 1412a and 1412b is ½ times the length of a long side of the first coding unit 1410 having a non-square shape, a height of which is longer than a width, a depth of the square second coding units 1412a and 1412b is D+1 which is deeper than the depth D of the non-square first coding unit 1410 by 1.

Furthermore, the image decoding apparatus 100 may split the non-square first coding unit 1410 into an odd number of second coding units 1414a, 1414b, and 1414c based on the split shape mode information. The odd number of second coding units 1414a, 1414b, and 1414c may include the non-square second coding units 1414a and 1414c and the square second coding unit 1414b. In this case, because the length of a long side of the non-square second coding units 1414a and 1414c and the length of a side of the square second coding unit 1414b are ½ times the length of a long side of the first coding unit 1410, a depth of the second coding units 1414a, 1414b, and 1414c may be D+1 which is deeper than the depth D of the non-square first coding unit 1410 by 1. The image decoding apparatus 100 may determine depths of coding units split from the first coding unit 1420 having a non-square shape, a width of which is longer than a height, by using the above-described method of determining depths of coding units split from the first coding unit 1410.

According to an embodiment, the image decoding apparatus 100 may determine PIDs for identifying split coding units, based on a size ratio between the coding units when an odd number of split coding units do not have equal sizes. Referring to FIG. 14, a coding unit 1414b of a center location among an odd number of split coding units 1414a, 1414b, and 1414c may have a width equal to that of the other coding units 1414a and 1414c and a height which is two times that of the other coding units 1414a and 1414c. That is, in this case, the coding unit 1414b at the center location may include two of the other coding unit 1414a or 1414c. Therefore, when a PID of the coding unit 1414b at the center location is 1 based on a scan order, a PID of the coding unit 1414c located next to the coding unit 1414b may be increased by 2 and thus may be 3. That is, discontinuity in PID values may be present. According to an embodiment, the image decoding apparatus 100 may determine whether an odd number of split coding units do not have equal sizes, based on whether discontinuity is present in PIDs for identifying the split coding units.

According to an embodiment, the image decoding apparatus 100 may determine whether to use a specific splitting method, based on PID values for identifying a plurality of coding units determined by splitting a current coding unit. Referring to FIG. 14, the image decoding apparatus 100 may determine an even number of coding units 1412a and 1412b or an odd number of coding units 1414a, 1414b, and 1414c by splitting the first coding unit 1410 having a rectangular shape, a height of which is longer than a width. The image decoding apparatus 100 may use PIDs indicating respective coding units in order to identify respective coding units. According to an embodiment, the PID may be obtained from a sample of a certain location of each coding unit (for example an upper left sample).

According to an embodiment, the image decoding apparatus 100 may determine a coding unit at a certain location from among the split coding units, by using the PIDs for distinguishing the coding units. According to an embodiment, when the split shape mode information of the first coding unit 1410 having a rectangular shape, a height of which is longer than a width, indicates to split a coding unit into three coding units, the image decoding apparatus 100 may split the first coding unit 1410 into three coding units 1414a, 1414b, and 1414c. The image decoding apparatus 100 may assign a PID to each of the three coding units 1414a, 1414b, and 1414c. The image decoding apparatus 100 may compare PIDs of an odd number of split coding units to determine a coding unit at a center location from among the coding units. The image decoding apparatus 100 may determine the coding unit 1414b having a PID corresponding to a middle value among the PIDs of the coding units, as the coding unit at the center location from among the coding units determined by splitting the first coding unit 1410. According to an embodiment, the image decoding apparatus 100 may determine PIDs for distinguishing split coding units, based on a size ratio between the coding units when the split coding units do not have equal sizes. Referring to FIG. 14, the coding unit 1414b generated by splitting the first coding unit 1410 may have a width equal to that of the other coding units 1414a and 1414c and a height which is two times that of the other coding units 1414a and 1414c. In this case, when the PID of the coding unit 1414b at the center location is 1, the PID of the coding unit 1414c located next to the coding unit 1414b may be increased by 2 and thus may be 3. When the PID is not uniformly increased as described above, the image decoding apparatus 100 may determine that a coding unit is split into a plurality of coding units including a coding unit having a size different from that of the other coding units. According to an embodiment, when the split shape mode information indicates to split a coding unit into an odd number of coding units, the image decoding apparatus 100 may split a current coding unit in such a manner that a coding unit of a certain location among an odd number of coding units (for example a coding unit of a center location) has a size different from that of the other coding units. In this case, the image decoding apparatus 100 may determine the coding unit of the center location, which has a different size, by using PIDs of the coding units. However, the PIDs and the size or location of the coding unit of the certain location are not limited to the above-described examples, and various PIDs and various locations and sizes of coding units may be used.

According to an embodiment, the image decoding apparatus 100 may use a certain data unit where a coding unit starts to be recursively split.

Figure 15:
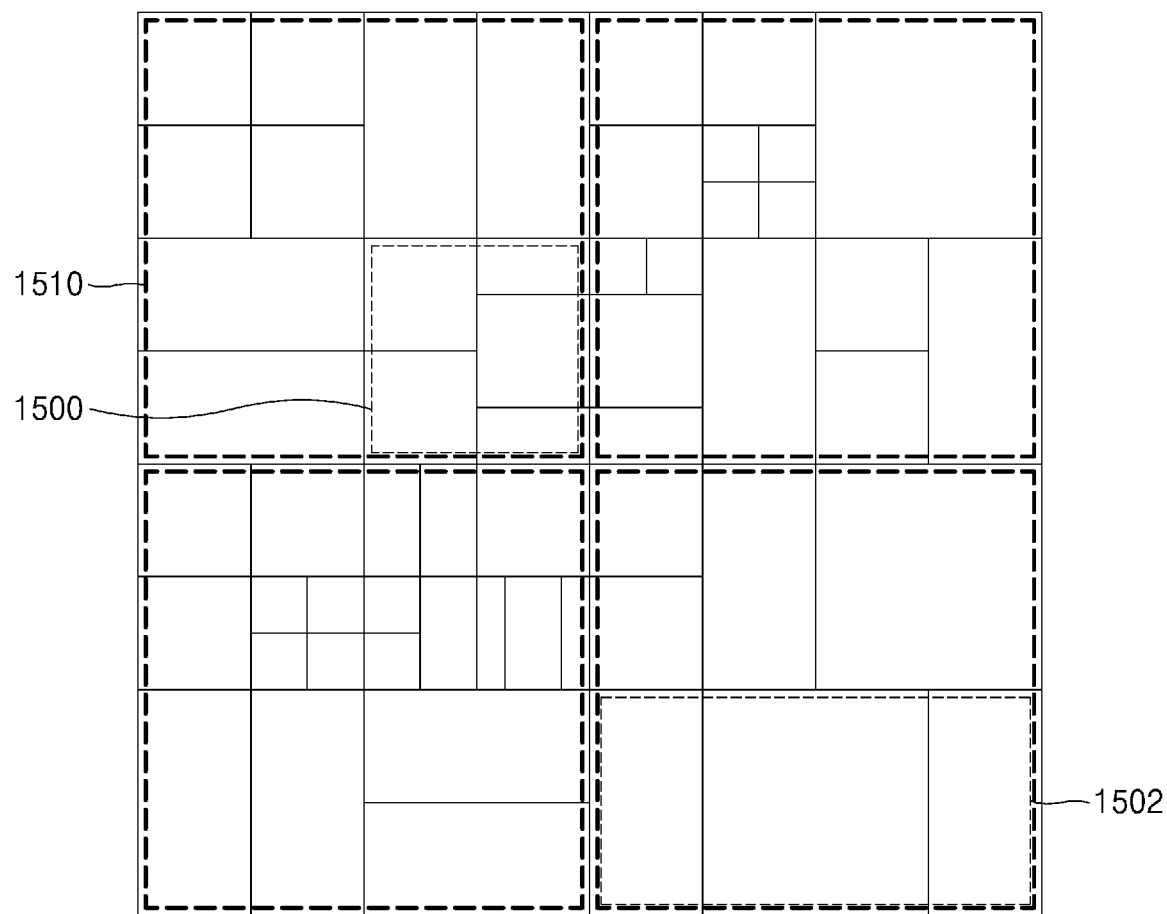
FIG. 15 illustrates that a plurality of coding units are determined based on a plurality of certain data units included in a picture, according to an embodiment.

FIG. 15 illustrates that a plurality of coding units are determined based on a plurality of certain data units included in a picture, according to an embodiment.

According to an embodiment, a certain data unit may be defined as a data unit where a coding unit starts to be recursively split by using split shape mode information. That is, the certain data unit may correspond to a coding unit of an uppermost depth, which is used to determine a plurality of coding units split from a current picture. In the following descriptions, for convenience of explanation, the certain data unit is referred to as a reference data unit.

According to an embodiment, the reference data unit may have a certain size and a certain size shape. According to an embodiment, the reference data unit may include M×N samples. Herein, M and N may be equal to each other, and may be integers expressed as powers of 2. That is, the reference data unit may have a square or non-square shape and may be split into an integer number of coding units.

According to an embodiment, the image decoding apparatus 100 may split the current picture into a plurality of reference data units. According to an embodiment, the image decoding apparatus 100 may split the plurality of reference data units, which are split from the current picture, by using the split shape mode information of each reference data unit. The operation of splitting the reference data unit may correspond to a splitting operation using a quadtree structure.

According to an embodiment, the image decoding apparatus 100 may previously determine the minimum size allowed for the reference data units included in the current picture. Accordingly, the image decoding apparatus 100 may determine various reference data units having sizes equal to or greater than the minimum size and may determine one or more coding units by using the split shape mode information with reference to the determined reference data unit.

Referring to FIG. 15, the image decoding apparatus 100 may use a square reference coding unit 1500 or a non-square reference coding unit 1502. According to an embodiment, the shape and size of reference coding units may be determined based on various data units capable of including one or more reference coding units (for example sequences, pictures, slices, slice segments, tiles, tile groups, largest coding units, or the like).

According to an embodiment, the receiver 110 of the image decoding apparatus 100 may obtain, from a bitstream, at least one of reference coding unit shape information and reference coding unit size information with respect to each of the various data units. An operation of splitting the square reference coding unit 1500 into one or more coding units has been described above in relation to the operation of splitting the current coding unit 300 of FIG. 3, and an operation of splitting the non-square reference coding unit 1502 into one or more coding units has been described above in relation to the operation of splitting the current coding unit 400 or 450 of FIG. 4. Thus, detailed descriptions thereof will not be provided herein.

According to an embodiment, the image decoding apparatus 100 may use a PID for identifying the size and the shape of reference coding units, to determine the size and the shape of reference coding units according to some data units previously determined based on a certain condition. That is, the receiver 110 may obtain, from the bitstream, only the PID for identifying the size and the shape of reference coding units with respect to each slice, slice segment, tile, tile group, or largest coding unit which is a data unit satisfying a certain condition (for example a data unit having a size equal to or smaller than a slice) among the various data units (for example sequences, pictures, slices, slice segments, tiles, tile groups, largest coding units, or the like). The image decoding apparatus 100 may determine the size and the shape of reference data units with respect to each data unit, which satisfies the certain condition, by using the PID. When the reference coding unit shape information and the reference coding unit size information are obtained and used from the bitstream according to each data unit having a relatively small size, efficiency of using the bitstream may not be high, and therefore, only the PID may be obtained and used instead of directly obtaining the reference coding unit shape information and the reference coding unit size information. In this case, at least one of the size and the shape of reference coding units corresponding to the PID for identifying the size and the shape of reference coding units may be previously determined. That is, the image decoding apparatus 100 may determine at least one of the size and the shape of reference coding units included in a data unit serving as a unit for obtaining the PID, by selecting the previously determined at least one of the size and the shape of reference coding units based on the PID.

According to an embodiment, the image decoding apparatus 100 may use one or more reference coding units included in a largest coding unit. That is, a largest coding unit split from a picture may include one or more reference coding units, and coding units may be determined by recursively splitting each reference coding unit. According to an embodiment, at least one of a width and a height of the largest coding unit may be integer times at least one of the width and the height of the reference coding units. According to an embodiment, the size of reference coding units may be obtained by splitting the largest coding unit n times based on a quadtree structure. That is, the image decoding apparatus 100 may determine the reference coding units by splitting the largest coding unit n times based on a quadtree structure and may split the reference coding unit based on at least one of the block shape information and the split shape mode information according to various embodiments.

According to an embodiment, the image decoding apparatus 100 may obtain block shape information indicating the shape of a current coding unit or split shape mode information indicating a splitting method of the current coding unit, from the bitstream, and may use the obtained information. The split shape mode information may be included in the bitstream related to various data units. For example, the image decoding apparatus 100 may use the split shape mode information included in a sequence parameter set (SPS), a picture parameter set (PPS), a video parameter set (VPS), a slice header, a slice segment header, a tile header, or a tile group header. Furthermore, the image decoding apparatus 100 may obtain, from the bitstream, a syntax element corresponding to the block shape information or the split shape mode information according to each largest coding unit, each reference coding unit, or each processing block, and may use the obtained syntax element.

Hereinafter, a method of determining a split rule, according to an embodiment of the present disclosure will be described in detail.

The image decoding apparatus 100 may determine a split rule of an image. The split rule may be pre-determined between the image decoding apparatus 100 and the image encoding apparatus 2200. The image decoding apparatus 100 may determine the split rule of the image, based on information obtained from a bitstream. The image decoding apparatus 100 may determine the split rule based on the information obtained from at least one of an SPS, a PPS, a VPS, a slice header, a slice segment header, a tile header, or a tile group header. The image decoding apparatus 100 may determine the split rule differently according to frames, slices, tiles, temporal layers, largest coding units, or coding units.

The image decoding apparatus 100 may determine the split rule based on a block shape of a coding unit. The block shape may include a size, shape, a ratio of width and height, and a direction of the coding unit. The image decoding apparatus 100 may pre-determine to determine the split rule based on the block shape of the coding unit. However, embodiments are not limited thereto. The image decoding apparatus 100 may determine the split rule of the image, based on information obtained from a received bitstream.

The shape of the coding unit may include a square and a non-square. When the lengths of the width and height of the coding unit are the same, the image decoding apparatus 100 may determine the shape of the coding unit to be a square. Also, when the lengths of the width and height of the coding unit are not the same, the image decoding apparatus 100 may determine the shape of the coding unit to be a non-square.

The size of the coding unit may include various sizes, such as 4×4, 8×4, 4×8, 8×8, 16×4, 16×8, and to 256×256. The size of the coding unit may be classified or determined based on the length of a long side of the coding unit, the length of a short side, or the area. The image decoding apparatus 100 may apply the same split rule to coding units classified as the same group. For example, the image decoding apparatus 100 may classify coding units having the same lengths of the long sides as having the same size. Also, the image decoding apparatus 100 may apply the same split rule to coding units having the same lengths of long sides.

The ratio of the width and height of the coding unit may include 1:2, 2:1, 1:4, 4:1, 1:8, 8:1, 1:16, 16:1, 32:1, 1:32, or the like. Also, a direction of the coding unit may include a horizontal direction and a vertical direction. The horizontal direction may indicate a case in which the length of the width of the coding unit is longer than the length of the height thereof. The vertical direction may indicate a case in which the length of the width of the coding unit is shorter than the length of the height thereof.

The image decoding apparatus 100 may adaptively determine the split rule based on the size of the coding unit. The image decoding apparatus 100 may differently determine an allowable split shape mode based on the size of the coding unit. For example, the image decoding apparatus 100 may determine whether splitting is allowed based on the size of the coding unit. The image decoding apparatus 100 may determine a split direction according to the size of the coding unit. The image decoding apparatus 100 may determine an allowable split type according to the size of the coding unit.

The split rule determined based on the size of the coding unit may be a split rule pre-determined in the image decoding apparatus 100. Also, the image decoding apparatus 100 may determine the split rule based on the information obtained from the bitstream.

The image decoding apparatus 100 may adaptively determine the split rule based on a location of the coding unit. The image decoding apparatus 100 may adaptively determine the split rule based on the location of the coding unit in the image.

Also, the image decoding apparatus 100 may determine the split rule such that coding units generated via different splitting paths do not have the same block shape. However, embodiments are not limited thereto, and the coding units generated via different splitting paths have the same block shape. The coding units generated via the different splitting paths may have different decoding process orders. Because the decoding process orders have been described above with reference to FIG. 12, details thereof are not provided again.

Figure 16:
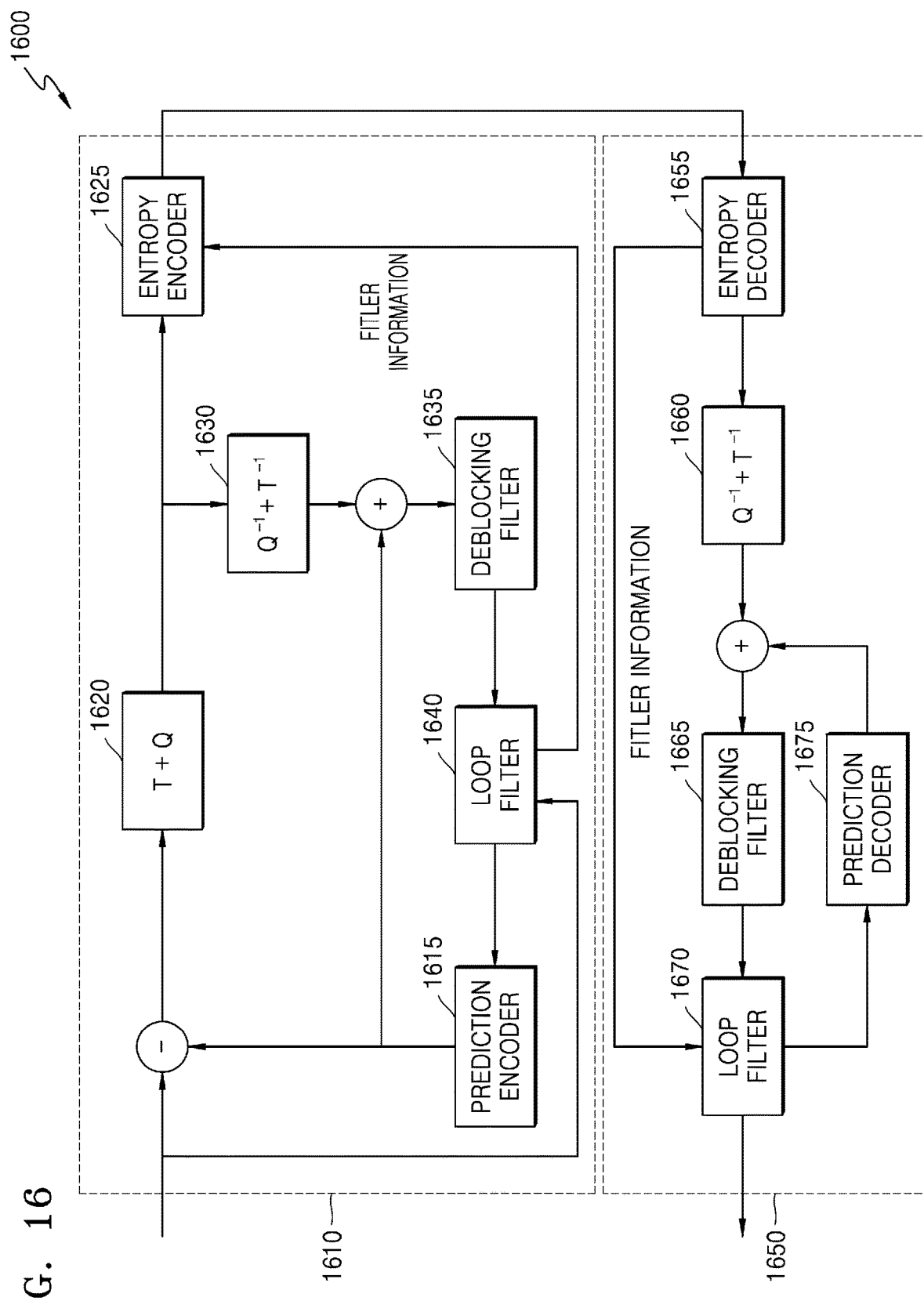
FIG. 16 is a block diagram of an image encoding and decoding system.

FIG. 16 is a block diagram of an image encoding and decoding system.

An encoding end 1610 of an image encoding and decoding system 1600 transmits an encoded bitstream of an image and a decoding end 1650 outputs a reconstructed image by receiving and decoding the bitstream. Here, the decoding end 1650 may have a similar configuration as the image decoding apparatus 100.

At the encoding end 1610, a prediction encoder 1615 outputs a reference image via inter-prediction and intra-prediction, and a transformer and quantizer 1620 quantizes residual data between the reference picture and a current input image to a quantized transform coefficient and outputs the quantized transform coefficient. An entropy encoder 1625 transforms the quantized transform coefficient by encoding the quantized transform coefficient, and outputs the transformed quantized transform coefficient as a bitstream. The quantized transform coefficient is reconstructed as data of a spatial domain via an inverse quantizer and inverse transformer 1630, and the data of the spatial domain is output as a reconstructed image via a deblocking filter 1635 and a loop filter 1640. The reconstructed image may be used as a reference image of a next input image via the prediction encoder 1615.

Encoded image data among the bitstream received by the decoding end 1650 is reconstructed as residual data of a spatial domain via an entropy decoder 1655 and an inverse quantizer and inverse transformer 1660. Image data of a spatial domain is configured when a reference image from a prediction decoder 1675 and residual data output are combined, and a deblocking filter 1665 and a loop filter 1670 may output a reconstructed image regarding a current original image by performing filtering on the image data of the spatial domain. The reconstructed image may be used by the prediction decoder 1675 as a reference image for a next original image.

The loop filter 1640 of the encoding end 1610 performs loop filtering by using filter information input according to a user input or system setting. The filter information used by the loop filter 1640 is output to the entropy encoder 1625 and transmitted to the decoding end 1650 together with the encoded image data. The loop filter 1670 of the decoding end 1650 may perform loop filtering based on the filter information input from the decoding end 1650.

Hereinafter, according to an embodiment of the present specification, a method and device for encoding or decoding a video by using blocks of various sizes and various shapes split from a picture will be described in detail with reference to FIGS. 17 to 20.

Hereinafter, a 'maximum size of a coding unit' refers to a maximum size of a longer side between a width and a height of the coding unit, and a 'minimum size of a coding unit' refers to a minimum size of a longer side between a width and a height of a coding unit.

A 'maximum size of a coding unit having a block ratio of 1:1' refers to a maximum size of a longer side between a width and a height of a coding unit of which a width and a height have a ratio of 1:1, and a 'minimum size of a coding unit having a block ratio of 1:1' refers to a minimum size of a longer side between a width and a height of a coding unit of which a width and a height have a ratio of 1:1.

A 'maximum size of a coding unit having a block ratio of 1:2' refers to a maximum size of a longer side between a width and a height of a coding unit of which a width and a height have a ratio of 1:2, and a 'minimum size of a coding unit having a block ratio of 1:2' refers to a minimum size of a longer side between a width and a height of a coding unit of which a width and a height have a ratio of 1:2. Also, a maximum size of a coding unit having a block ratio of 2:1 may be determined to be identical to the maximum size of the coding unit having a block ratio of 1:2, and a minimum size of a coding unit having a block ratio of 2:1 may be determined to be identical to the minimum size of the coding unit having a block ratio of 1:2.

Similarly, a 'maximum size of a coding unit having a block ratio of 1:4' refers to a maximum size of a longer side between a width and a height of a coding unit of which a width and a height have a ratio of 1:4, and a 'minimum size of a coding unit having a block ratio of 1:4' refers to a minimum size of a longer side between a width and a height of a coding unit of which a width and a height have a ratio of 1:4. Also, a maximum size of a coding unit having a block ratio of 4:1 may be determined to be identical to the maximum size of the coding unit having a block ratio of 1:4, and a minimum size of a coding unit having a block ratio of 4:1 may be determined to be identical to the minimum size of the coding unit having a block ratio of 1:4.

Also, when only one of a long side and a short side of a block having a certain ratio is identified, a length of the other side may be automatically determined based on the certain ratio. Accordingly, hereinafter, in the present disclosure, a size of a block having a certain ratio refers to a length of a long side of a block. For example, when a size of a block having a ratio of 1:2 or 2:1 is 8×4 or 4×8, the size of the block having a ratio of 1:2 or 2:1 will be referred to as 8.

Figure 17:
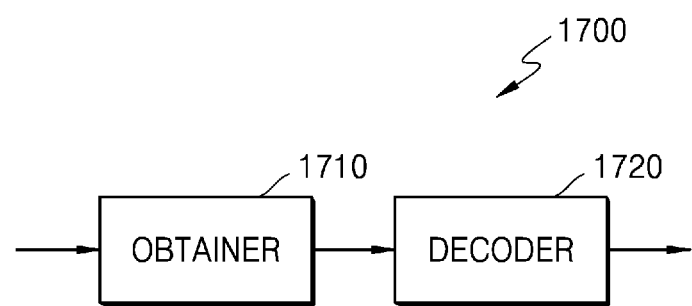
FIG. 17 is a block diagram of a video decoding apparatus according to an embodiment.

FIG. 17 is a block diagram of a video decoding apparatus according to an embodiment.

Referring to FIG. 17, the video decoding apparatus 1700 according to an embodiment may include an obtainer 1710 and a decoder 1720.

The video decoding apparatus 1700 may obtain a bitstream generated as a result of encoding an image, identify locations of blocks split from a picture based on information included in the bitstream, and decode blocks such as a largest coding unit, a coding unit, etc.

The video decoding apparatus 1700 according to an embodiment may include a central processor for controlling the obtainer 1710 and the decoder 1720. In embodiments, the obtainer 1710 and the decoder 1720 may operate by their own processors, and the processors may systematically operate with each other in order to operate the video decoding apparatus 1700 as a whole. In embodiments, the obtainer 1710 and the decoder 1720 may be controlled under control by an external processor of the video decoding apparatus 1700.

The video decoding apparatus 1700 may include at least one data storage in which data input to or output from the obtainer 1710 and the decoder 1720 is stored. The video decoding apparatus 1700 may include a memory controller for controlling data input and output of the at least one data storage.

The video decoding apparatus 1700 may perform an image decoding operation including prediction by connectively operating with an internal video decoding processor or an external video decoding processor in order to reconstruct an image via image decoding. The internal video decoding processor of the video decoding apparatus 1700 according to an embodiment may perform a basic image decoding operation in a manner that not only a separate processor but also an image decoding processing module included in a central processing device or a graphic processing device may perform the basic image decoding operation.

The video decoding apparatus 1700 may be included in the image decoding apparatus 100 described above. For example, the obtainer 1710 may be included in a receiver 110 of the image decoding apparatus 100, and the decoder 1720 may be included in the decoder 120 of the image decoding apparatus 100.

The obtainer 1710 receives a bitstream generated as a result of encoding an image. The bitstream may include information about a current slice. The current slice is one of at least one slice included in a picture and may include at least one tile. A tile may include at least one largest coding unit. The decoder 1720 may determine a location of a current block in a picture based on information obtained from the obtainer 1710. The current block is a block generated when an image is split according to a tree structure, and for example, may correspond to a largest coding unit, a coding unit, or a transform unit. The decoder 1720 may decode the at least one tile included in the current slice according to an encoding order. To this end, the decoder 1720 may decode at least one block included in a current tile.

A shape of a block may be represented by 'width×height' of a rectangle. Also, the shape of a block may be represented by a ratio of a width and a height, that is, 'width:height', of a block. The decoder 1720 may determine blocks of various shapes and various sizes based on a syntax element and decode samples included in a block.

The obtainer 1710 according to an embodiment may determine the current block based on block shape information and/or information about a split shape mode, which are included in at least one of an SPS, a PPS, a VPS, a slice header, and a slice segment header. Furthermore, the decoder 1720 may obtain, from the bitstream, a syntax element corresponding to the block shape information or the information about the split shape mode according to a largest coding unit, a reference coding unit, or a processing block, and may use the obtained syntax element to determine the current block.

The obtainer 1710 according to an embodiment may obtain, from the bitstream, information about a size of the largest coding unit and information about a minimum size of the coding unit. The obtainer 1710 according to an embodiment may obtain, from the bitstream, information indicating a first difference between a maximum size of a coding unit of which a width and a height have a ratio of 1:4 and the size of the largest coding unit.

The decoder 1720 according to an embodiment may determine the size of the largest coding unit by using the information about the size of the largest coding unit obtained from the bitstream.

The decoder 1720 according to an embodiment may determine the minimum size of the coding unit by using the information about the minimum size of the coding unit obtained from the bitstream. In detail, the information about the minimum size of the coding unit is a binary log value, and the decoder 1720 may determine the minimum size of the coding unit by using a value obtained by adding 2 to the information about the minimum size of the coding unit. Accordingly, when the information about the minimum size of the coding unit indicates 0, the minimum size of the coding unit may be determined to be powers of 2.

The decoder 1720 according to an embodiment may determine the first difference between the maximum size of the coding unit having a block ratio of 1:4 and the size of the largest coding unit, by using the information indicating the first difference obtained from the bitstream.

The decoder 1720 may determine the maximum size of the coding unit having a block ratio of 1:4, by using the size of the largest coding unit and the first difference. Also, the decoder 1720 may determine the minimum size of the coding unit having a block ratio of 1:4 based on the minimum size of the coding unit.

The decoder 1720 may determine whether it is possible to generate a coding unit having a block ratio of 1:4 by splitting a first coding unit, that is, whether it is allowed to split a first coding unit into coding units having a block ratio of 1:4, based on the maximum size of the coding unit having a block ratio of 1:4 and the minimum size of the coding unit having a block ratio of 1:4. When the splitting is allowed, the decoder 1720 may determine a second coding unit including a coding unit having a block ratio of 1:4, by splitting a width or a height of the first coding unit. The second coding unit may include a coding unit having a block ratio of 1:2 and the coding unit having a block ratio of 1:4. In detail, when the first coding unit is a square block and is ternary split, a second coding unit including one coding unit having a block ratio of 1:2 and two coding units having a block ratio of 1:4 may be generated from the first coding unit.

The decoder 1720 may decode the second coding unit. In detail, the decoder 1720 may determine prediction blocks by performing prediction on the second coding unit. When a prediction mode of the second coding unit is not a skip mode, residual blocks may be generated by performing inverse quantization and inverse transformation on the second coding unit. The decoder 1720 may determine reconstruction blocks of the second coding unit by combining the prediction blocks and the residual blocks with each other. In detail, the reconstruction blocks may be determined by performing prediction, inverse quantization, and inverse transformation for a coding unit having a block ratio of 1:2 and a coding unit having a block ratio of 1:4, which are included in the second coding unit.

For example, when a prediction mode of the current block is an intra mode, the decoder 1720 may determine a reference sample from among samples of spatial neighboring blocks located in an intra prediction direction by using intra prediction information of the current block and determine prediction samples corresponding to the current block by using the reference sample.

For example, when the prediction mode of the current block is an inter mode, the decoder 1720 may reconstruct the current block by using a motion vector of the current block. The decoder 1720 may determine a reference block in a reference picture by using the motion vector of the current block and determine prediction samples corresponding to the current block from among reference samples included in the reference block.

When the prediction mode of the current block is the skip mode, the video decoding apparatus 1700 is not required to parse transform coefficients of the current block from the bitstream. The decoder 1720 may determine reconstruction samples of the current block by using the prediction samples of the current block as they are.

The decoder 1720 according to an embodiment may reconstruct a tile including at least one largest coding unit by reconstructing blocks included in the largest coding unit. Also, the decoder 1720 may reconstruct a slice including at least one tile and reconstruct a picture including at least one slice.

Hereinafter, a video decoding method by which the video decoding apparatus 1700 according to an embodiment decodes blocks of various sizes and various shapes split from a picture will be described with reference to FIG. 18.

Figure 18:
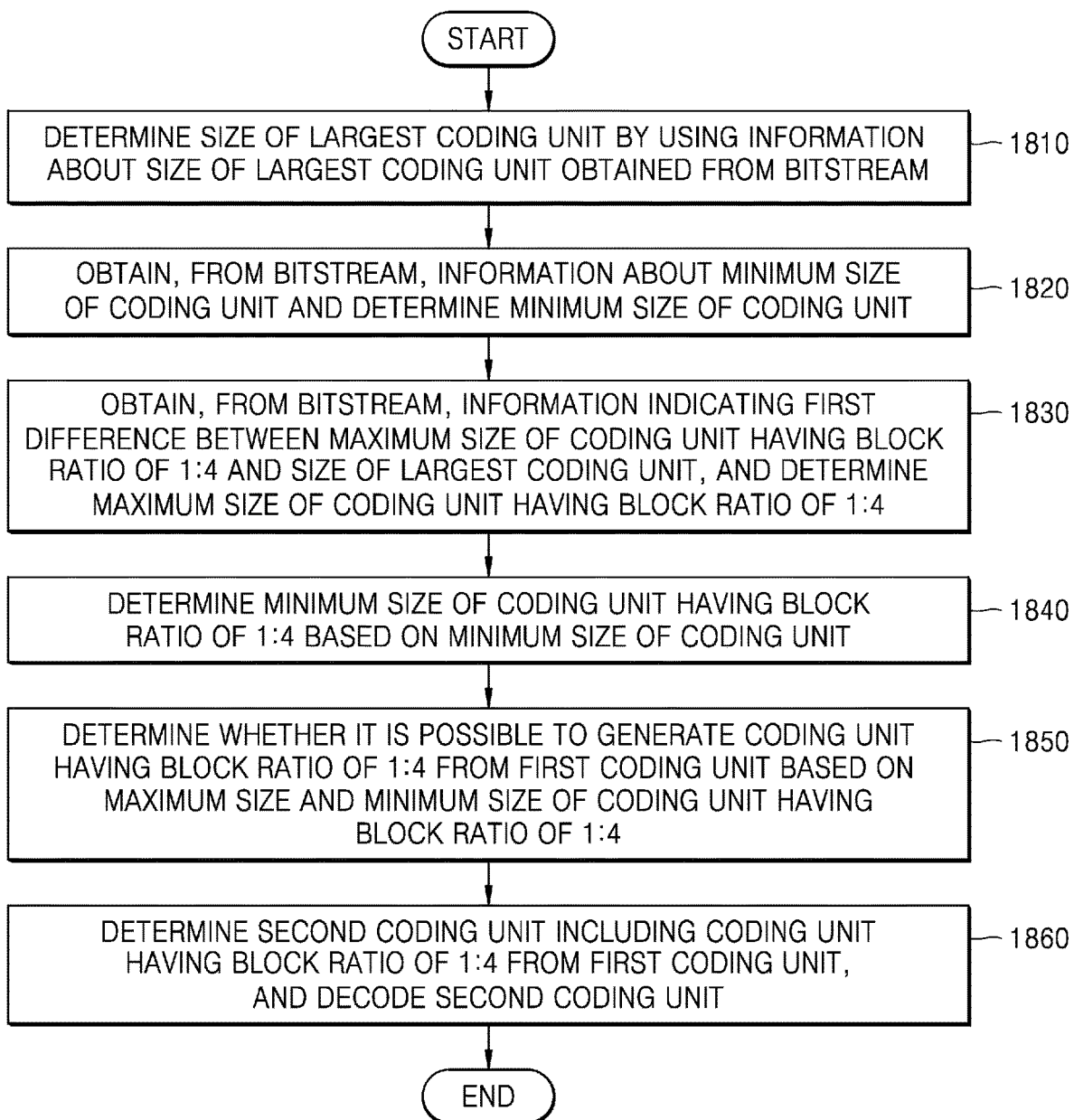
FIG. 18 is a flowchart of a video decoding method according to an embodiment.

FIG. 18 is a flowchart of a video decoding method according to an embodiment.

In operation 1810, the decoder 1720 according to an embodiment may determine, by using information about a size of a largest coding unit obtained from a bitstream, the size of the largest coding unit. For example, the obtainer 1710 may obtain the information about the size of the largest coding unit from an SPS.

In detail, according to an embodiment, the size of the largest coding unit may be 32, and the information about the size of the largest coding unit may indicate a quotient obtained by dividing the size of the largest coding unit by 32.

In operation 1820, the obtainer 1710 according to an embodiment may obtain information about a minimum size of the coding unit obtained from the bitstream. The decoder 1720 according to an embodiment may determine the minimum size of the coding unit by performing inverse binary log transformation on a value generated by adding 2 to the information about the minimum size of the coding unit. In this case, 2 may denote a minimum binary log value that the maximum size of the coding unit may have, and thus the minimum size of the coding unit may be 4.

In operation 1830, the obtainer 1710 according to an embodiment may obtain, from the bitstream, information indicating a first difference between a maximum size of a coding unit of which a width and a height have a ratio of 1:4 and the size of the largest coding unit. The decoder 1720 according to an embodiment may determine a value of the first difference between the maximum size of the coding unit having a block ratio of 1:4 and the size of the largest coding unit, by performing inverse binary log transformation on the information indicating the first difference that is a binary log value.

The decoder 1720 according to an embodiment may determine the maximum size of the coding unit of which the width and the height have a ratio of 1:4, by using the size of the largest coding unit and the first difference. In detail, the decoder 1720 according to an embodiment may determine the maximum size of the coding unit having a block ratio of 1:4, to be identical to a smaller value between a block size according to a value obtained by subtracting the first difference from the size of the largest coding unit, and a maximum size of a transform unit. Accordingly, the maximum size of the coding unit having a block ratio of 1:4 may be determined not to be greater than a size of a largest transform unit. For example, a binary log value of the maximum size of the transform unit may be 6.

In operation 1840, the decoder 1720 according to an embodiment may determine a minimum size of the coding unit having a block ratio of 1:4, based on the minimum size of the coding unit.

In detail, the decoder 1720 according to an embodiment may determine a minimum size of a coding unit having a block ratio of 1:1, to be the same size as the minimum size of the coding unit. The decoder 1720 may determine a minimum size of a coding unit having a block ratio of 1:2, to be a size twice than the minimum size of the coding unit having a block ratio of 1:1. The decoder 1720 may determine the minimum size of the coding unit having a block ratio of 1:4, to be a size twice than the minimum size of the coding unit having a block ratio of 1:2.

In operation 1850, the decoder 1720 according to an embodiment may determine whether it is possible to generate the coding unit having a block ratio of 1:4 by splitting a width or a height of a first coding unit, based on the maximum size of the coding unit having a block ratio of 1:4 and the minimum size of the coding unit having a block ratio of 1:4.

When the size of the coding unit having a block ratio of 1:4 generated by splitting the width or the height of the first coding unit is greater than the maximum size of the coding unit having a block ratio of 1:4 or smaller than the minimum size of the coding unit having a block ratio of 1:4, it may not be possible, or allowed, to split the first coding unit into coding units having a block ratio of 1:4.

In operation 1860, when it is allowed to split the first coding unit into the coding units having a block ratio of 1:4, the decoder 1720 according to an embodiment may determine a second coding unit including a coding unit having a block ratio of 1:4, which is generated from the first coding unit, and decode the second coding unit. The second coding unit including the coding unit having a block ratio of 1:4 may be determined by splitting the width or the height of the first coding unit. The second coding unit may include a coding unit having a block ratio of 1:2 and the coding unit having a block ratio of 1:4. In detail, when the first coding unit is a square block and is ternary split, a second coding unit including one coding unit having a block ratio of 1:2 and two coding units having a block ratio of 1:4 may be generated from the first coding unit. The decoder 1720 may perform decoding for the coding unit having a block ratio of 1:2 and the coding units having a block ratio of 1:4, which are included in the second coding unit.

The obtainer 1710 according to an embodiment may obtain, from the bitstream, information indicating a second difference between the size of the largest coding unit and a maximum size of a ternary splittable block. The decoder 1720 according to an embodiment may determine the maximum size of the ternary splittable block by using the size of the largest coding unit and the second difference.

In detail, the decoder 1720 according to an embodiment may determine the maximum size of the ternary splittable block, to be identical to a smaller value between a block size according to a value obtained by subtracting the second difference from the size of the largest coding unit, and the maximum size of the transform unit. Accordingly, the maximum size of the ternary splittable block may be determined not to be greater than the size of the largest transform unit. For example, a binary log value of the maximum size of the transform unit may be 6.

The obtainer 1710 according to an embodiment may obtain, from the bitstream, information indicating a third difference between the minimum size of the coding unit and a minimum size of the ternary splittable block. The decoder 1720 according to an embodiment may determine the minimum size of the ternary splittable block by using the minimum size of the coding unit and the third difference. In detail, the decoder 1720 according to an embodiment may determine the minimum size of the ternary splittable block by using a value obtained by adding the minimum size of the coding unit, and the third difference.

The decoder 1720 according to an embodiment may determine whether to ternary split the current block based on the maximum size of the ternary splittable block and the minimum size of the ternary splittable block. The decoder 1720 according to an embodiment may decode blocks generated by ternary splitting from the current block.

Hereinafter, a video encoding apparatus for splitting blocks of various sizes and various shapes in order to encode the split blocks and transmitting information about a maximum size and a minimum size of a block according to a block shape will be described with reference to FIG. 19.

Figure 19:
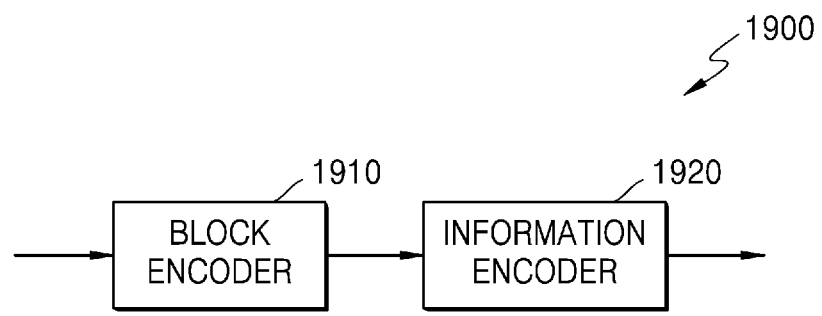
FIG. 19 is a block diagram of a video encoding apparatus according to an embodiment.

FIG. 19 is a block diagram of a video encoding apparatus according to an embodiment.

Referring to FIG. 19, a video encoding apparatus 1900 according to an embodiment may include a block encoder 1910 and an information encoder 1920.

The block encoder 1910 according to an embodiment may split a picture into coding units and encode the coding units. The picture is split into at least one coding unit by using different processors, and the processors may encode the coding units. The information encoder 1920 may output, in the form of a bitstream, syntax elements corresponding to pieces of encoded information generated as a result of encoding.

The video encoding apparatus 1900 according to an embodiment may include a central processor for controlling the block encoder 1910 and the information encoder 1920. In embodiments, the block encoder 1910 and the information encoder 1920 may operate by their own processors, and the processors may systematically operate with each other in order to operate the video encoding apparatus 1900 as a whole. In embodiments, the block encoder 1910 and the information encoder 1920 may be controlled under control by an external processor of the video encoding apparatus 1900.

The video encoding apparatus 1900 may include at least one data storage in which data input to or output from the block encoder 1910 and the information encoder 1920 is stored. The video encoding apparatus 1900 may include a memory controller for controlling data input and output of the data storage.

The video encoding apparatus 1900 may perform an image encoding operation including prediction by connectively operating with an internal video encoding processor or an external video encoding processor in order to encode an image. The internal video encoding processor of the video encoding apparatus 1900 according to an embodiment may perform a basic image encoding operation in a manner that not only a separate processor but also an image encoding processing module included in a central processing device or a graphic processing device may perform the basic image encoding operation.

The block encoder 1910 according to an embodiment may split a picture into a plurality of largest coding units and may split a largest coding unit into blocks of various sizes and various shapes in order to encode the split blocks.

For example, when a prediction mode of the current block is an intra mode, the block encoder 1910 may determine a reference sample from among samples of spatial neighboring blocks located in an intra prediction direction by using intra prediction information of the current block and determine prediction samples corresponding to the current block by using the reference sample.

For example, when a prediction mode of a current block is a skip mode, the block encoder 1910 may determine a motion vector to predict the current block. The block encoder 1910 may determine a reference block in a reference picture and determine a motion vector indicating the reference block from the current block. In the case of the skip mode, there is no need to encode a residual block.

For example, when the prediction mode of the current block is an inter mode, the block encoder 1910 may determine a motion vector to predict the current block. The block encoder 1910 may determine a reference block in a reference picture and determine a motion vector indicating the reference block from the current block. The block encoder 1910 may determine a residual sample between current blocks and reference samples included in the reference block and may generate a quantized transform coefficient by performing transformation and quantization on the residual sample based on a transform unit.

The current block may be a block which is split and generated from an image according to a tree structure, and for example, may correspond to a largest coding unit, a coding unit, or a transform unit. The block encoder 1910 may encode blocks included in the picture according to an encoding order.

The information encoder 1920 may output a bitstream including information about sizes of various shapes of blocks determined as a result of the encoding of the blocks.

For example, the information encoder 1920 may include block shape information and information about a split shape mode in at least one of an SPS, a PPS, a VPS, and a slice header. Furthermore, the information encoder 1920 may encode, from the bitstream, a syntax element corresponding to the block shape mode or the information about the split shape mode for a largest coding unit, a reference coding unit, or a processing block, and may generate the syntax element in the form of a bitstream.

The block encoder 1910 according to an embodiment may determine a size of the largest coding unit and a minimum size of the coding unit. The block encoder 1910 according to an embodiment may determine a maximum size of a coding unit having a block ratio of 1:4 and a minimum size of a coding unit having a block ratio of 1:4.

For example, the maximum size of the coding unit having a block ratio of 1:4 may be determined to be smaller than or same as a maximum size of the transform unit.

The block encoder 1910 according to an embodiment may determine whether it is possible to generate a second coding unit of which a width and a height have a ratio of 1:4 by splitting a first coding unit, based on the maximum size of the coding unit having a block ratio of 1:4 and the minimum size of the coding unit having a block ratio of 1:4. When it is possible to generate the second coding unit, the block encoder 1910 may generate a second coding unit including a coding unit having a block ratio of 1:4 from the first coding unit and encode the second coding unit. The second coding unit may include a coding unit having a block ratio of 1:2 and the coding unit having a block ratio of 1:4. In detail, when the first coding unit is a square block and is ternary split, a second coding unit including one coding unit having a block ratio of 1:2 and two coding units having a block ratio of 1:4 may be generated from the first coding unit.

The information encoder 1920 according to an embodiment may encode information about the size of the largest coding unit based on the size of the largest coding unit. The information encoder 1920 according to an embodiment may encode information about the minimum size of the coding unit based on the minimum size of the coding unit. The information encoder 1920 according to an embodiment may encode information indicating a first difference between the maximum size of the coding unit having a block ratio of 1:4 and the size of the largest coding unit, by using the size of the largest coding unit and the maximum size of the coding unit having a block ratio of 1:4.

The block encoder 1910 may encode the second coding unit. The block encoder 1910 may perform encoding for the coding unit having a block ratio of 1:2 and the coding units having a block ratio of 1:4, which are included in the second coding unit. In detail, the block encoder 1910 may determine reference samples by performing prediction on the second coding unit. When a prediction mode of the second coding unit is not a skip mode, residual samples between samples and the reference samples of the second coding unit may be generated, and a quantized transform coefficient may be generated by performing transformation and quantization on the residual samples. The information encoder 1920 may encode, in the form of a syntax element, quantized transform coefficients of the residual samples generated from the second coding unit.

For example, when the prediction mode of the second coding unit is an intra mode, the block encoder 1910 may determine a reference sample from among samples of spatial neighboring blocks of the second coding unit and may determine prediction samples corresponding to the current block by using the reference sample. The block encoder 1910 may generate residual samples indicating a difference between the samples and the prediction samples of the second coding unit and may generate quantized transform coefficients by performing transformation and quantization on the residual samples. The information encoder 1920 may encode information about an intra prediction direction indicating a reference sample used for intra prediction among the samples of the spatial neighboring blocks. Also, the information encoder 1920 may encode the quantized transform coefficients of the residual samples generated from the second coding unit.

For example, when the prediction mode of the second coding unit is an inter mode, the block encoder 1910 may determine a reference block from among spatial neighboring blocks or temporal neighboring blocks of the second coding unit. The block encoder 1910 may generate residual samples indicating a difference between the samples of the second coding unit and samples of the reference block and may generate quantized transform coefficients by performing transformation and quantization on the residual samples. The information encoder 1920 may encode motion information (for example a motion vector, reference picture information, information about a reference direction, or the like) indicating a reference block used for inter prediction among the spatial neighboring blocks or the temporal neighboring blocks. Also, the information encoder 1920 may encode the quantized transform coefficients of the residual samples generated from the second coding unit.

When the prediction mode of the current block is the skip mode, the block encoder 1910 may determine a reference block from among the spatial neighboring blocks or the temporal neighboring blocks of the second coding unit, and the information encoder 1920 may encode motion information (for example a motion vector, reference picture information, information about a reference direction, etc.) indicating a reference block used for inter prediction among the spatial neighboring blocks or the temporal neighboring blocks. The information encoder 1920 does not encode the quantized transform coefficients of the residual samples in the skip mode.

Hereinafter, a process in which the video encoding apparatus 1900 encodes a picture by using blocks of various sizes and various shapes, and performs video encoding so that a maximum size and information about the maximum size may be signaled for block shapes will be described with reference to FIG. 20.

Figure 20:
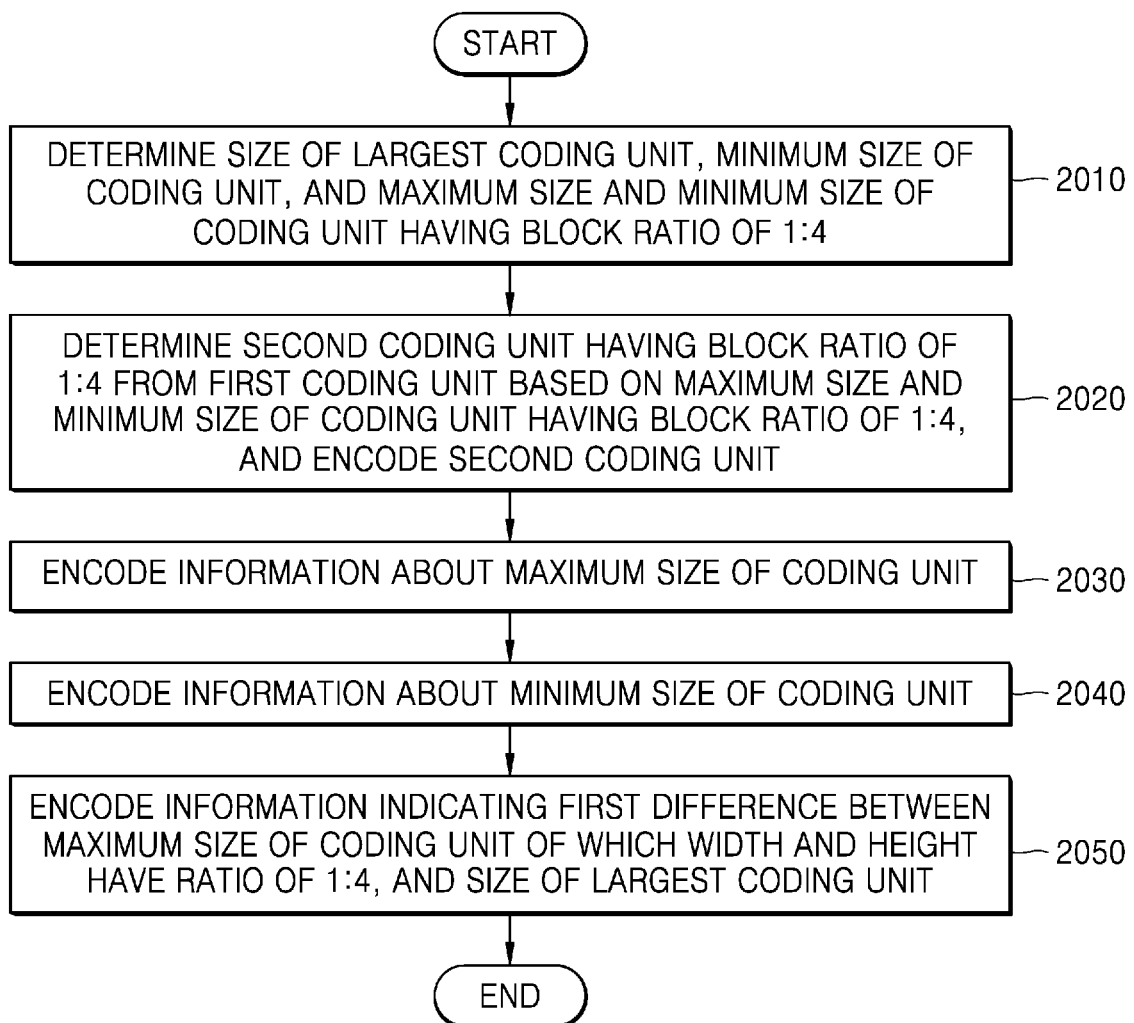
FIG. 20 is a flowchart of a video encoding method according to an embodiment.

FIG. 20 is a flowchart of a video encoding method according to an embodiment.

In operation 2010, the block encoder 1910 may determine a size of a largest coding unit, a minimum size of a coding unit, a maximum size of a coding unit having a block ratio of 1:4, and a minimum size of the coding unit having a block ratio of 1:4.

In operation 2020, the block encoder 1910 according to an embodiment may determine whether to generate a coding unit having a block ratio of 1:4 by splitting a current block, based on the maximum size of the coding unit having a block ratio of 1:4 and the minimum size of the coding unit having a block ratio of 1:4. When a size of the coding unit having a block ratio of 1:4, which may be split and generated from the current block, is greater than the maximum size of the coding unit having a block ratio of 1:4 or smaller than the minimum size of the coding unit having a block ratio of 1:4, it may not be allowed to split the current block into coding units having a block ratio of 1:4. When the splitting is allowed, the block encoder 1910 according to an embodiment may encode the coding unit having a block ratio of 1:4, which is generated by splitting the current block.

In operation 2030, the information encoder 1920 according to an embodiment may encode information about the size of the largest coding unit based on the size of the largest coding unit.

In operation 2040, the information encoder 1920 according to an embodiment may encode information about the minimum size of the coding unit by using the minimum size of the coding unit. According to an embodiment, the information about the minimum size of the coding unit may indicate a value obtained by subtracting 2 from a value to which a binary log of the minimum size of the coding unit is applied.

For example, the information encoder 1920 may include, in an SPS, the information about the size of the largest coding unit and the information about the minimum size of the coding unit.

In operation 2050, the information encoder 1920 according to an embodiment may encode information indicating a first difference by using the size of the largest coding unit and the maximum size of the coding unit having a block ratio of 1:4. According to an embodiment, the information indicating the first difference may indicate a value obtained by applying a binary log to a difference value between the size of the largest coding unit and the maximum size of the coding unit having a block ratio of 1:4.

The block encoder 1910 according to an embodiment may limit the minimum size of the coding unit to be greater than or equal to 4. The block encoder 1910 according to an embodiment may determine a minimum size of a coding unit having a block ratio of 1:1, to be the same size as the minimum size of the coding unit. Also, the block encoder 1910 may determine a minimum size of a coding unit having a block ratio of 1:2, to be a size twice than the minimum size of the coding unit having a block ratio of 1:1. Also, the block encoder 1910 may determine a minimum size of a coding unit having a block ratio of 1:4, to be a size twice than the minimum size of the coding unit having a block ratio of 1:2.

The block encoder 1910 according to an embodiment may determine a maximum size of the coding unit having a block ratio of 1:1, to be the same size as the size of the largest coding unit. Also, the block encoder 1910 may determine a maximum size of the coding unit having a block ratio of 1:2, to be the same size as the maximum size of the coding unit having a block ratio of 1:1. Also, the block encoder 1910 may limit a maximum size of the coding unit having a block ratio of 1:4 to be smaller than or equal to the largest coding unit or 64.

The block encoder 1910 according to an embodiment may determine, based on the maximum size of the coding unit having a block ratio of 1:1 and the minimum size of the coding unit having a block ratio of 1:1, the coding unit having a block ratio of 1:1, which has a size smaller than or equal to the maximum size and greater than or equal to the minimum size. The block encoder 1910 according to an embodiment may encode the coding unit having a block ratio of 1:1 by performing prediction on the coding unit having a block ratio of 1:1.

The block encoder 1910 according to another embodiment may determine, based on the maximum size of the coding unit having a block ratio of 1:2 and the minimum size of the coding unit having a block ratio of 1:2, the coding unit having a block ratio of 1:2, which has a size smaller than or equal to the maximum size and greater than or equal to the minimum size. The block encoder 1910 according to an embodiment may encode the coding unit having a block ratio of 1:2 by performing prediction on the coding unit having a block ratio of 1:2.

The block encoder 1910 according to another embodiment may determine, based on the maximum size of the coding unit having a block ratio of 1:4 and the minimum size of the coding unit having a block ratio of 1:4, the coding unit having a block ratio of 1:4, which has a size smaller than or equal to the maximum size and greater than or equal to the minimum size. The block encoder 1910 according to an embodiment may encode the coding unit having a block ratio of 1:4 by performing prediction on the coding unit having a block ratio of 1:4.

The block encoder 1910 according to another embodiment may determine whether to ternary split the current block based on a maximum size of a ternary splittable block and a minimum size of the ternary splittable block. For example, the maximum size of the ternary splittable block may be determined to be smaller than or equal to a maximum size of a transform unit. When a size of the current block is smaller than or equal to the maximum size of the ternary splittable block and greater than or equal to the minimum size of the ternary splittable block, the block encoder 1910 according to another embodiment may encode ternary split blocks by performing prediction on blocks generated by ternary splitting from the current block.

The information encoder 1920 according to another embodiment may encode information indicating a second difference between the size of the largest coding unit and a maximum size of a ternary splittable coding unit. The information indicating the second difference may be a value obtained by applying a binary log to a difference value between the size of the largest coding unit and the maximum size of the ternary splittable coding unit.

The information encoder 1920 according to another embodiment may encode information indicating a third difference between the minimum size of the coding unit and a minimum size of the ternary splittable coding unit. The information indicating the third difference may be a value obtained by applying a binary log to a difference value between the minimum size of the coding unit and the minimum size of the ternary splittable coding unit. In detail, the information indicating the third difference may be a value obtained by subtracting 2 from a binary log value of the difference value between the minimum size of the coding unit and the minimum size of the ternary splittable coding unit.

The video encoding apparatus 1900 and the video decoding apparatus 1700 according to an embodiment may differently set an allowable ratio (or block ratio) of a width and a height of a block according to a size and a split shape of a block. Accordingly, the video encoding apparatus 1900 and the video decoding apparatus 1700 may differently set an allowable block size according to a block ratio.

Hereinafter, information about a maximum size and a minimum size of a block according to an allowed block ratio between the video encoding apparatus 1900 and the video decoding apparatus 1700 will be illustrated according to various embodiments with reference to FIGS. 21 to 25.

FIG. 21 illustrates allowable block sizes for block ratios in a block split tree structure, according to an embodiment.

The video encoding apparatus 1900 according to an embodiment may differently set an allowed maximum size and minimum size of a block according to a block ratio. Accordingly, the video decoding apparatus 1700 according to an embodiment may also differently set the allowed maximum size and minimum size of the block according to the block ratio.

A size of a largest coding unit (CTU) may be set to one of 128×128, 64×64, 32×32, 16×16, 8×8, and 4×4. Accordingly, a size of the largest coding unit, which is allowable by the video encoding apparatus 1900 and the video decoding apparatus 1700, may be indicated as 128 and an allowable minimum size of a coding unit may be indicated as 4.

When a block ratio is 1:1, an allowed maximum size of a block is 128 and an allowed minimum size of the block is 4. Accordingly, an allowed block shape may be 128×128, 64×64, 32×32, 16×16, 8×8, or 4×4.

When the block ratio is 1:2, an allowed maximum size of the block is 128 and an allowed minimum size of the block is 8. Accordingly, an allowed block shape may be 128×64, 64×128, 64×32, 32×64, 32×16, 16×32, 16×8, 8×16, 8×4, or 4×8.

When the block ratio is 1:4, an allowed maximum size of the block is 128 and an allowed minimum size of the block is 16. Accordingly, an allowed block shape may be 128×64, 64×128, 64×16, 16×64, 32×8, 8×32, 16×4, or 4×16. However, the video encoding apparatus 1900 and the video decoding apparatus 1700 according to an embodiment may not use a 128×32 block or a 32×128 block in order to implement a 64×64 block pipeline.

In a block ratio of 1:N, as N increases, the block ratio decreases. Because a coding unit having a relatively small block ratio is generated by splitting a coding unit having a larger block ratio, a maximum size of a block having a smaller block ratio may not be greater than a maximum size of a block having a relatively large block ratio, and a minimum size of the block having a smaller block ratio may not be smaller than a minimum size of the block having a relatively large block ratio.

Accordingly, when a minimum size of a coding unit and a minimum size of a coding unit having a block ratio of 1:1, which are supportable by the video encoding apparatus 1900 and the video decoding apparatus 1700, are 4 (4×4), and thus a minimum size of a coding unit having a block ratio of 1:2 may be 8 (8×4 or 4×8) which is greater than the minimum size of the coding unit having a block ratio of 1:1. Similarly, a minimum size of a coding unit having a block ratio of 1:2 may be 8, and thus a minimum size of a block having a block ratio of 1:4 may be 16 (16×4 or 4×16) which is greater than 8.

An embodiment in which the video encoding apparatus 1900 and the video decoding apparatus 1700 according to an embodiment signal a maximum size and a minimum size of a block for a block ratio, as shown in FIG. 21, will be described below with reference to FIGS. 26 to 30. According to an embodiment, information about a maximum size and a minimum size of a block for a block ratio may be included in a sequence header, a picture header, or the like.

Information about a maximum size and a parameter for a minimum size of a block for a block ratio, according to various embodiments to be described below in addition to the embodiment of FIG. 21, may indicate values obtained by binary log-transforming the maximum size and the minimum size, respectively. Information about a maximum size, information about a minimum size, etc. of a block transmitted according to each embodiment may be encoded into and decoded from unsigned exponential Golomb codes or unary codes.

FIG. 22 illustrates parameters for a maximum size and a minimum size determined for a block ratio in a block split tree structure of FIG. 21, according to an embodiment.

When a size of a largest coding unit, which is supportable by the video encoding apparatus 1900 and the video decoding apparatus 1700 according to an embodiment, is 128, a parameter for the largest coding unit may be indicated as 7, as a value obtained by binary log-transforming 128.

A maximum size of a coding unit having a block ratio of 1:1, which is supportable by the video encoding apparatus 1900 and the video decoding apparatus 1700 according to an embodiment, may be 128, and a parameter for a maximum size of the coding unit having a block ratio of 1:1 may be indicated as 7, as a value obtained by binary log-transforming 128. A minimum size of the coding unit having a block ratio of 1:1, which is supportable according to an embodiment, may be 4, and a parameter for a minimum size of the coding unit having a block ratio of 1:1 may be indicated as 2, as a value obtained by binary log-transforming 4.

A maximum size of a coding unit having a block ratio of 1:2, which is supportable by the video encoding apparatus 1900 and the video decoding apparatus 1700 according to an embodiment, may be 128, and a parameter for a maximum size of the coding unit having a block ratio of 1:2 may be indicated as 7, as a value obtained by binary log-transforming 128. A minimum size of the coding unit having a block ratio of 1:2, which is supportable according to an embodiment, may be 8, and a parameter for a minimum size of the coding unit having a block ratio of 1:2 may be indicated as 3, as a value obtained by binary log-transforming 8.

A maximum size of a coding unit having a block ratio of 1:4, which is supportable by the video encoding apparatus 1900 and the video decoding apparatus 1700 according to an embodiment, may be 64, and a parameter for a maximum size of the coding unit having a block ratio of 1:4 may be indicated as 6, as a value obtained by binary log-transforming 64. A minimum size of the coding unit having a block ratio of 1:4, which is supportable according to an embodiment, may be 16, and a parameter for a minimum size of the coding unit having a block ratio of 1:4 may be indicated as 4, as a value obtained by binary log-transforming 16.

Accordingly, according to various embodiments, the video encoding apparatus 1900 and the video decoding apparatus 1700 may signal information about a maximum size and information about a minimum size of a block for a block ratio, by using dependence between the maximum size and the minimum size of the block according to different block ratios. Similarly, information about a maximum size and a minimum size of a block according to a split shape may be signaled by using dependence on a maximum size and a supportable minimum size of a block. Accordingly, because the number of bits to encode and decode information about the maximum size and information about the minimum size of the block may be reduced, information about maximum sizes or minimum sizes of various blocks may be set and encoded and decoded.

When a parameter for a maximum size and a parameter for a minimum size of a coding unit are set based on a block ratio, it may be determined whether various combinations of parameters are supportable. Also, it may be determined whether a pipeline operation is possible for coding units according to block ratios in order to implement pipeline-based video encoding and decoding.

In order to support pipeline-based video encoding/decoding, the implementation complexity increases considerably. As an example, when a coding unit is to be split through binary splitting and ternary splitting, a block having a size that is not allowed for a block ratio may be generated for a pipeline. Accordingly, quadtree splitting is required to be implicitly performed for a coding unit, or quadtree splitting may be performed through signaling of indication information.

As an example, FIGS. 23 to 25 illustrate a case where a pipeline operation is not allowed for a block ratio of a coding unit when the video encoding apparatus 1900 and the video decoding apparatus 1700 support a 64×64 pipeline data unit.

FIG. 23 illustrates allowable block sizes according to a block ratio, according to another embodiment.

When an 8×8 coding unit is binary splittable, 4×8 coding units having a block ratio of 1:2 or 8×4 coding units having a block ratio of 2:1 may be generated. However, because an 8×4 block or a 4×8 block is not allowed in a coding unit structure according to the embodiment of FIG. 23, binary splitting of the 8×8 coding unit is not further performed, and stopped. In this case, when additional splitting of the 8×8 coding unit is required, the video encoding apparatus 1900 or the video decoding apparatus 1700 may determine 4×4 coding units having a block ratio of 1:1 through quadtree splitting of the 8×8 coding unit.

Similarly, because binary splitting of a 16×4 coding unit or a 4×16 coding unit is not allowed in a coding unit structure according to the embodiment of FIG. 23, further splitting may be stopped at the 16×4 coding unit or the 4×16 coding unit, or 4×4 coding units may be generated by quadrisecting a long side of the 16×4 or 4×16 coding unit.

FIG. 24 illustrates allowable block sizes according to a block ratio, according to another embodiment.

In a coding unit structure according to the embodiment of FIG. 24, a 128×128 largest coding unit is allowed, but a 128×128 coding unit having a block ratio of 1:1 is not allowed. Consecutively, a 64×128 coding unit having a block ratio of 1:2, a 128×64 coding unit having a block ratio of 2:1, a 32×128 coding unit having a block ratio of 1:4, or a 128×32 coding unit having a block ratio of 4:1 is not allowed in a coding unit structure according to the embodiment of FIG. 24. When additional splitting of the 128×128 coding unit is performed, the video encoding apparatus 1900 and the video decoding apparatus 1700 may generate 64×64 coding units from the 128×128 coding unit through quad splitting instead of binary splitting.

FIG. 25 illustrates allowable block sizes according to a block ratio, according to another embodiment.

According to FIG. 25, a coding unit having a block ratio of 1:1 is allowed, but a 128×64 coding unit having a block ratio of 2:1 and a 64×128 coding unit having a block ratio of 1:2 may not be allowed. Accordingly, binary splitting of the 128×128 coding unit having a block ratio of 1:1 is not allowed in a coding unit structure according to the embodiment of FIG. 25. The video decoding apparatus 1700 may determine whether to additionally split the 128×128 coding unit having a block ratio of 1:1 based on signaled information. When additional splitting is required based on the signaled information, 64×64 coding units may be determined through quad splitting of the 128×128 coding unit. When additional splitting is not required based on the signaled information, the video decoding apparatus 1700 may decode the 128×128 coding unit having a block ratio of 1:1 as it is.

In order to minimize implementation complexity, the video encoding apparatus 1900 and the video decoding apparatus 1700 according to an embodiment may determine a size of a largest coding unit as a maximum size of a coding unit and may set a minimum size of the coding unit. The video encoding apparatus 1900 and the video decoding apparatus 1700 according to an embodiment may allow coding units having block ratios of 1:1 and 1:2 (or 2:1) within a range between the maximum size and the minimum size of the coding unit and may determine a minimum size of a coding unit for a block ratio based on the minimum size of the coding unit. Also, because splitting into coding units having a block ratio of 1:2 (or 2:1) may be allowed even at a boundary of a picture, whether to split a coding unit may be implicitly determined at the boundary of the picture without signaled information.

In detail, the video encoding apparatus 1900 and the video decoding apparatus 1700 according to an embodiment may determine the size of the largest coding unit, a maximum size of a coding unit having a block ratio of 1:1, and a maximum size of a coding unit having a block ratio of 1:2 or 2:1, to be the same value. Accordingly, when information about the size of the largest coding unit is signaled, there is no need to signal information about the maximum size of the coding unit having a block ratio of 1:1 and the maximum size of the coding unit having a block ratio of 1:2 or 2:1.

Also, the video encoding apparatus 1900 and the video decoding apparatus 1700 according to an embodiment may determine a maximum size of a coding unit having a block ratio of 1:4 or 4:1, to be a value different from a value of the maximum size of the coding unit having a block ratio of 1:2 or 2:1. Accordingly, the video encoding apparatus 1900 and the video decoding apparatus 1700 may separately signal information about the maximum size of the coding unit having a block ratio of 1:4 or 4:1. In order to enable implementation of a 64×64 pipeline data unit, the maximum size of the coding unit having a block ratio of 1:4 or 4:1 may be determined to be smaller than or equal to 64. Accordingly, when the maximum size of the coding unit having a block ratio of 1:4 or 4:1 exceeds 64 according to the signaled information, the maximum size of the coding unit having a block ratio of 1:4 or 4:1 may be forcibly set to 64.

The video encoding apparatus 1900 and the video decoding apparatus 1700 according to an embodiment may determine a minimum size of the coding unit having a block ratio of 1:2 or 2:1 and a minimum size of the coding unit having a block ratio of 1:4 or 4:1, based on a minimum size of the coding unit having a block ratio of 1:1. Accordingly, information indicating the minimum size of the coding unit having a block ratio of 1:1 is signaled between the video encoding apparatus 1900 and the video decoding apparatus 1700, and the minimum size of the coding unit having a block ratio of 1:2 and the minimum size of the coding unit having a block ratio of 1:4 may be determined based on the signaled information indicating the minimum size of the coding unit having a block ratio of 1:1.

According to an embodiment, when a current coding unit includes a boundary of a picture, a block having a block ratio or a size, which is not allowed, not in a block shape with a block ratio of 1:1, 1:2, or 1:4, may be generated from the current coding unit according to a splitting operation at the boundary of the picture. In order to prevent this, it may be determined whether to perform splitting after it is identified first whether a block generated from the current coding unit is in an allowable block shape according to the splitting operation at the boundary of the picture. Therefore, a split rule for a coding unit applied inside the picture may also be applied to a coding unit including the boundary of the picture.

Hereinafter, various embodiments of syntax elements for signaling information about a maximum size and information about a minimum size of a block for a block ratio, and information about a maximum size and a minimum size of a block according to a split shape will be described in detail with reference to FIGS. 26 to 30. The video encoding apparatus 1900 may encode, in the form of syntax elements illustrated in FIGS. 26 to 31, the information about the maximum size and the information about the minimum size of the block for a block ratio, and the information about the maximum size and the minimum size of the block according to the block shape and may output the syntax elements to a bitstream. The video decoding apparatus 1700 may obtain the syntax elements from the bitstream and decode, from the obtained syntax elements, the information about the maximum size and the information about the minimum size of the block for a block ratio, and the information about the maximum size and the minimum size of the block according to the block shape.

FIG. 26 illustrates syntax elements for signaling information about a maximum size and information about a minimum size for a block.

Sequence parameter set semantics shown in FIG. 26 may include syntax elements sps_btt_flag, log2_ctu_size_minus5, log2_min_cb_size_minus2, log2_diff_ctu_max_14_cb_size, log2_diff_ctu_max_tt_cb_size, and log2_diff_min_cb_min_tt_cb_size_minus2. The syntax elements may indicate a value obtained by binary log-transforming a size of a block.

sps_btt_flag may be information indicating whether binary splitting and ternary splitting of a coding unit are used in a current sequence. Accordingly, when sps_btt_flag indicates 0, the video decoding apparatus 1700 may not perform binary splitting and ternary splitting of coding units included in a sequence and may only perform quadtree splitting of the coding units. When sps_btt_flag indicates 1, the video decoding apparatus 1700 may perform binary splitting and ternary splitting as well as quadtree splitting of the coding units included in the sequence.

log2_ctu_size_minus5 may indicate a maximum size of a block, which is supportable by the video encoding apparatus 1900 and the video decoding apparatus 1700, that is, a size of a largest coding unit. "_minus5" means subtracting 5 from an actual maximum size value. As an example, because a maximum size of a block is 128×128, it may be indicated as 7 in a binary log and 2 in log2_ctu_size_minus5. As another example, when sps_btt_flag is 0, log2_ctu_size_minus5 is fixed to 1 so that the largest coding unit may be fixed to 64.

log2_min_cb_size_minus2 may indicate information about a minimum size of a luma block. In detail, log2_diff_ctu_min_cb_size is information indicating a value obtained by subtracting 2 from a binary log value of a supportable minimum size of a luma block. For example, when a binary log of the supportable minimum size of the block is 2, log2_min_cb_size_minus2 may indicate a value of 0. As another example, when sps_btt_flag is 0, log2_min_cb_size_minus2 is fixed to 2 so that the minimum size of the luma block may be fixed to 4.

log2_diff_ctu_max_14_cb_size may indicate information about a maximum size of a block having a block ratio of 1:4. In detail, log2_diff_ctu_max_14_cb_size is information indicating a difference value between a supportable maximum size of a block and the maximum size of the block having a block ratio of 1:4. For example, when a binary log of a size of a largest coding unit is 7 and a binary log of the maximum size of the block having a block ratio of 1:4 is 5, log2_diff_ctu_max_14_cb_size may indicate a value of 2.

log2_diff_ctu_max_tt_cb_size may indicate information about a maximum size of a ternary splittable block. In detail, log2_diff_ctu_max_tt_cb_size is information indicating a difference value between the supportable maximum size of the block and the maximum size of the ternary splittable block. For example, when a binary log of a size of a largest coding unit is 7 and a binary log of the maximum size of the ternary splittable block is 6, log2_diff_ctu_max_tt_cb_size may indicate a value of 1.

log2_diff_min_cb_min_tt_cb_size_minus2 may indicate information about a minimum size of a ternary splittable block. In detail, log2_diff_min_cb_min_tt_cb_size_minus2 is information indicating a difference value between a supportable minimum size of the block and the minimum size of the ternary splittable block. "_minus2" means subtracting 2 from an actual maximum size value. For example, when the binary log of the maximum size of the ternary splittable block is 6 and a binary log of the minimum size of the ternary splittable block is 4, log2_diff_min_cb_min_tt_cb_size_minus2 may indicate a value of 2.

The video decoding apparatus 1700 according to another embodiment may obtain syntax elements from the syntax of FIG. 26 and determine maximum sizes and minimum sizes of various blocks from the syntax elements through a relational expression to be described below with reference to FIG. 27.

FIG. 27 illustrates relational expressions for determining a size of a maximum block and a size of a minimum block, determined according to syntax elements of FIG. 26.

The video decoding apparatus 1700 according to an embodiment may determine a binary log value (CtbLog2SizeY) of a supportable maximum size of a luma block by adding 5 to information about a maximum size of a block (log2_ctu_size_minus5+5). The video decoding apparatus 1700 may determine the supportable maximum size (CtbSizeY) of the luma block by bit shifting the binary log value of the supportable maximum size of the luma block to the left by 1 (1<<CtbLog2SizeY).

The video decoding apparatus 1700 may determine a value (MinCbLog2SizeY=2+log2_min_cb_size_minus2) obtained by adding 2 to information about a supportable minimum size of the luma block, as a binary log value (MinCbLog2SizeY) of the supportable minimum size of the luma block. Accordingly, the supportable minimum size of the luma block may be greater than or same as 4. The video decoding apparatus 1700 may determine the supportable minimum size of the luma block by bit shifting the binary log value of the supportable minimum size of the luma block to the left by 1 (MinCbSizeY=1<<MinCbLog2SizeY).

The video decoding apparatus 1700 may determine a binary log value (MinCbLog2Size11Ratio) of a minimum size of a block having a block ratio of 1:1, to be equal to the binary log value (MinCbLog2SizeY) of the supportable minimum size of the luma block. The video decoding apparatus 1700 may determine the minimum size of the block having a block ratio of 1:1 by bit shifting the binary log value of the minimum size of the block having a block ratio of 1:1 to the left by 1 (MinCbSize11Ratio=1<<MinCbLog2Size11Ratio).

The video decoding apparatus 1700 may determine a binary log value (MinCbLog2Size12Ratio) of a minimum size of a block having a block ratio of 1:2 by adding 1 to the binary log value of the minimum size of the block having a block ratio of 1:1 (MinCbLog2Size11Ratio+1). The video decoding apparatus 1700 may determine the minimum size of the block having a block ratio of 1:2 by bit shifting the binary log value of the minimum size of the block having a block ratio of 1:2 to the left by 1 (MinCbSize12Ratio=1<<MinCbLog2Size12Ratio).

The video decoding apparatus 1700 may determine a binary log value of a supportable maximum size of a transform block as 6 (MaxTbLog2SizeY=6). Accordingly, the supportable maximum size of the transform block may be 64.

The video decoding apparatus 1700 may determine a smaller value (Min(CtbLog2SizeY− log2_diff_ctu_max_14_cb_size, MaxTbLog2SizeY)) between a value, which is obtained by subtracting information about a maximum size of a block having a block ratio of 1:4 from the binary log value of the supportable maximum size of the luma block, and the binary log value of the maximum size of the transform block, as a binary log value of the maximum size of the block having a block ratio of 1:4. The video decoding apparatus 1700 may determine the maximum size of the block having a block ratio of 1:4 by bit shifting the binary log value of the maximum size of the block having a block ratio of 1:4 to the left by 1 (MaxCbSize14Ratio=1<<MaxCbLog2Size14Ratio). As another example, a maximum size of a block having a block ratio of 1:4 (or 4:1) may be fixed to 6 for a pipeline operation using a 64×64 block. Accordingly, a 64×16 coding unit or a 16×64 coding unit may be used for the pipeline operation using a 64×64 block.

The video decoding apparatus 1700 may determine a value (MinCbLog2Size12Ratio+1) obtained by adding 1 to the binary log value of the minimum size of the block having a block ratio of 1:2, as a binary log value (MinCbLog2Size14Ratio) of a minimum size of the block having a block ratio of 1:4. The video decoding apparatus 1700 may determine the minimum size of the block having a block ratio of 1:4 by bit shifting the binary log value of the minimum size of the block having a block ratio of 1:4 to the left by 1 (MinCbSize14Ratio=1<<MinCbLog2Size14Ratio).

The video decoding apparatus 1700 may determine a smaller value (Min(CtbLog2SizeY− log2_diff_ctu_max_tt_cb_size, MaxTbLog2SizeY)) between a value, which is obtained by subtracting information about a maximum size of a ternary splittable block from the binary log value of the supportable maximum size of the luma block, and the binary log value of the maximum size of the transform block, as a binary log value (MaxTtLog2Size) of the maximum size of the ternary splittable block. The video decoding apparatus 1700 may determine the maximum size of the ternary splittable block by bit shifting the binary log value of the maximum size of the ternary splittable block to the left by 1 (MaxTtRatio=1<<MaxTtLog2Ratio). As another example, the maximum size of the ternary splittable block may be fixed to 6 for the pipeline operation using a 64×64 block. Accordingly, ternary splitting from a 64×64, 64×32, 32×64, 64×16, or 16×64 coding unit may be possible for the pipeline operation using a 64×64 block.

The video decoding apparatus 1700 may determine a value (MinCbLog2SizeY+ log2_diff_min_cb_min_tt_cb_size_minus2+2) obtained by adding 2 and information about a minimum size of the ternary splittable block to the binary log value of the supportable minimum size of the luma block, as a binary log value (MinTtLog2Size) of the minimum size of the ternary splittable block. The video decoding apparatus 1700 may determine the minimum size of the ternary splittable block by bit shifting the binary log value of the minimum size of the ternary splittable block to the left by 1 (MinTtRatio=1<<MinTtLog2Ratio).

FIG. 28 illustrates syntax elements for determining a block on which a split unit coding order (SUCO) is performed, according to an embodiment.

split_unit semantics shown in FIG. 28 may include a syntax element split_unit_coding_order_flag. The video decoding apparatus 1700 according to an embodiment may determine whether a SUCO is applied to split coding units included in a coding unit through the split_unit semantics, determine a decoding order of the split coding units included in the coding unit when the SUCO is applied, and invoke the split_unit semantics of the split coding units according to the decoding order, in order to perform decoding for split coding units. Because four split coding units are generated by splitting a width and a height of the coding unit, upper left, upper right, lower left, and lower right split coding units may be adjacent to each other in the coding unit.

The syntax element split_unit_coding_order_flag may be information indicating an encoding order of split coding units. When split_unit_coding_order_flag indicates 0, the four split coding units may be decoded in an order of upper left, upper right, lower left, and lower right split coding units. When split_unit_coding_order_flag indicates 1, the four split coding units may be decoded in an order of upper right, upper left, lower right, and lower left split coding units.

FIG. 29 illustrates a relational expression for determining a maximum size and a minimum size of a block, on which a SUCO is performed, determined according to syntax elements of FIG. 28.

The video decoding apparatus 1700 may obtain syntax elements log2_diff_ctu_size_max_suco_cb_size and log2_diff_max_suco_min_suco_cb_size from sequence parameter set semantics.

log2_diff_ctu_size_max_suco_cb_size may indicate information about a maximum size of a block in which a SUCO is allowed. In detail, log2_diff_ctu_size_max_suco_cb_size may indicate a difference value between a maximum size of a block having a block ratio of 1:1 and a maximum size of the block in which a SUCO is allowed. For example, when the maximum size of the block having a block ratio of 1:1 is 7 and the maximum size of the block in which a SUCO is allowed is 6 in a log scale, log2_ctu_size_max_suco_cb_size may indicate a value of 1.

log2_diff_max_suco_min_suco_cb_size may indicate information about a minimum size of a block in which a SUCO is allowed. In detail, log2_diff_max_suco_min_suco_cb_size may indicate a difference value between the maximum size and the minimum size of the block in which a SUCO is allowed. For example, when the maximum size of the block in which a SUCO is allowed is 6 and the minimum size of the block in which a SUCO is allowed is 4 in a log scale, log2_diff_max_suco_min_suco_cb_size may indicate a value of 2.

The video decoding apparatus 1700 may determine a smaller value (Min (CtbLog2SizeY− log2_diff_ctu_size_max_suco_cb_size, 6)) between 6 and a value obtained by subtracting the information about the maximum size of the block, in which a SUCO is allowed, from a binary log value of a supportable maximum size of a luma block, as a binary log value (MaxSucoLog2Size) of the maximum size of the block in which a SUCO is allowed. Accordingly, a binary log value of the maximum size of the block in which a SUCO is allowed may be limited to 6 (which may correspond to a block size of 64).

The video decoding apparatus 1700 may determine a binary log value (MinSucoLog2Size) of the minimum size of the block in which a SUCO is allowed, by using a value (MaxSucoLog2Size−log2_diff_max_suco_min_suco_cb_size) obtained by subtracting the information about the minimum size of the block, in which a SUCO is allowed, from the binary log value of the maximum size of the block in which a SUCO is allowed. In particular, a greater value (Max(MinCbLog2SizeY, 4)) between 4 and a value of a minimum size of the luma block is compared with the value (MaxSucoLog2Size−log2_diff_max_suco_min_suco_cb_size) obtained by subtracting the information about the minimum size of the block, in which a SUCO is allowed, from the binary log value of the maximum size of the block in which a SUCO is allowed, and a greater value (Max(MaxSucoLog2Size−log2_diff_max_suco_min_suco_cb_size, Max(MinCbLog2SizeY, 4))) therebetween may be determined as the binary log value (MinSucoLog2Size) of the minimum size of the block in which a SUCO is allowed. Accordingly, a binary log value of the minimum size of the block in which a SUCO is allowed may be limited to 4 (which may correspond to a block size of 16).

FIG. 30 illustrates a conditional expression for ternary splitting a coding unit according to a size of a maximum block and a size of a minimum block, determined according to a relational expression of FIG. 27.

As for the coding unit, vertical ternary splitting of the coding unit is not allowed according to conditions 3000. In embodiments, when vertical ternary splitting of the coding unit is not allowed, an element allowSplitTtVer may be set equal to FALSE.

According to conditions 3000, when a width of a coding unit is less than a height of the coding unit (log2CbWidth is less than log2CbHeight), vertical ternary splitting is not allowed.

According to conditions 3000, when a width of a coding unit is greater than a maximum size of a ternary splittable block or the width of the coding unit is less than a minimum size of the ternary splittable block (log2CbWidth is greater than MaxTtLog2Size or log2CbWidth is less than MinTtLog2Size), vertical ternary splitting is not allowed.

According to conditions 3000, when a width of a coding unit is equal to a height of the coding unit and the width of the coding unit is larger than a maximum size of a block having a block ratio of 1:4 (log2CbWidth is equal to log2CbHeight and log2CbWidth is larger than MaxCbLog2Size14Ratio), vertical ternary splitting is not allowed.

According to conditions 3000, when a width of a coding unit is equal to a height of the coding unit and the width of the coding unit is smaller than a minimum size of a block having a block ratio of 1:4 (log2CbWidth is equal to log2CbHeight and log2CbWidth is smaller than MinCbLog2Size14Ratio), vertical ternary splitting is not allowed.

Accordingly, when ternary splitting is applied to a square coding unit, coding units having a block ratio of 1:4 (or 4:1) are generated. However, when a size of the generated coding units having a block ratio of 1:4 is a size that is not allowed according to a size limit on blocks having a block ratio of 1:4, ternary splitting is not applicable to the square coding unit.

As another example, when ternary splitting is applied to a long side of a block having a block ratio of 1:2 (or 2:1), blocks having block ratios of 1:2, 1:1, and 1:2 are generated, and thus the blocks having block ratios of 1:2, 1:1, and 1:2 may be generated regardless of the size limit on blocks having a block ratio of 1:4. However, when ternary splitting is applied to a short side of the block having a block ratio of 1:2, blocks having a block ratio of 1:8 are generated, and thus ternary splitting of the short side of the block having a block ratio of 1:2 is not allowed.

Similarly, as for the coding unit, horizontal ternary splitting of the coding unit is not allowed according to conditions 3050. In embodiments, when horizontal ternary splitting of the coding unit is not allowed, an element allowSplitTtHor may be set equal to FALSE.

According to conditions 3050, when a height of a coding unit is less than a width of the coding unit (log2CbHeight is less than log2CbWidth), horizontal ternary splitting is not allowed.

According to conditions 3050, when a height of a coding unit is greater than a maximum size of a ternary splittable block or the height of the coding unit is less than a minimum size of the ternary splittable block (log2CbHeight is greater than MaxTtLog2Size or log2CbHeight is less than MinTtLog2Size), horizontal ternary splitting is not allowed.

According to conditions 3050, when a height of a coding unit is equal to a width of the coding unit and the height of the coding unit is larger than a maximum size of a block having a block ratio of 1:4 (log2CbWidth is equal to log2CbHeight, and log2CbHeight is larger than MaxCbLog2Size14Ratio), horizontal ternary splitting is not allowed.

According to conditions 3050, when a height of a coding unit is equal to a width of the coding unit and the height of the coding unit is smaller than a minimum size of a block having a block ratio of 1:4 (log2CbWidth is equal to log2CbHeight, and log2CbHeight is smaller than MinCbLog2Size14Ratio), horizontal ternary splitting is not allowed.

Hereinafter, with reference to FIGS. 31 to 42, various embodiments for splitting a largest coding unit into lower coding units when the largest coding unit includes a boundary of a picture are proposed.

Figure 31:
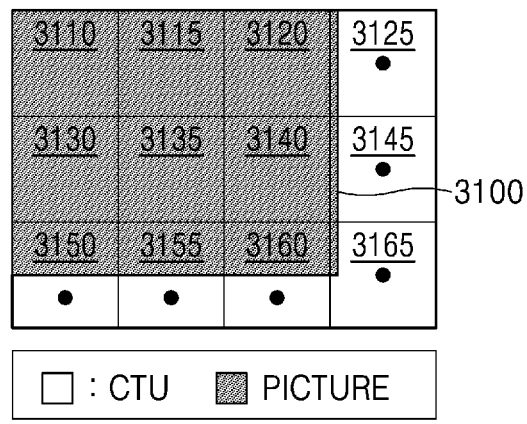
FIG. 31 illustrates that, when a largest coding unit includes a boundary of a picture, the largest coding unit is classified for a location of the boundary of the picture.

FIG. 31 illustrates that, when a largest coding unit includes a boundary of a picture, the largest coding unit is classified for a location of the boundary of the picture.

The video encoding apparatus 1900 according to an embodiment may split a picture into largest coding units which do not overlap with each other, in order to encode the picture. Referring to FIG. 31, largest coding units 3110, 3115, 3120, 3125, 3130, 3135, 3140, 3145, 3150, 3155, 3160, and 3165 may be determined to encode a picture 3100. The largest coding units 3110, 3115, 3120, 3130, 3135, 3140, 3150, 3155, and 3160 are determined in an inner region of the picture 3100, but the largest coding units 3125, 3145, 3150, 3155, 3160, and 3165 include a boundary of the picture 3100.

The video encoding apparatus 1900 according to an embodiment may generate a coding unit including the inner region of the picture 3100 by further splitting the largest coding units 3125, 3145, 3150, 3155, 3160, and 3165 including the boundary of the picture 3100. In this case, a method of splitting a largest coding unit may vary according to a direction of a boundary included in the largest coding unit. That is, a splitting method of the largest coding units 3125 and 3145 including a right boundary of the picture 3100, a splitting method of the largest coding units 3150, 3155, and 3160 including a lower boundary of the picture 3100, a splitting method of the largest coding unit 3165 including a lower right boundary of the picture 3100 may be determined differently.

The video decoding apparatus 1700 according to an embodiment has not yet reconstructed the picture 3100, but already identified a size of the picture 3100. Accordingly, by using a location of a current largest coding unit to be decoded, whether the current largest coding unit is a region including a boundary of a picture may be determined. For example, when a coordinate obtained by adding the size of the current largest coding unit to an upper left coordinate of the largest coding unit 3125 is greater than a width of the picture 3100, it may be determined that the largest coding unit 3125 includes a right boundary of the picture 3100. For example, when a coordinate obtained by adding the size of the current largest coding unit to an upper left coordinate of the largest coding unit 3150 is greater than a height of the picture 3100, it may be determined that the largest coding unit 3150 includes a lower boundary of the picture 3100. Therefore, the video decoding apparatus 1700 may split the largest coding units 3125, 3145, 3150, 3155, 3160, and 3165 until a coding unit which does not include the boundary of the picture 3100 is generated from the largest coding units 3125, 3145, 3150, 3155, 3160, and 3165 including the boundary of the picture 3100.

A splitting method of the largest coding units 3125 and 3145 including the right boundary of the picture 3100, a splitting method of the largest coding units 3150, 3155, and 3160 including the lower boundary of the picture 3100, and a splitting method of the largest coding unit 3165 including the lower right boundary of the picture 3100, which are used by the video decoding apparatus 1700, are the same as the methods used by the video encoding apparatus 1900. In this case, when it is determined that the largest coding units 3125, 3145, 3150, 3155, 3160, and 3165 include the boundary of the picture 3100, without the need to parse split information of largest coding units from a bitstream, the video decoding apparatus 1700 may split the largest coding units 3125, 3145, 3150, 3155, 3160, and 3165 until a coding unit which does not include the boundary of the picture 3100 is generated.

Figure 32:
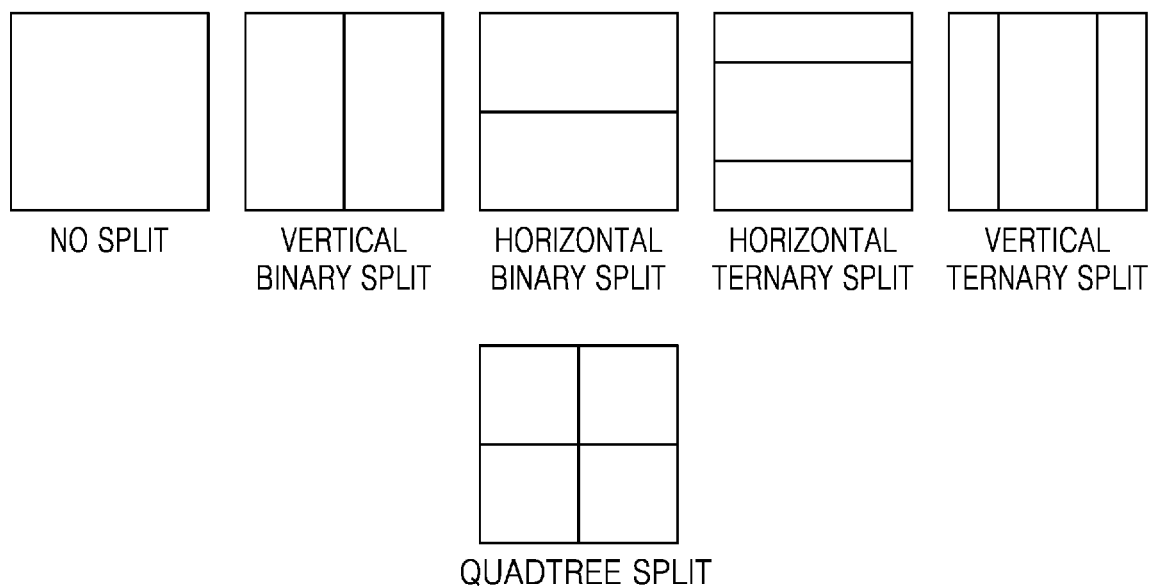
FIG. 32 illustrates names of allowed block split modes according to an embodiment.

FIG. 32 illustrates names of allowed block split modes according to an embodiment.

Based on whether a largest coding unit includes a right, lower, or lower right boundary of a picture, when a certain condition is satisfied, the largest coding units 3125, 3145, 3150, 3155, 3160, and 3165 including the boundary of the picture 3100 may be split into sub-coding units according to at least one of 'no split', 'vertical binary split', 'horizontal binary split', 'horizontal ternary split', 'vertical ternary split', and 'quadtree split' modes.

In the no split mode, splitting of a largest coding unit is not performed.

In the vertical binary split mode, two coding units having a block ratio of 1:2 may be generated from the largest coding unit by splitting a width of the largest coding unit at a ratio of 1:1.

In the horizontal binary split mode, two coding units having a block ratio of 2:1 may be generated from the largest coding unit by splitting a height of the largest coding unit at a ratio of 1:1.

In the horizontal ternary split mode, two coding units having a block ratio of 4:1 and one coding unit having a block ratio of 2:1 may be generated from the largest coding unit by splitting the height of the largest coding unit at a ratio of 1:2:1.

In the vertical ternary split mode, two coding units having a block ratio of 1:4 and one coding unit having a block ratio of 1:2 may be generated from the largest coding unit by splitting the width of the largest coding unit at a ratio of 1:2:1.

In the quadtree split mode, four coding units having a block ratio of 1:1 may be generated from the largest coding unit by splitting the width and the height of the largest coding unit at a ratio of 1:1.

The split modes of FIG. 32 are illustrated based on a square block, but are not limited thereto. Even though a current coding unit is not a square block, the split modes of FIG. 32 may be applied, and a ratio of splitting a width or a height according to the split mode is fixed. However, when the current coding unit is not a square block, a block ratio of a coding unit generated by splitting may vary.

For example, the split mode may be applied to a current coding unit having a block ratio of 1:2. In this case, in the vertical binary split mode, two coding units having a block ratio of 1:4 may be generated from the current coding unit by splitting a width of the current coding unit at a ratio of 1:1. In the horizontal binary split mode, two coding units having a block ratio of 1:1 may be generated from the current coding unit by splitting a height of the current coding unit at a ratio of 1:1. In the horizontal ternary split mode, two coding units having a block ratio of 2:1 and one coding unit having a block ratio of 1:1 may be generated from the current coding unit by splitting the height of the current coding unit at a ratio of 1:2:1. In the vertical ternary split mode, two coding units having a block ratio of 1:8 and one coding unit having a block ratio of 1:4 may be generated from the current coding unit by splitting the width of the current coding unit at a ratio of 1:2:1.

However, a shape or a size of a coding unit generated by splitting the current coding unit may not be supported by the video encoding apparatus 1900 or the video decoding apparatus 1700. For example, a coding unit having a block ratio of 1:8 (or 8:1) or 1:16 (or 16:1) may not be supported by the video encoding apparatus 1900 or the video decoding apparatus 1700. However, in a case where the current coding unit includes a boundary of a picture, exceptionally when the current coding unit is split until a sub-coding unit, which does not include the boundary of the picture, is generated by splitting the current coding unit, a coding unit having a block ratio of 1:8 (or 8:1) or 1:16 (or 16:1) generated from the current coding unit may be used.

Hereinafter, with reference to FIGS. 33 to 42, various embodiments in which a splitting method varies according to which boundary a current coding unit including a boundary of a picture includes from among a right, lower, and lower right boundary of the picture are proposed.

In the embodiments of FIGS. 33 to 42, the current coding unit may be a largest coding unit.

Figure 33:
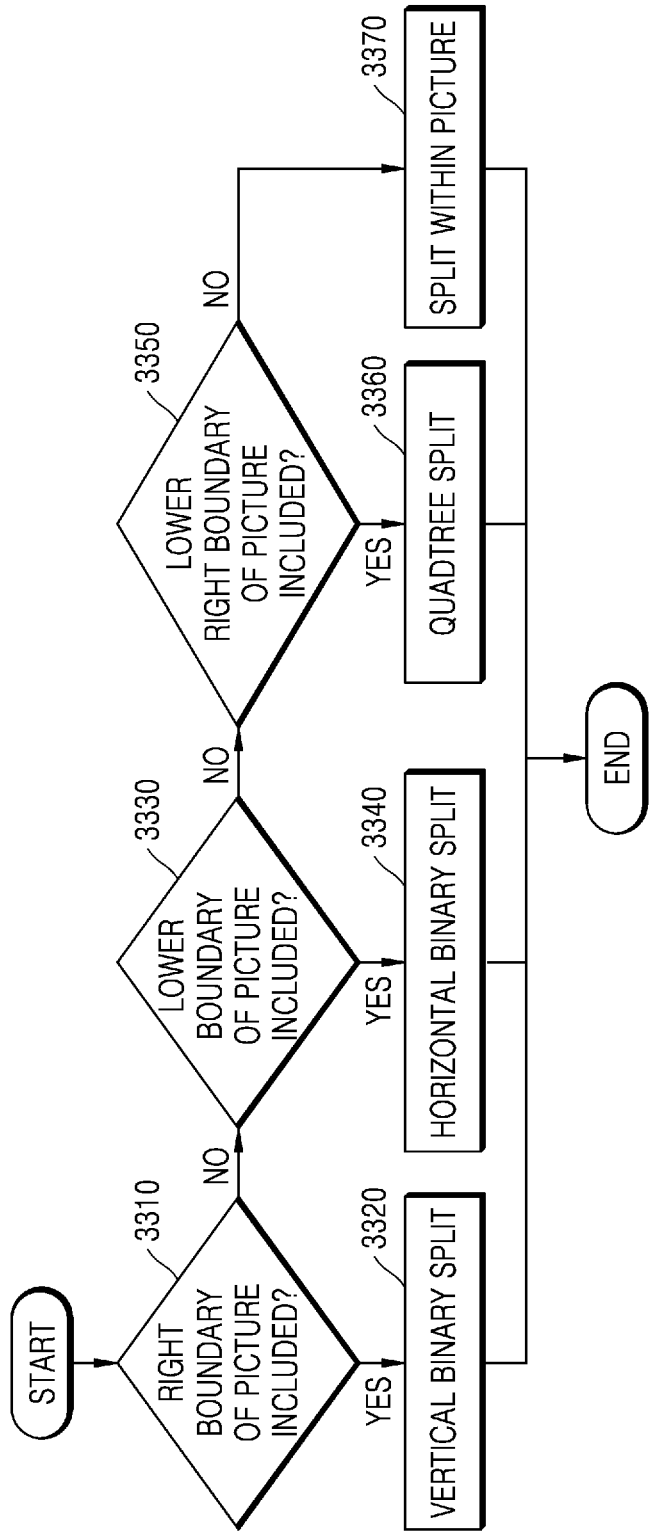
FIG. 33 illustrates a flowchart of an operation for determining an allowed block split mode for a block including a boundary, according to an embodiment.

FIG. 33 illustrates a flowchart of an operation for determining an allowed block split mode for a block including a boundary, according to an embodiment.

In operation 3310, the video decoding apparatus 1700 determines whether the current coding unit includes a right boundary of a picture.

When the current coding unit includes the right boundary of the picture in operation 3310, the video decoding apparatus 1700 proceeds to operation 3320 and splits the current coding unit in a vertical binary split mode.

When the current coding unit does not include the right boundary of the picture in operation 3310, the video decoding apparatus 1700 proceeds to operation 3330 and determines whether the current coding unit includes a lower boundary of the picture.

When the current coding unit includes the lower boundary of the picture in operation 3330, the video decoding apparatus 1700 proceeds to operation 3340 and splits the current coding unit in a horizontal binary split mode.

When the current coding unit does not include the lower boundary of the picture in operation 3330, the video decoding apparatus 1700 proceeds to operation 3350 and determines whether the current coding unit includes a lower right boundary of the picture.

When the current coding unit includes the lower right boundary of the picture in operation 3350, the video decoding apparatus 1700 proceeds to operation 3360 and splits the current coding unit in a quadtree split mode.

When the current coding unit does not include the lower right boundary of the picture in operation 3350, the video decoding apparatus 1700 proceeds to operation 3370. Because the current coding unit does not include the right, lower, and lower right boundary of the picture, the video decoding apparatus 1700 may determine that the current coding unit includes an inner region of the picture. Accordingly, in operation 3370, the video decoding apparatus 1700 may reconstruct samples in the picture by decoding the current coding unit as it is.

FIG. 34 illustrates a conditional expression for determining a split mode of a current coding unit including a right boundary or a lower boundary of a picture, according to a first embodiment.

In a conditional expression 3400, it is determined whether the current coding unit includes a right boundary of a picture. In detail, the video decoding apparatus 1700 may determine whether the current coding unit includes the right boundary of the picture and does not include a lower boundary of the picture, by determining whether an upper right coordinate of the current coding unit is greater than a width of the picture and a lower left coordinate of the current coding unit is smaller than or equal to a height of the picture when an upper left coordinate of the current coding unit is (x0, y0) (x0+(1<<log2CbWidth) is greater than pic_width_in_luma_samples and y0+(1<<log2CbHeight) is smaller than or equal to pic_height_in_luma_samples). In a case where the current coding unit includes the right boundary of the picture and does not include the lower boundary of the picture, when a vertical binary split mode of the current coding unit is allowed, a split mode of the current coding unit may be determined as the vertical binary split mode (If allowSplitBtVer is equal to TRUE, SplitMode[x][y] is set equal to SPLIT_BT_VER). However, when the vertical binary split mode of the current coding unit is not allowed, the split mode of the current coding unit may be determined as a horizontal binary split mode (Otherwise, SplitMode[x][y] is set to equal to SPLIT_BT_HOR).

In the conditional expression 3400, when the upper right coordinate of the current coding unit is not greater than the width of the picture or the lower left coordinate of the current coding unit is greater than the height of the picture, a conditional expression 3450 is executed.

In the conditional expression 3450, it is determined whether the current coding unit includes a lower boundary of the picture. In detail, the video decoding apparatus 1700 may determine whether the current coding unit includes the lower boundary of the picture by determining whether the lower left coordinate is greater than the height of the picture (if y0+(1<<log2CbHeight) is greater than pic_height_in_luma_samples). In a case where the current coding unit includes the lower boundary of the picture, when the horizontal binary split mode of the current coding unit is allowed, the split mode of the current coding unit may be determined as the horizontal binary split mode (If allowSplitBtHor is equal to TRUE, SplitMode[x][y] is set equal to SPLIT_BT_HOR). However, when the horizontal binary split mode of the current coding unit is not allowed, the split mode of the current coding unit may be determined as the vertical binary split mode (Otherwise, SplitMode[x][y] is set to equal to SPLIT_BT_VER).

Figure 35:
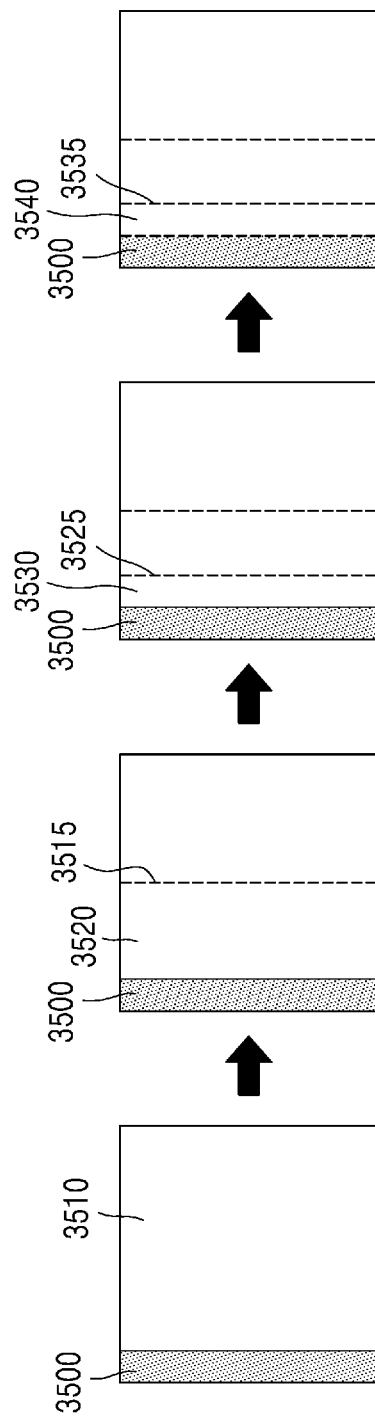
FIG. 35 illustrates a process in which a current coding unit including a right boundary of a picture is split, according to a first embodiment.

FIG. 35 illustrates a process in which a current coding unit including a right boundary of a picture is split, according to a first embodiment.

When a current coding unit 3510 includes a right boundary of a picture 3500, a vertical binary split mode 3515 in which a width of a current coding unit is split at a ratio of 1:1 may be performed. Because a coding unit 3520 generated by the vertical binary split mode 3515 of the current coding unit 3510 also includes the right boundary of the picture 3500, a vertical binary split mode 3525 may also be performed on the coding unit 3520. Because a coding unit 3530 generated by the vertical binary split mode 3525 of the coding unit 3520 also includes the right boundary of the picture 3500, a vertical binary split mode 3535 may also be performed on the coding unit 3530. A coding unit 3540 generated by the vertical binary split mode 3535 of the coding unit 3530 no longer includes the right boundary of the picture 3500, and thus the video decoding apparatus 1700 may reconstruct the picture 3500 by performing decoding on the coding unit 3540.

The coding unit 3530 generated by a splitting process of FIG. 35 is a coding unit having a block ratio of 1:4, and the coding unit 3540 is a coding unit having a block ratio of 1:8. When the video encoding apparatus 1900 and the video decoding apparatus 1700 may not support the coding unit having a block ratio of 1:8, a problem with respect to a coding unit including a right boundary of a picture may be solved according to a splitting process of FIG. 36.

Figure 36:
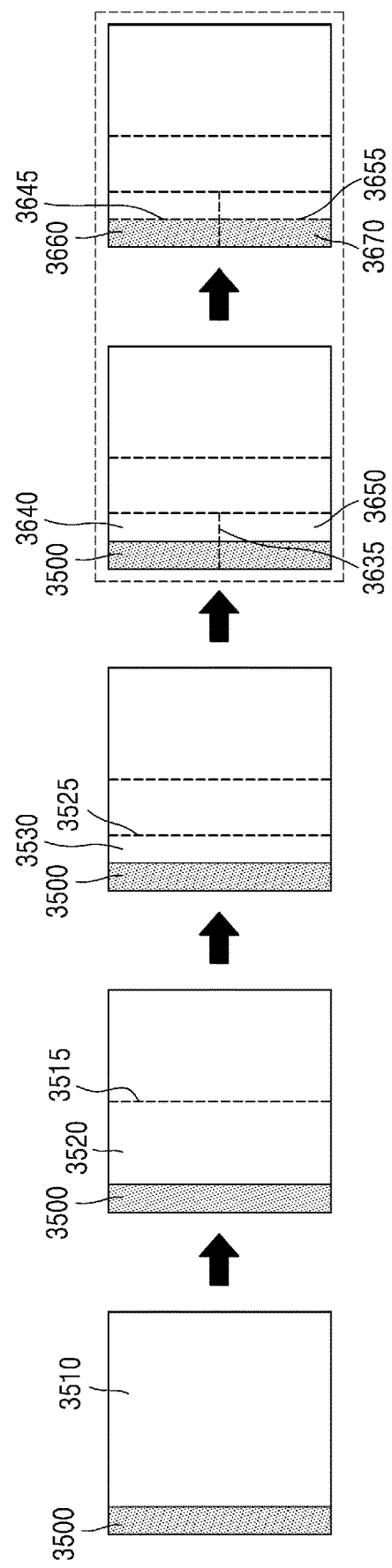
FIG. 36 illustrates a process in which a current coding unit including a right boundary of a picture is split according to a conditional expression in a first embodiment.

FIG. 36 illustrates a process in which a current coding unit including a right boundary of a picture is split according to a conditional expression of a first embodiment.

The splitting process of FIG. 36 is performed in the same manner as in the splitting process of FIG. 35 up to a process of generating the coding unit 3530.

However, because the coding unit having a block ratio of 1:8 may be generated by vertically binary splitting the coding unit 3530 having a block ratio of 1:4, the video decoding apparatus 1700 may not allow vertical binary splitting of the coding unit 3530 having a block ratio of 1:4. Therefore, according to the splitting process of FIG. 36, when the coding unit 3530 having a block ratio of 1:4 includes the right boundary of the picture 3500, a horizontal binary split mode 3635 may also be performed on the coding unit 3530. Two coding units 3640 and 3650 having a block ratio of 1:2 may be generated by the horizontal binary split mode 3635 of the coding unit 3530. Because each of the coding units 3640 and 3650 having a block ratio of 1:2 includes the right boundary of the picture 3500, vertical binary split modes 3645 and 3655 may be performed on the coding units 3640 and 3650 having a block ratio of 1:2, respectively. Coding units 3660 and 3670 generated by the vertical binary split modes 3645 and 3655 of the coding units 3640 and 3650 no longer include the right boundary of the picture 3500, and thus the video decoding apparatus

1700 may reconstruct the picture 3500 by performing decoding on the coding units 3660 and 3670.

Though not shown in FIG. 36, when a current coding unit includes a lower boundary of a picture, the video decoding apparatus 1700 may perform horizontal binary splitting on the current coding unit. When horizontal binary splitting is performed twice on the current coding unit, a coding unit having a block ratio of 4:1 is generated, and when the coding unit having a block ratio of 4:1 also includes the lower boundary of the picture, the video decoding apparatus 1700 may perform vertical binary splitting instead of horizontal binary splitting, on the coding unit having a block ratio of 4:1. When horizontal binary splitting is performed again on coding units including the lower boundary of the picture, among coding units having a block ratio of 2:1 generated by vertically binary splitting the coding unit having a block ratio of 4:1, coding units having a block ratio of 4:1, which do not include the lower boundary of the picture, may be generated.

Figure 37:
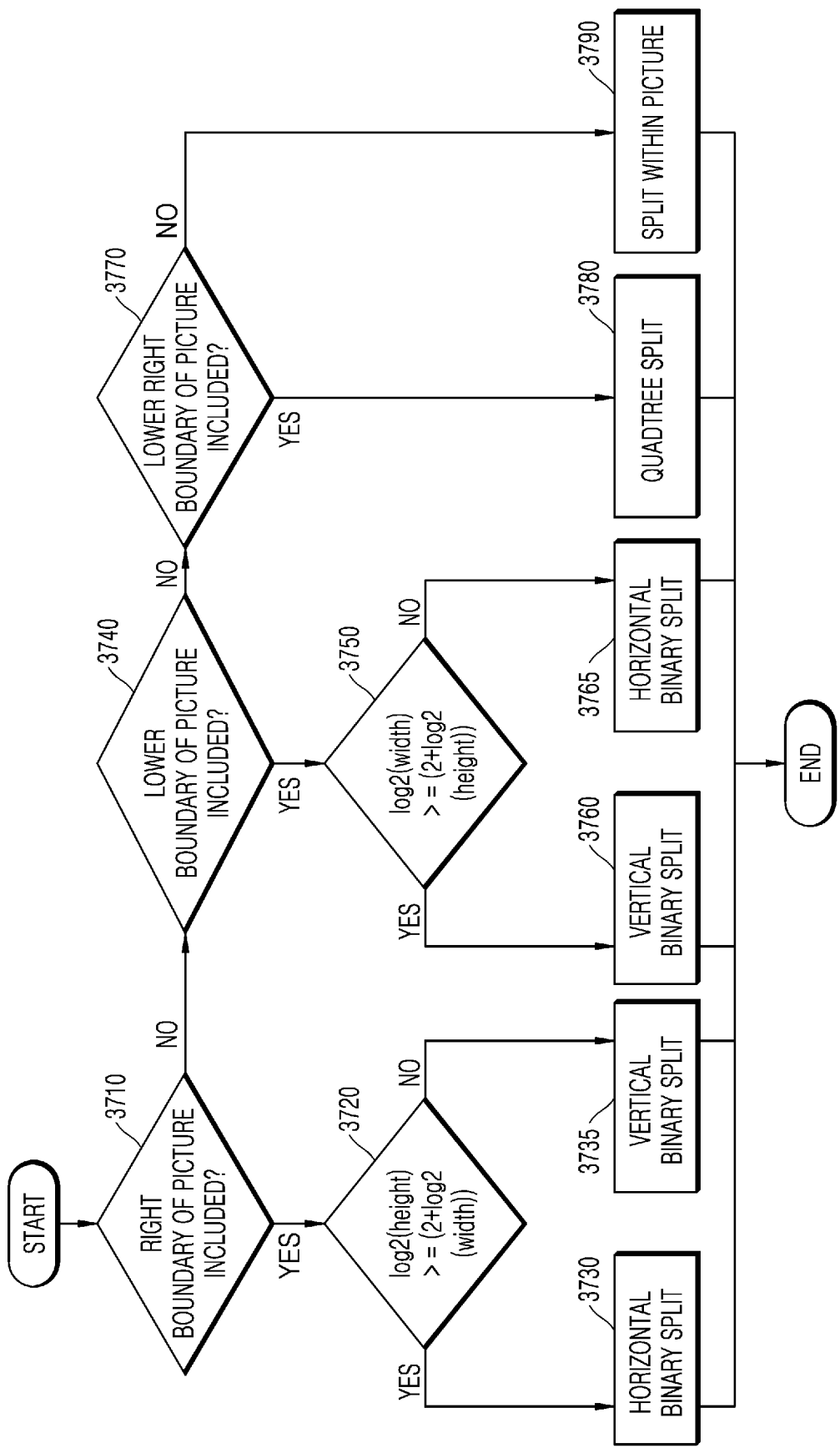
FIG. 37 illustrates a flowchart of an operation for determining an allowed block split mode for a block including a boundary, according to a second embodiment.

FIG. 37 illustrates a flowchart of an operation for determining an allowed block split mode for a block including a boundary, according to a second embodiment. FIG. 37 illustrates a flowchart of a splitting method for, when only coding units having block ratios of 1:1, 1:2, 2:1, 1:4, and 4:1 are allowed in a picture, allowing only coding units having block ratios of 1:1, 1:2, 2:1, 1:4, and 4:1 among coding units including a boundary of a picture, as in the splitting method of FIG. 36.

In operation 3710, the video decoding apparatus 1700 determines whether a current coding unit includes a right boundary of a picture.

When the current coding unit includes the right boundary of the picture in operation 3710, the video decoding apparatus 1700 proceeds to operation 3720 and determines whether a height of the current coding unit is greater than or equal to 4 times a width of the current coding unit. That is, it is determined whether the current coding unit is a coding unit having a block ratio of 1:4. When the height of the current coding unit is greater than or equal to 4 times the width of the current coding unit (that is, when the current coding unit is the coding unit having a block ratio of 1:4) in operation 3720, the video decoding apparatus 1700 proceeds to operation 3730 and splits the current coding unit in a horizontal binary split mode. When the height of the current coding unit is less than 4 times the width of the current coding unit (that is, when the current coding unit is a coding unit having a block ratio of 1:2 or 1:1) in operation 3720, the video decoding apparatus 1700 proceeds to operation 3735 and splits the current coding unit in a vertical binary split mode.

When the current coding unit does not include the right boundary of the picture in operation 3710, the video decoding apparatus 1700 proceeds to operation 3740 and determines whether the current coding unit includes a lower boundary of the picture.

When the current coding unit includes the lower boundary of the picture in operation 3740, the video decoding apparatus 1700 proceeds to operation 3750 and determines whether the width of the current coding unit is greater than or equal to 4 times the height of the current coding unit. That is, it is determined whether the current coding unit is a coding unit having a block ratio of 4:1. When the width of the current coding unit is greater than or equal to 4 times the height of the current coding unit (when the current coding unit is the coding unit having a block ratio of 4:1) in operation 3750, the video decoding apparatus 1700 proceeds to operation 3760 and splits the current coding unit in the vertical binary split mode. When the width of the current coding unit is less than 4 times the height of the current coding unit (when the current coding unit is a coding unit having a block ratio of 2:1 or 1:1) in operation 3750, the video decoding apparatus 1700 proceeds to operation 3765 and splits the current coding unit in the horizontal binary split mode.

When the current coding unit does not include the lower boundary of the picture in operation 3740, the video decoding apparatus 1700 proceeds to operation 3770 and determines whether the current coding unit includes a lower right boundary of the picture.

When the current coding unit includes the lower right boundary of the picture in operation 3770, the video decoding apparatus 1700 proceeds to operation 3780 and splits the current coding unit in a quadtree split mode.

When the current coding unit does not include the lower right boundary of the picture in operation 3770, the video decoding apparatus 1700 proceeds to operation 3790. Because the current coding unit does not include the right, lower, and lower right boundary of the picture, the video decoding apparatus 1700 may determine that the current coding unit includes an inner region of the picture. Accordingly, in operation 3790, the video decoding apparatus 1700 may reconstruct samples in the picture by decoding the current coding unit as it is.

Figure 38:
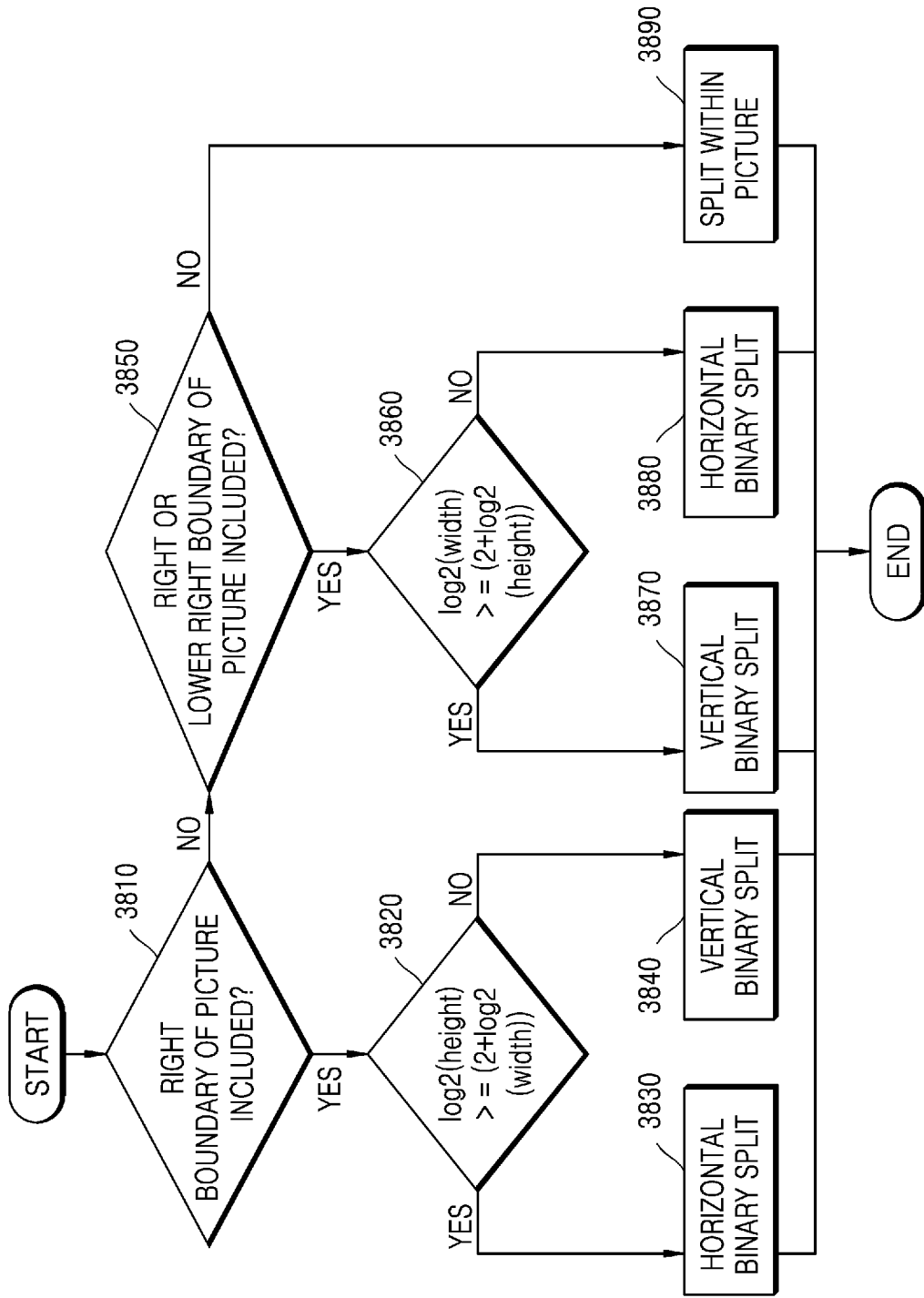
FIG. 38 illustrates a flowchart of an operation for determining an allowed block split mode for a block including a boundary, according to a third embodiment.

FIG. 38 illustrates a flowchart of an operation for determining an allowed block split mode for a block including a boundary, according to a third embodiment.

When a current coding unit includes a right boundary of a picture in operation 3810, the video decoding apparatus 1700 proceeds to operation 3820 and determines whether a height of the current coding unit is greater than or equal to 4 times a width of the current coding unit. When the height of the current coding unit is greater than or equal to 4 times the width of the current coding unit in operation 3820, the video decoding apparatus 1700 proceeds to operation 3830 and splits the current coding unit in a horizontal binary split mode. When the height of the current coding unit is less than 4 times the width of the current coding unit in operation 3820, the video decoding apparatus 1700 proceeds to operation 3840 and splits the current coding unit in a vertical binary split mode.

When the current coding unit does not include the right boundary of the picture in operation 3810, the video decoding apparatus 1700 proceeds to operation 3850 and determines whether the current coding unit includes a lower boundary or a lower right boundary of the picture.

When the current coding unit includes the lower boundary or the lower right boundary of the picture in operation 3850, the video decoding apparatus 1700 proceeds to operation 3860 and determines whether the width of the current coding unit is greater than or equal to 4 times the height of the current coding unit. When the width of the current coding unit is greater than or equal to 4 times the height of the current coding unit in operation 3860, the video decoding apparatus 1700 proceeds to operation 3870 and splits the current coding unit in the vertical binary split mode. When the width of the current coding unit is less than 4 times the height of the current coding unit in operation 3860, the video decoding apparatus 1700 proceeds to operation 3880 and splits the current coding unit in the horizontal binary split mode.

When the current coding unit does not include the lower boundary or the lower right boundary of the current coding unit in operation 3850, the video decoding apparatus 1700 may determine that the current coding unit includes an inner region of the picture. Accordingly, in operation 3890, the video decoding apparatus 1700 may reconstruct samples in the picture by decoding the current coding unit as it is.

Compared with FIG. 37, in FIG. 38, the video decoding apparatus 1700 may repeat horizontal binary splitting and vertical binary splitting without performing quadtree splitting until a coding unit which does not include the boundary of the picture is generated from the coding unit including the boundary of the picture. In detail, when the coding unit includes the lower right boundary of the picture, the coding unit may be horizontally binary split in the same manner as in a case where the coding unit includes the lower boundary of the picture, and when a coding unit generated by horizontal binary splitting again includes the right boundary of the picture, vertical binary splitting may be performed on the generated coding unit. Therefore, a similar result may be derived by performing quadtree splitting when the coding unit includes the lower right boundary of the picture.

When the video encoding apparatus 1900 allows a size of a largest coding unit up to 128×128, the video encoding apparatus 1900 is required to support a maximum size of a transform block of the largest coding unit up to 64×64. In this case, among coding units that may be generated from a largest coding unit having a size greater than 64×64, allowed blocks are only coding units having block ratios of 1:1, 1:2, and 2:1. However, in the splitting methods of FIGS. 33 to 36 described above, there is a problem in which 128×32 and 32×128 coding units are generated. Accordingly, in order to solve the problem in which 128×32 and 32×128 coding units are generated from the largest coding unit, splitting methods of FIGS. 39 to 42 are proposed.

Figure 39:
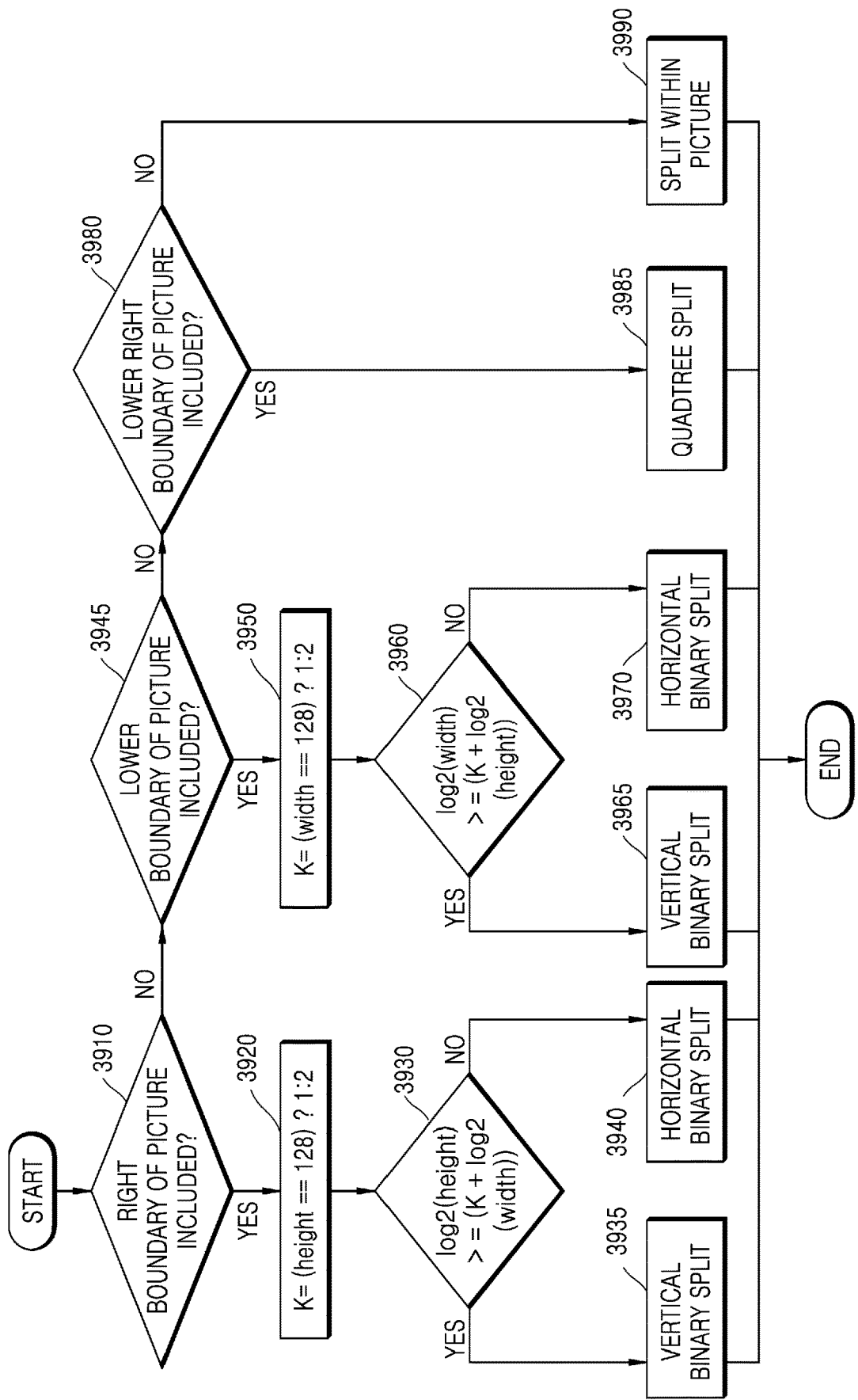
FIG. 39 illustrates a flowchart of an operation for determining an allowed block split mode for a block including a boundary, according to a fourth embodiment.

FIG. 39 illustrates a flowchart of an operation for determining an allowed block split mode for a block including a boundary, according to a fourth embodiment. When a current coding unit includes a right boundary of a picture in operation 3910, the video decoding apparatus 1700 proceeds to operation 3920, and sets K to 1 when a height of the current coding unit is 128 and sets K to 2 when the height of the current coding unit is not 128. In operation 3930, the video decoding apparatus 1700 determines whether the height of the current coding unit is greater than or equal to 2^K times a width of the current coding unit. When the height of the current coding unit is greater than or equal to 2^K times the width of the current coding unit in operation 3930, the video decoding apparatus 1700 proceeds to operation 3935 and splits the current coding unit in a horizontal binary split mode. When the height of the current coding unit is less than 2^K times the width of the current coding unit in operation 3930, the video decoding apparatus 1700 proceeds to operation 3940 and splits the current coding unit in a vertical binary split mode.

That is, when the height of the current coding unit is 128, the current coding unit is a 128×128 largest coding unit, and thus K is set to 1 so that only coding units having block ratios of 1:1, 1:2, and 2:1 may be generated from the largest coding unit. When the height of the current coding unit is 64, 32, 16, 8, 4, or the like, the current coding unit is a coding unit which is not a largest coding unit, and thus K is set to 2 so that coding units having block ratios up to 1:1, 1:2, 2:1, 1:4, and 4:1 may be generated from the current coding unit.

When the current coding unit does not include the right boundary of the picture in operation 3910, the video decoding apparatus 1700 proceeds to operation 3945 and determines whether the current coding unit includes a lower boundary of the picture.

When the current coding unit includes the lower boundary of the picture in operation 3945, the video decoding apparatus 1700 proceeds to operation 3950, and sets K to 1 when the height of the current coding unit is 128 and sets K to 2 when the height of the current coding unit is not 128. In operation 3960, the video decoding apparatus 1700 determines whether the width of the current coding unit is greater than or equal to 2^K times the height of the current coding unit. When the width of the current coding unit is greater than or equal to 2^K times the height of the current coding unit in operation 3960, the video decoding apparatus 1700 proceeds to operation 3965 and splits the current coding unit in the vertical binary split mode. When the width of the current coding unit is less than 2^K times the height of the current coding unit in operation 3960, the video decoding apparatus 1700 proceeds to operation 3970 and splits the current coding unit in the horizontal binary split mode.

When the current coding unit does not include the lower boundary of the picture in operation 3945, the video decoding apparatus 1700 proceeds to operation 3980 and determines whether the current coding unit includes a lower right boundary of the picture.

When the current coding unit includes the lower right boundary of the picture in operation 3980, the video decoding apparatus 1700 proceeds to operation 3985 and splits the current coding unit in a quadtree split mode.

When the current coding unit does not include the lower right boundary of the picture in operation 3980, the video decoding apparatus 1700 proceeds to operation 3990. Because the current coding unit does not include the right, lower, and lower right boundary of the picture, the video decoding apparatus 1700 may determine that the current coding unit includes an inner region of the picture. Accordingly, in operation 3990, the video decoding apparatus 1700 may reconstruct samples in the picture by decoding the current coding unit as it is.

FIG. 40 illustrates a conditional expression for determining a split mode of a current coding unit including a right boundary or a lower boundary, according to a fourth embodiment.

In a conditional expression 4000, it is determined whether the current coding unit includes a right boundary of a picture. In detail, the video decoding apparatus 1700 may determine whether the current coding unit includes the right boundary of the picture and does not include a lower boundary of the picture, by determining whether an upper right coordinate of the current coding unit is greater than a width of the picture and a lower left coordinate of the current coding unit is smaller than or equal to a height of the picture when an upper left coordinate of the current coding unit is (x0, y0) (if x0+(1<<log2CbWidth) is greater than pic_width_in_luma_samples and y0+(1<<log2CbHeight) is smaller than or equal to pic_height_in_luma_samples). In a case where the current coding unit includes the right boundary of the picture and does not include the lower boundary of the picture, when a height of the current coding unit is 128, K may be set to 1, and when the height of the current coding unit is not 128, K may be set to 2 (A variable K is set equal to (log2CbHeight==7?1:2)). When the height of the current coding unit is greater than or equal to a value obtained by multiplying a width of the current coding unit by 2^K, a split mode of the current coding unit may be determined as a horizontal binary split mode (If log2CbHeight is greater than or equal to K+log2CbWidth, SplitMode[x][y] is set equal to SPLIT_BT_HOR). When the height of the current coding unit is smaller than the value obtained by multiplying the width of the current coding unit by 2^K, the split mode of the current coding unit may be determined as a vertical binary split mode (Otherwise (log2CbHeight is smaller than K+log2CbWidth), SplitMode [x][y] is set equal to SPLIT_BT_VER). In the conditional expression 4000, when the upper right coordinate of the current coding unit is not greater than the width of the picture or the lower left coordinate of the current coding unit is greater than the height of the picture, a conditional expression 4050 is executed.

In a conditional expression 4050, it is determined whether the current coding unit includes a lower boundary of the picture. In detail, the video decoding apparatus 1700 may determine whether the current coding unit includes the lower boundary and does not include the right boundary of the picture, by determining whether the lower left coordinate of the current coding unit is greater than the height of the picture and the upper right coordinate of the current coding unit is smaller than or equal to the width of the picture (if y0+(1<<log2CbHeight) is greater than pic_height_in_luma_samples and x0+(1<<log2CbWidth) is smaller than or equal to pic_width_in_luma_samples). In a case where the current coding unit includes the lower boundary and does not include the right boundary of the picture, when the width of the current coding unit is 128, K may be set to 1, and when the width of the current coding unit is not 128, K may be set to 2 (A variable K is set equal to (log2CbWidth==7?1: 2)). When the width of the current coding unit is greater than or equal to a value obtained by multiplying the height of the current coding unit by $2^K$, the split mode of the current coding unit may be determined as the vertical binary split mode (If log2CbWidth is greater than or equal to K+log2CbHeight, SplitMode[x][y] is set equal to SPLIT_BT_VER). When the width of the current coding unit is smaller than the height of the current coding unit, the split mode of the current coding unit may be determined as the horizontal binary split mode (Otherwise (log2CbWidth is smaller than K+log2CbHeight), SplitMode[x][y] is set equal to SPLIT_BT_HOR).

Figure 41:
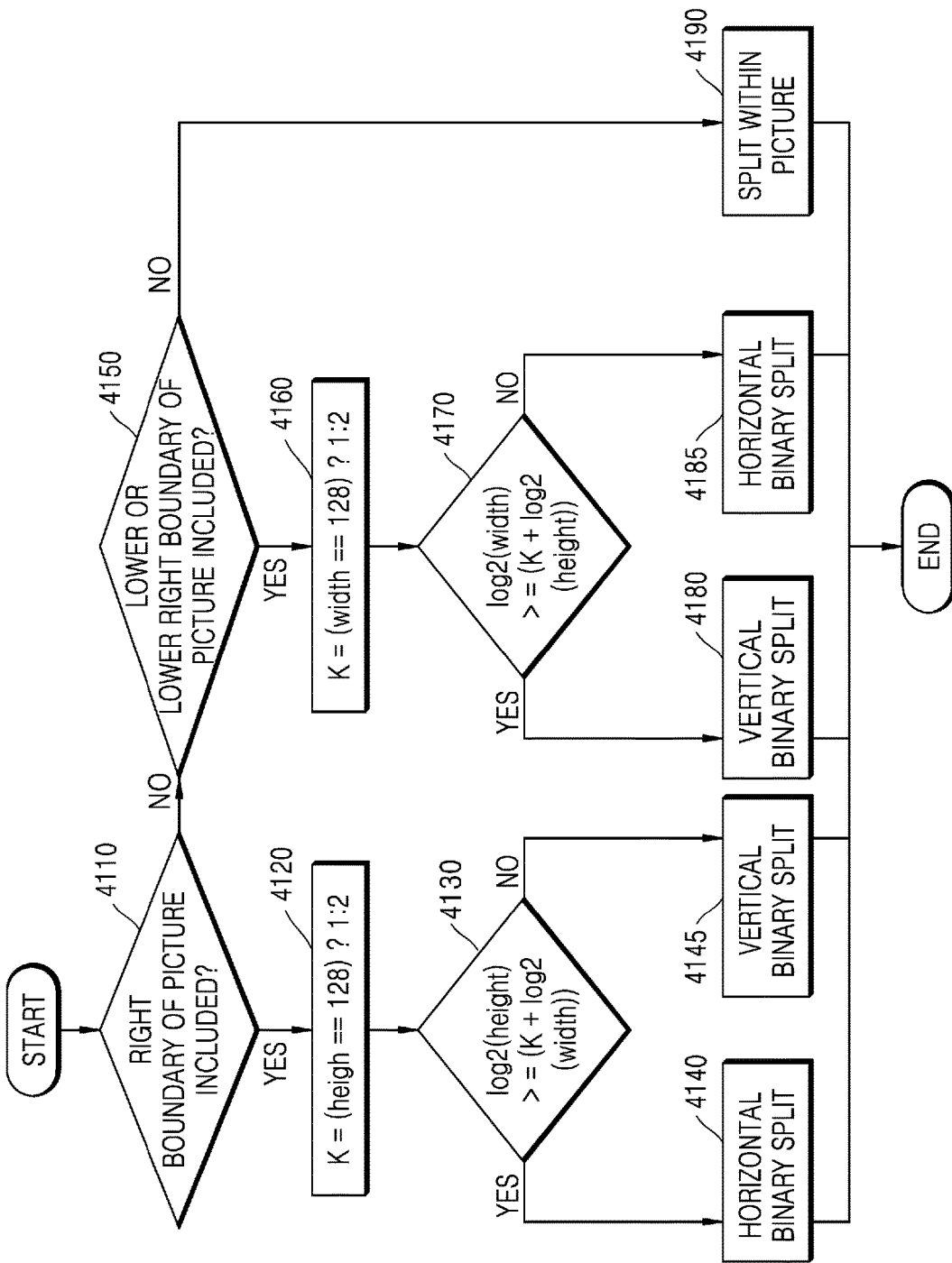
FIG. 41 illustrates a flowchart of an operation for determining an allowed block split mode for a block including a boundary, according to a fifth embodiment.

FIG. 41 illustrates a flowchart of an operation for determining an allowed block split mode for a block including a boundary, according to a fifth embodiment. Referring to FIG. 41, a splitting method in a case where a coding unit includes a lower right boundary of a picture and a splitting method in a case where a coding unit includes a lower boundary of a picture are the same as in the splitting methods of FIG. 39, except for the presence of a quadtree split mode.

When a current coding unit includes a right boundary of a picture in operation 4110, the video decoding apparatus 1700 proceeds to operation 4120, and sets K to 1 when a height of the current coding unit is 128 and sets K to 2 when the height of the current coding unit is not 128. In operation 4130, the video decoding apparatus 1700 determines whether the height of the current coding unit is greater than or equal to $2^K$ times a width of the current coding unit. When the height of the current coding unit is greater than or equal to $2^K$ times the width of the current coding unit in operation 4130, the video decoding apparatus 1700 proceeds to operation 4140 and splits the current coding unit in a horizontal binary split mode. When the height of the current coding unit is less than $2^K$ times the width of the current coding unit in operation 4130, the video decoding apparatus 1700 proceeds to operation 4145 and splits the current coding unit in a vertical binary split mode.

When the current coding unit does not include the right boundary of the picture in operation 4110, the video decoding apparatus 1700 proceeds to operation 4150 and determines whether the current coding unit includes a lower boundary or a lower right boundary of the picture.

When the current coding unit includes the lower boundary or the lower right boundary of the picture in operation 4150, the video decoding apparatus 1700 proceeds to operation 4160, and sets K to 1 when the height of the current coding unit is 128 and sets K to 2 when the height of the current coding unit is not 128. In operation 4170, the video decoding apparatus 1700 determines whether the width of the current coding unit is greater than or equal to $2^K$ times the height of the current coding unit. When the width of the current coding unit is greater than or equal to $2^K$ times the height of the current coding unit in operation 4170, the video decoding apparatus 1700 proceeds to operation 4180 and splits the current coding unit in the vertical binary split mode. When the width of the current coding unit is less than $2^K$ times the height of the current coding unit in operation 4170, the video decoding apparatus 1700 proceeds to operation 4185 and splits the current coding unit in the horizontal binary split mode.

When the current coding unit does not include the lower boundary or the lower right boundary of the picture in operation 4150, the video decoding apparatus 1700 may determine that the current coding unit includes an inner region of the picture. Accordingly, in operation 4190, the video decoding apparatus 1700 may reconstruct samples in the picture by decoding the current coding unit as it is.

FIG. 42 illustrates a conditional expression for determining a split mode of a current coding unit including a right boundary or a lower boundary, according to a fifth embodiment.

In a conditional expression 4200, it is determined whether the current coding unit includes a right boundary of a picture. In detail, the video decoding apparatus 1700 may determine whether the current coding unit includes the right boundary of the picture and does not include a lower boundary of the picture, by determining whether an upper right coordinate of the current coding unit is greater than a width of the picture and a lower left coordinate of the current coding unit is smaller than or equal to a height of the picture when an upper left coordinate of the current coding unit is (x0, y0) (if x0+(1<<log2CbWidth) is greater than pic_width_in_luma_samples and y0+(1<<log2CbHeight) is smaller than or equal to pic_height_in_luma_samples). In a case where the current coding unit includes the right boundary of the picture and does not include the lower boundary of the picture, when a height of the current coding unit is 128, K may be set to 1, and when the height of the current coding unit is not 128, K may be set to 2 (A variable K is set equal to (log2CbHeight==7?1:2)). When the height of the current coding unit is greater than or equal to a value obtained by multiplying a width of the current coding unit by $2^K$, a split mode of the current coding unit may be determined as a horizontal binary split mode (If log2CbHeight is greater than or equal to K+log2CbWidth, SplitMode[x][y] is set equal to SPLIT_BT_HOR). When the height of the current coding unit is smaller than the value obtained by multiplying the width of the current coding unit by $2^K$, the split mode of the current coding unit may be determined as a vertical binary split mode (Otherwise (log2CbHeight is smaller than K+log2CbWidth), SplitMode [x][y] is set equal to SPLIT_BT_VER). In the conditional expression 4200, when the upper right coordinate of the current coding unit is not greater than the width of the picture or the lower left coordinate of the current coding unit is greater than the height of the picture, a conditional expression 4250 is executed.

In a conditional expression 4250, it is determined whether the current coding unit includes a lower boundary of the picture. In detail, the video decoding apparatus 1700 may determine whether the current coding unit includes the lower boundary of the picture by determining whether the lower left coordinate of the current coding unit is greater than the height of the picture (if y0+(1<<log2CbHeight) is greater than pic_height_in_luma_samples). In a case where the current coding unit includes the lower boundary of the picture, when the width of the current coding unit is 128, K may be set to 1, and when the width of the current coding unit is not 128, K may be set to 2 (A variable K is set equal to (log2CbWidth==7?1:2)). When the width of the current coding unit is greater than or equal to a value obtained by multiplying the height of the current coding unit by 2^K, the split mode of the current coding unit may be determined as the vertical binary split mode (If log2CbWidth is greater than or equal to K+log2CbHeight, SplitMode[x][y] is set equal to SPLIT_BT_VER). When the width of the current coding unit is smaller than the height of the current coding unit, the split mode of the current coding unit may be determined as the horizontal binary split mode (Otherwise (log2CbWidth is smaller than K+log2CbHeight), SplitMode[x][y] is set equal to SPLIT_BT_HOR).

The embodiments of the present disclosure described above may be written as computer-executable programs that may be stored in a medium.

The medium may continuously store the computer-executable programs, or temporarily store the computer-executable programs or instructions for execution or downloading. Also, the medium may be any one of various recording media or storage media in which a single piece or plurality of pieces of hardware are combined, and the medium is not limited to a medium directly connected to a computer system, but may be distributed on a network. Examples of the medium include magnetic media, such as a hard disk, a floppy disk, and a magnetic tape, optical recording media, such as CD-ROM and DVD, magneto-optical media such as a floptical disk, and ROM, RAM, and a flash memory, which are configured to store program instructions. The machine-readable storage medium may be provided as a non-transitory storage medium. Here, the 'non-transitory storage medium' is a tangible device and means that the storage medium does not include a signal (for example, an electromagnetic wave), but this term does not distinguish whether data is stored semi-permanently or temporarily in the storage medium. For example, the 'non-transitory storage medium' may include a buffer that temporarily stores data.

Other examples of the medium include recording media and storage media managed by application stores distributing applications or by websites, servers, and the like supplying or distributing other various types of software.

According to an embodiment, methods according to the various disclosed embodiments of the disclosure may be provided by being included in a computer program product. The computer program product may be traded as a commodity between a seller and a purchaser. The computer program product may be distributed in the form of a machine-readable storage medium (for example compact disc read only memory (CD-ROM)), or be distributed online (for example download or upload) via an application store (for example Play Store™) or directly between two user devices (for example smartphones). When distributed online, at least part of the computer program product (for example a downloadable app) may be temporarily generated or at least temporarily stored in a machine-readable storage medium, such as a memory of a manufacturer's server, a server of the application store, or a relay server.

While one or more embodiments of the present disclosure have been described with reference to the figures, it will be understood by those of ordinary skill in the art that various changes in form and details may be made therein without departing from the spirit and scope as defined by the following claims.

The invention claimed is:

1. A video decoding method comprising:
obtaining, from a bitstream, information about a size of a largest coding unit;
obtaining, from the bitstream, information about a difference between the size of the largest coding unit and a maximum size of a coding unit with a width and height ratio equal to 1:4;
determining the maximum size of the coding unit with the width and height ratio equal to 1:4 using the information about the size of the largest coding unit and the information about the difference;
when it is determined that a current coding unit is split into a plurality of lower coding units using the maximum size of the coding unit with the width and height ratio equal to 1:4, splitting the current coding unit into the plurality of lower coding units; and
decoding the plurality of lower coding units,
wherein the current coding unit is one among a plurality of coding units split from the largest coding unit.

2. A video decoding apparatus comprising:
a receiver configured to obtain, from a bitstream, information about a size of a largest coding unit, and obtain, from the bitstream, information about a difference between the size of the largest coding unit and a maximum size of a coding unit with a width and height ratio equal to 1:4; and
a decoder configured to determine the maximum size of the coding unit with the width and height ratio equal to 1:4 using the information about the size of the largest coding unit and the information about the difference, when it is determined that a current coding unit is split into a plurality of lower coding units using the maximum size of the coding unit with the width and height ratio equal to 1:4, split the current coding unit into the plurality of lower coding units, and decode the plurality of lower coding units,
wherein the current coding unit is one among a plurality of coding units split from the largest coding unit.

3. A video encoding method comprising:
generating information about a size of a largest coding unit;
determining a maximum size of a coding unit with a width and height ratio equal to 1:4;
generating information about a difference between the size of the largest coding unit and the maximum size of the coding unit with the width and height ratio equal to 1:4;
when it is determined that a current coding unit is split into a plurality of lower coding units using the maximum size of the coding unit with the width and height ratio equal to 1:4, splitting the current coding unit into the plurality of lower coding units; and
encoding the plurality of lower coding units,
wherein the current coding unit is one among a plurality of coding units split from the largest coding unit.

4. A method of transmitting a bitstream generated by encoding a video, the method comprising:
generating information about a size of a largest coding unit;

determining a maximum size of a coding unit with a width and height ratio equal to 1:4;

generating information about a difference between the size of the largest coding unit and the maximum size of the coding unit with the width and height ratio equal to 1:4;

when it is determined that a current coding unit is split into a plurality of lower coding units using the maximum size of the coding unit with the width and height ratio equal to 1:4, splitting the current coding unit into the plurality of lower coding units, and encoding the plurality of lower coding units; and outputting the bitstream including the information about the size of the largest coding unit, the information about the difference between the size of the largest coding unit and the maximum size of the coding unit with the width and height ratio equal to 1:4, and encoded date of the plurality of lower coding units, wherein the current coding unit is one among a plurality of coding units split from the largest coding unit.

* * * * *